(12) United States Patent
Maeda et al.

(10) Patent No.: US 10,254,342 B2
(45) Date of Patent: Apr. 9, 2019

(54) SEMICONDUCTOR DEVICE

(71) Applicant: Renesas Electronics Corporation, Tokyo (JP)

(72) Inventors: Yoichi Maeda, Kodaira (JP); Susumu Abe, Kodaira (JP); Yoshitaka Taki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/508,168

(22) PCT Filed: Nov. 26, 2014

(86) PCT No.: PCT/JP2014/081251
§ 371 (c)(1),
(2) Date: Mar. 2, 2017

(87) PCT Pub. No.: WO2016/084165
PCT Pub. Date: Jun. 2, 2016

(65) Prior Publication Data
US 2017/0285106 A1 Oct. 5, 2017

(51) Int. Cl.
*G01R 31/00* (2006.01)
*G01R 31/3183* (2006.01)
(Continued)

(52) U.S. Cl.
CPC . *G01R 31/318335* (2013.01); *G01R 31/3187* (2013.01); *G01R 31/31721* (2013.01); *G01R 31/31813* (2013.01); *G06F 11/25* (2013.01)

(58) Field of Classification Search
None
See application file for complete search history.

(56) References Cited

U.S. PATENT DOCUMENTS 5,664,231 A * 9/1997 Postman ............... G06F 1/1626
235/462.41
5,815,512 A * 9/1998 Osawa ........... G01R 31/318541
365/201
(Continued)

FOREIGN PATENT DOCUMENTS

JP  H 01-100476 A   4/1989
JP  2003-518245 A   6/2003
(Continued)

OTHER PUBLICATIONS

International Search Report (ISR) (PCT Form PCT/ISA/210), in PCT/JP2014/081251, dated Feb. 17, 2015.
(Continued)

*Primary Examiner* — Daniel F. McMahon
(74) *Attorney, Agent, or Firm* — McGinn IP Law Group, PLLC

(57) ABSTRACT

A semiconductor device includes a first circuit and a plurality of pattern generators connected to the first circuit and each supplying a test pattern to the first circuit. A pattern-generator control circuit controls each of the plurality of pattern generators such that the pattern generator starts to operate when a control signal is at a first level and the pattern generator stops operating when the control signal is not at the first level. A pattern compressor compresses a result output from the first circuit in response to supply of the test patterns from the plurality of pattern generators. A pattern-compressor control circuit controls the pattern compressor. A self-diagnosis control circuit is connected to the pattern-generator control circuit and the pattern-compressor control circuit and controls the pattern-generator control circuit such that stop timings of the test patterns differ from one another among the plurality of pattern generators due to changing the control signals to selectively stop the pattern generators in a predetermined manner.

15 Claims, 28 Drawing Sheets

(51) Int. Cl.
    *G01R 31/3181* (2006.01)
    *G06F 11/25* (2006.01)
    *G01R 31/3187* (2006.01)
    *G01R 31/317* (2006.01)

(56) References Cited

U.S. PATENT DOCUMENTS

| | | | |
|---|---|---|---|
| 2002/0120896 A1* | 8/2002 | Wang | G01R 31/31704 |
| | | | 714/731 |
| 2004/0056661 A1* | 3/2004 | Maeda | G01R 1/203 |
| | | | 324/332 |
| 2004/0128599 A1 | 7/2004 | Rajski et al. | |
| 2006/0080585 A1 | 4/2006 | Kiryu | |
| 2006/0294312 A1* | 12/2006 | Walmsley | H04L 9/0662 |
| | | | 711/122 |
| 2017/0285106 A1* | 10/2017 | Maeda | G01R 31/318335 |

FOREIGN PATENT DOCUMENTS

| | | |
|---|---|---|
| JP | 2004-117258 A | 4/2004 |
| JP | 2006-105999 A | 4/2006 |
| JP | 2009-109512 A | 5/2009 |
| JP | 2012-168141 A | 9/2012 |
| JP | 2012-198078 A | 10/2012 |
| JP | 2012-234605 A | 11/2012 |

OTHER PUBLICATIONS

Japanese Office Action dated Mar. 6, 2018 in corresponding Japanese Application No. 2016-561142 with an English translation thereof.

Japanese Office Action dated Sep. 18, 2018, in Japanese Patent Application No. 2016-561142 with an English translation.

\* cited by examiner

SEMICONDUCTOR DEVICE

TECHNICAL FIELD

The present invention relates to a semiconductor device and particularly, relates to a semiconductor device incorporating a self-diagnosis circuit.

BACKGROUND ART

A semiconductor device incorporating a self-diagnosis circuit is used as, for example, an on-vehicle semiconductor device. On a vehicle, a plurality of micro control units (hereinafter, also referred to as an MCU) are mounted in order to carry out various control. In this case, the MCU is constituted by, for example, a single semiconductor device. From a viewpoint of safety, an MCU for mounting on a vehicle (hereinafter, referred to as an on-vehicle MCU) incorporates a self-diagnosis circuit.

The on-vehicle MCU has many logic circuits in order to achieve functions thereof. Meanwhile, as a technique for self-diagnosing the logic circuits, for example, logic built in self test (LBIST) is known. LBIST is described, for example, in Patent Documents 1 to 6.

RELATED ART DOCUMENTS

Patent Documents

Patent Document 1: Japanese Patent Application Laid-Open Publication No. 2012-234605

Patent Document 2: Japanese Patent Application Laid-Open Publication No. 2004-117258

Patent Document 3: Japanese Patent Application Laid-Open Publication No. 2006-105999

Patent Document 4: Japanese Patent Application Laid-Open Publication No. 2012-168141

Patent Document 5: Japanese Patent Application Laid-Open Publication No. 2012-198078

Patent Document 6: National Publication of International Patent Application No. 2003-518245

SUMMARY OF THE INVENTION

Problems to be Solved by the Invention

The self-diagnosis circuit incorporated in the on-vehicle MCU carries out diagnosis operations (power-on self-test) when the on-vehicle MCU is activated. For example, the self-diagnosis circuit operates in a case of turning on a power supply of the on-vehicle MCU or in a case of resetting the on-vehicle MCU. According to the studies carried out by the present inventors, it has been found out that, when the power-on self-test is carried out, a change in the current value flowing in the on-vehicle MCU with respect to time (current change rate) is comparatively large. When the current change rate is large, voltage variation in a power supply wire becomes large, and as a result, operation of the on-vehicle MCU may become unstable.

In Patent Documents 1 to 6, it is not recognized that the current change rate becomes large in the power-on self-test.

It is an object of the present invention to provide a semiconductor device capable of suppressing a current change rate in a self-diagnosis operation.

Other objects and novel features will become apparent from the description of the present specification and the accompanied drawings.

Means for Solving the Problems

The present specification discloses a plurality of means for solution. Herein, only typical means for solution will be described.

A semiconductor device includes: a first circuit; a plurality of pattern generators each supplying a test pattern to the first circuit; a pattern-generator control circuit controlling each of the plurality of pattern generators; and a self-diagnosis control circuit controlling the pattern-generator control circuit. Herein, the self-diagnosis control circuit controls such that stop timings of the test patterns differ from one another among the plurality of pattern generators. When the stop timings of the test patterns are made different from one another, timings to stop a circuit in the first circuit operating in accordance with each of the test patterns can be made different, so that a rapid change in the current flowing in the semiconductor device can be suppressed. Accordingly, in self-diagnosis operations, the current change rate of the semiconductor device can be suppressed, and the operation of the semiconductor device can be prevented from becoming unstable.

Effect of the Invention

According to an embodiment, a semiconductor device capable of suppressing the current change rate in the self-diagnosis operation can be provided.

DETAILED DESCRIPTION OF PREFERRED EMBODIMENTS

Figure 1:
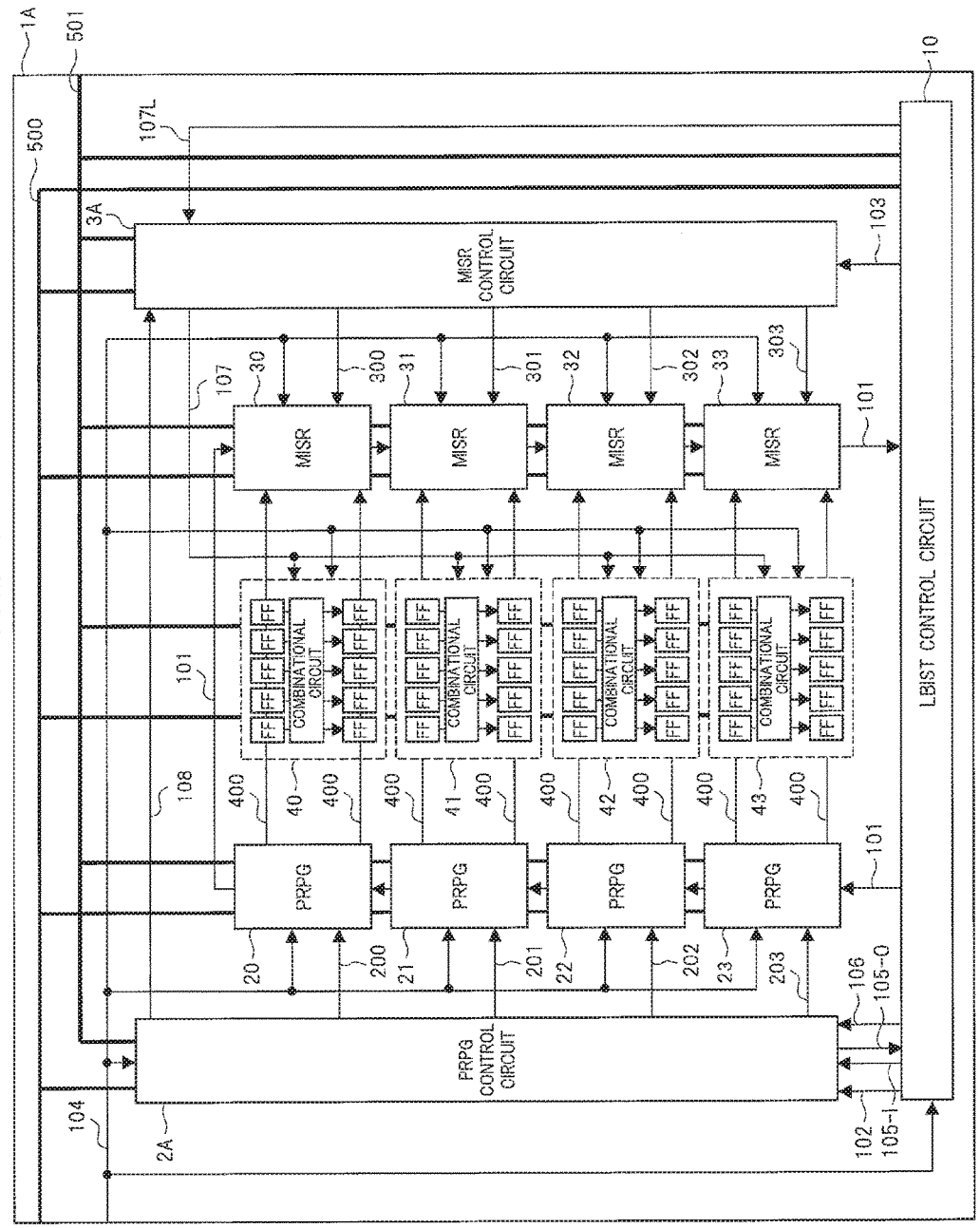
FIG. 1 is a block diagram showing an overall configuration of a semiconductor device according to a second embodiment.

Hereinafter, embodiments of the present invention will be described in detail with reference to the accompanying drawings. Note that components having the same function are denoted by the same reference characters throughout the drawings for describing the embodiments, and the repetitive description thereof is omitted.

Before describing the present invention, the matters studied by the present inventors will be described.

<Configuration of Studied Circuit>

Figure 24:
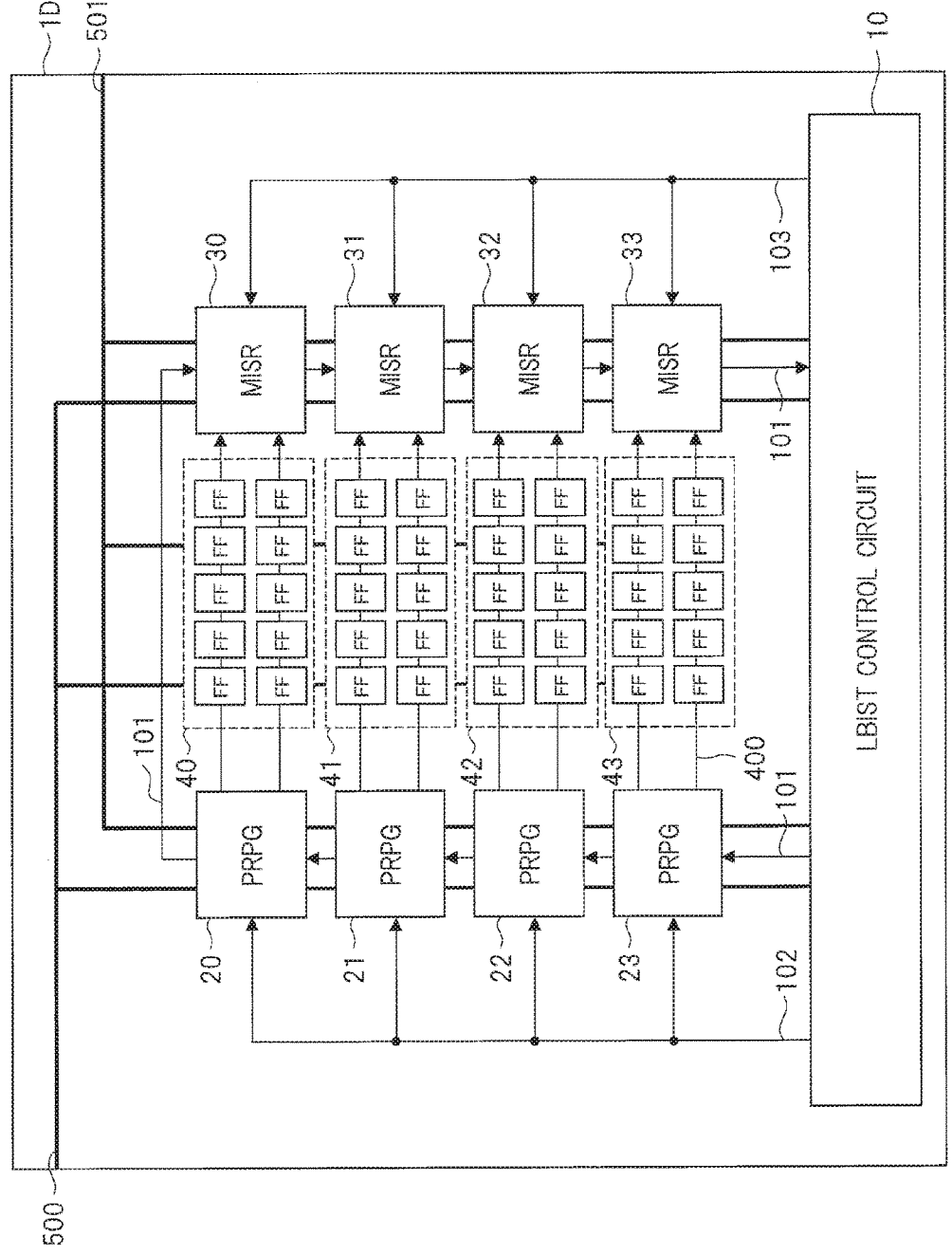
FIG. 24 is a block diagram showing a configuration of a semiconductor device which has been studied by the inventors.

FIG. 24 is a block diagram showing a configuration of a semiconductor device which has been studied by the inventors. In this diagram, the semiconductor device is represented by reference character 1D, and the semiconductor device 1D constitutes an MCU. In order to achieve functions of the MCU, the semiconductor device 1D has a plurality of logic circuits. FIG. 24 shows logic circuits 40 to 43 among the plurality of logic circuits. In order to carry out self-diagnoses of the logic circuits 40 to 43, the semiconductor device 1D includes an LBIST control circuit 10, pattern generators (PRPG) 20, 21, 22, and 23, and pattern compressors (MISR) 30, 31, 32, and 33. In the following present specification and drawings, the pattern generators are each also described as PRPG, and the pattern compressors are each also described as MISR.

Each of the pattern generators 20 to 23 is switched so as to operate or stop function thereof by a PRPG control signal 102 from the LBIST control circuit 10. Each of the pattern compressors 30 to 33 is also switched so as to operate or stop function thereof by an MISR control signal 103 from the LBIST control circuit 10. In this studied circuit, the pattern generators 20 to 23 operate when the PRPG control signal 102 is at a high level, and the pattern generators 20 to 23 stop when the PRPG control signal 102 is at a low level. Similarly, the pattern compressors 30 to 33 operate when the MISR control signal 103 is at the high level, and the pattern compressors 30 to 33 stop when the MISR control signal 103 is at the low level.

All the pattern generators 20 to 23 and the pattern compressors 30 to 33 are strung with the LBIST control circuit 10 by a PRPG/MISR chain 101. While the pattern generators 20 to 23 and the pattern compressors 30 to 33 which are strung with one another repeat shift operations, an initial value is supplied from the LBIST control circuit 10, and, for example, the initial value is set to each of the pattern generators 20 to 23. Moreover, the pattern generators 20 to 23 and the pattern compressors 30 to 33 repeat the shift operations, so that diagnosis results are collected from the pattern compressors 30 to 33 to the LBIST control circuit 10.

Each of the logic circuits 40 to 43 includes flip-flops (FF) and a combinational circuit; and, in the period of self-diagnosis operations (hereinafter, also referred to as a test period), the combinational circuit receives a signal from the flip-flops (FF), and an output of the combinational circuit is supplied to the flip-flops (FF). In the period of the self-diagnosis operations, the flip-flops (FF) in the logic circuits 40 to 43 are connected by a certain number of the flip-flops which are strung with one another by scan chains 400. Input sides of the scan chains 400 are connected to the respective pattern generators 20 to 23, and output sides thereof are connected to the respective pattern compressors 30 to 33.

Moreover, in FIG. 24, reference numbers 500 and 501 represent voltage wires (power supply wires), which supply power supply voltages to the pattern generators 20 to 23, the pattern compressors 30 to 33, the logic circuits 40 to 43, and the LBIST control circuit 10. For example, the voltage wire 500 is the voltage wire which supplies the power supply voltage for operating the respective circuits, and the voltage wire 501 is the voltage wire which supplies a ground voltage to the respective circuits. As a matter of course, the voltage wires 500 and 501 are each connected also to the flip-flops (FF) and the combinational circuits included in the logic circuits 40 to 43, and the power supply voltage and the ground voltage are supplied thereto, respectively.

Figure 25:
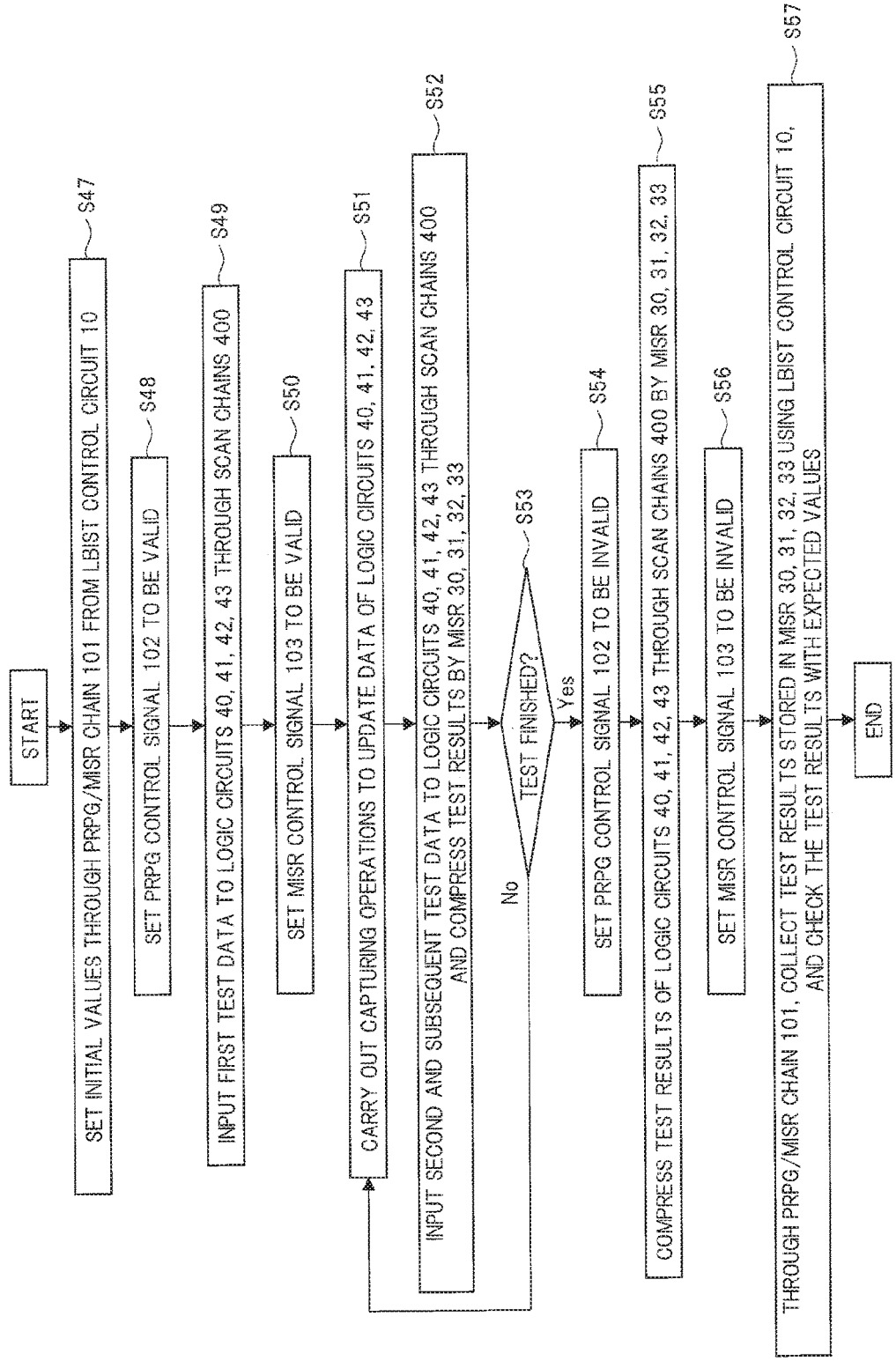
FIG. 25 is a flow chart showing operations of the semiconductor device shown in FIG. 24.

FIG. 25 is a flow chart showing operations of the self-diagnosis of the semiconductor device 1D shown in FIG. 24. In FIG. 25, operation events are connected by respective arrows, and occurrences of events are shown by time series in accordance with the directions of the respective arrows. In other words, processes are executed from step S47 to step S57.

When the operations of the self-diagnosis are started, step S47 is executed. In step S47, initial values are each set to the pattern generators 20 to 23 through the PRPG/MISR chain 101 from the LBIST control circuit 10. In step S48, the LBIST control circuit 10 sets the PRPG control signal 102 to be valid (high level). As a result, first test data is input from the pattern generators 20 to 23 to the logic circuits 40 to 43 through the scan chains 400 (step S49).

Then, in step S50, the LBIST control circuit 10 sets the MISR control signal 103 to be valid (high level). In step S51, operations of capturing are carried out to update the data of the logic circuits 40 to 43. More specifically, the logic circuits 40 to 43 are operated in accordance with the first test data supplied to the logic circuits 40 to 43 in step S49, and the data of each of the logic circuits 40 to 43 is updated to the data corresponding to the first test data.

In step S52, a second and subsequent test data are input to the logic circuits 40 to 43 through the scan chains 400, the data of the logic circuits 40 to 43 are supplied to the pattern compressors 30 to 33 through the scan chains 400, and compression (compression of test results) is carried out in each of the pattern compressors 30 to 33. Whether the test has been finished or not is determined in step S53, and steps S51 to S53 are repeated until the test is finished.

Meanwhile, when it is determined that the test has been finished, in step S54, the LBIST control circuit 10 sets the PRPG control signal 102 to be invalid (low level). In step S55, through the scan chains 400, the test results of the logic circuits 40 to 43 are compressed in the pattern compressors 30 to 33, respectively. Then, in step S56, the LBIST control circuit 10 sets the MISR control signal 103 to be invalid (low level). Then, in step S57, through the PRPG/MISR chain 101, the compressed test results stored in the pattern compressors 30 to 33 are collected by the LBIST control circuit 10. The LBIST control circuit 10 checks the collected test results with expected values, obtains results of the self-diagnosis, and finishes the operations of the self-diagnosis.

Figure 26:
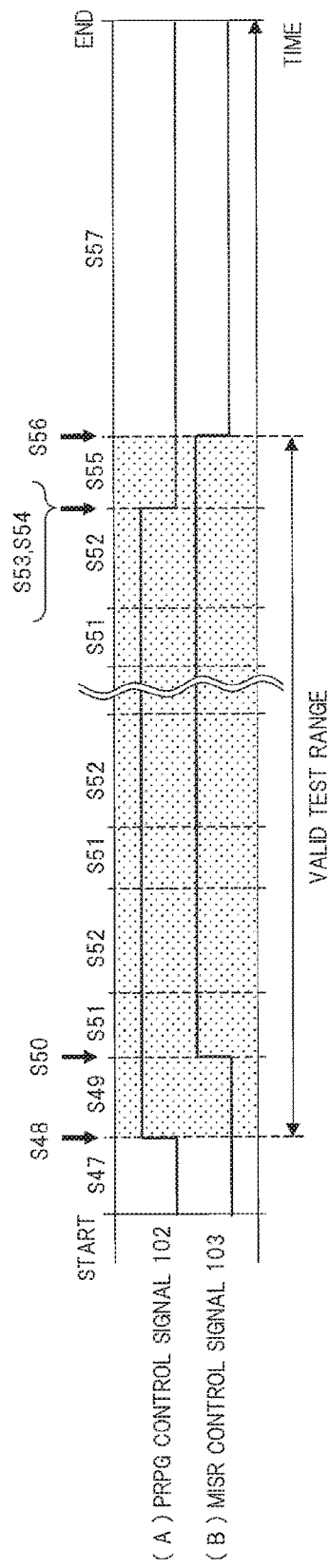
FIGS. 26(A) and 26(B) are waveform diagrams showing the operation of the semiconductor device shown in FIG. 24.

FIGS. 26(A) and 26(B) are waveform diagrams showing the operations described in FIG. 25 by focusing on the PRPG control signal 102 and the MISR control signal 103. In this diagram, a horizontal axis shows time, and a vertical axis shows voltages. Also, in FIG. 26, reference characters S47 to S57 correspond to steps S47 to S57 shown in FIG. 25, respectively. In FIG. 26, a period between steps S49 and S55 (see FIG. 25) is a valid test range. In this period, the logic circuits 40 to 43 are supplied with test patterns (test data) generated by the pattern generators 20 to 23, repeat random operations in accordance with the test patterns, and consume electric power.

Figure 27:
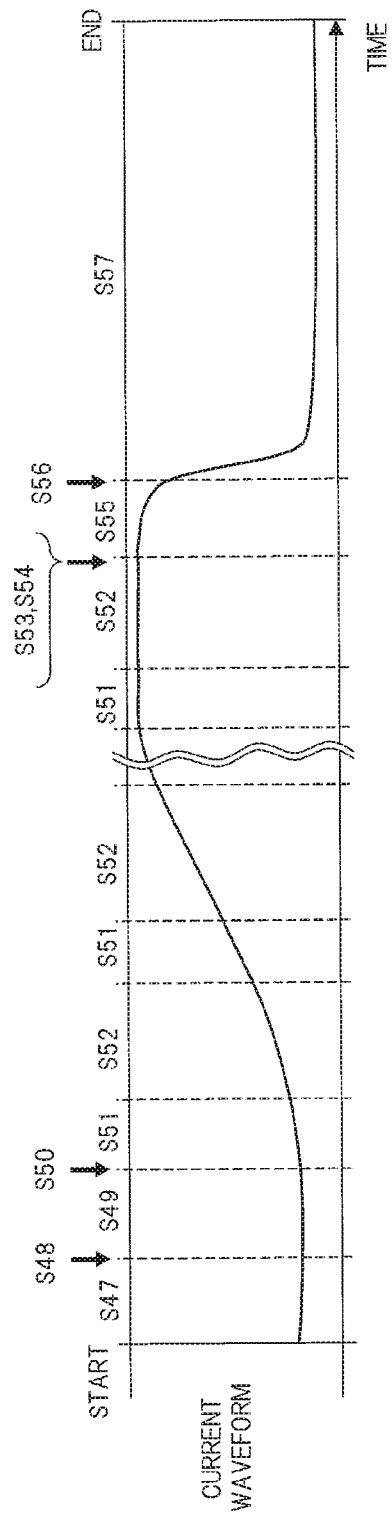
FIG. 27 is a waveform diagram schematically showing a current waveform of the semiconductor device shown in FIG. 24.

FIG. 27 is a waveform diagram schematically showing a waveform of a current flowing in the semiconductor device 1D shown in FIG. 24. The waveform of the current shown in FIG. 27 is a current waveform in the self-diagnosis operations described in FIG. 25. In this diagram, a horizontal axis shows time, and a vertical axis shows the current flowing in the semiconductor device 1D, in other words, a magnitude of the current consumption of the semiconductor device 1D. When the current waveform goes more upward in FIG. 27, the larger the current consumption of the semiconductor device 1D becomes. Reference characters S47 to S57 attached along the horizontal axis correspond to steps S47 to S57 described in FIG. 25, respectively.

The current consumption of the semiconductor device 1D gradually increases from step S49 in which supply of the test patterns (test data) to the logic circuits 40 to 43 is started, and the current consumption reaches a peak at the time when the repeated operations of steps S51 and S52 are occurring. Then, the current consumption is gradually reduced from around the period in which the PRPG control signal 102 is set to the low level by the event of step S54 and the pattern generators 20 to 23 are in a stopped state, and the current consumption is rapidly reduced around the period of step S56 in which the MISR control signal 103 is set to the low level and the pattern compressors 30 to 33 are in a stopped state. This is because a change in a logical value of each signal supplied to the logic circuits 40 to 43 is no longer generated as a result of stopping of the operations of the pattern generators 20 to 23 and the pattern compressors 30 to 33.

Figure 28:
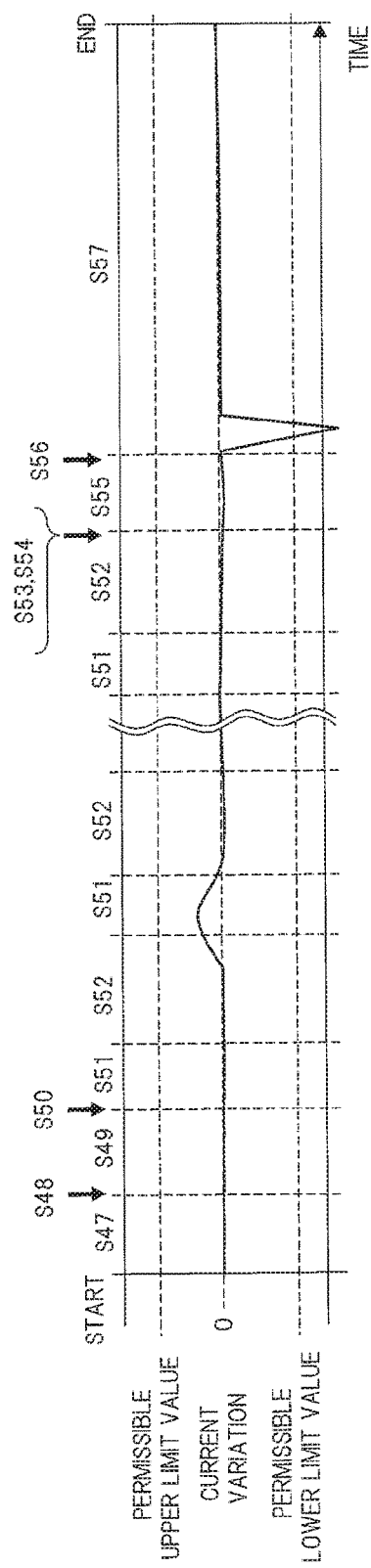
FIG. 28 is a waveform diagram showing current variation of the semiconductor device shown in FIG. 24.

FIG. 28 is a waveform diagram showing current variation per time. In FIG. 28, a horizontal axis shows time, and a vertical axis shows a magnitude of current variation. In FIG. 28, a central line represents "0" at which there is no variation in current. The current variation in the diagram is extended upward when the current per time increases, and the current variation in the diagram is extended downward when the current decreases. Reference characters S47 to S57 attached along the horizontal axis in FIG. 28 correspond to steps S47 to S57 described in FIG. 25, respectively.

A change in current value per unit time, in other words, a current change rate (di/dt) near step S57 (see FIG. 25) of FIG. 28 is large and is largely exceeding a predetermined permissible lower limit value. In this case, the predetermined permissible lower limit value and the permissible upper limit value are, for example, 80 mA/20 us. In each of the voltage wires 500 and 501 (FIG. 24), parasitic resistances, parasitic capacities, etc. are present. Therefore, when the current change rate is large, the power supply voltage and the ground voltage of the voltage wires 500 and 501 are varied. For example, since the current change rate is largely exceeding the permissible lower limit value near step S57, it is conceivable that overshoot occurs in the power supply voltage and the ground voltage supplied to the pattern generators 20 to 30, the pattern compressors 30 to 33, the logic circuits 40 to 43, and the LBIST control circuit 10 via the voltage wires 500 and 501. Therefore, in a worst case, a normal self-diagnosis cannot be carried out, and it is conceivable that a problem that the semiconductor device 1D cannot be activated occurs.

First Embodiment

Figure 19:
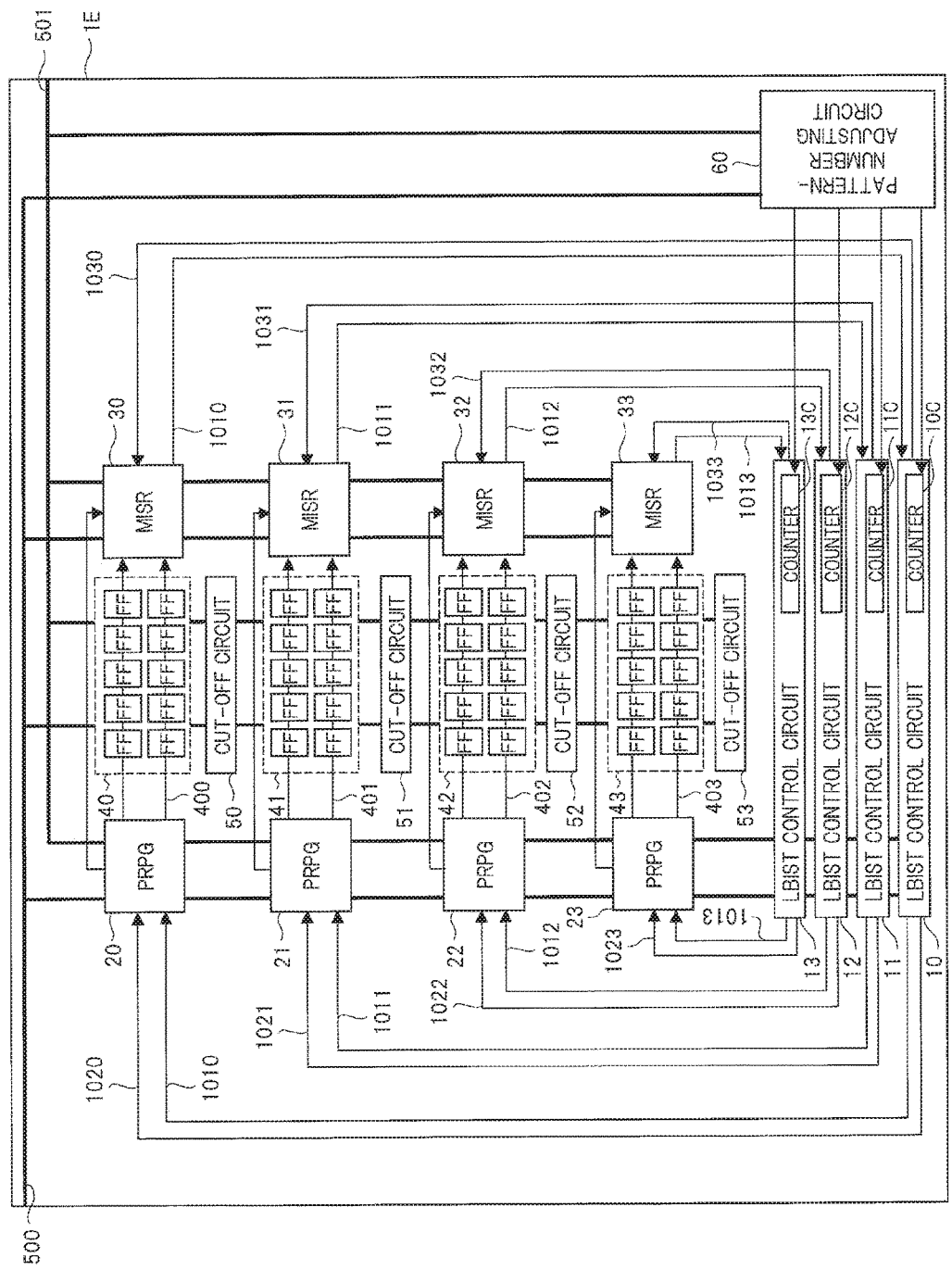
FIG. 19 is a block diagram showing a configuration of a semiconductor device according to a first embodiment.

FIG. 19 is a block diagram showing a configuration of a semiconductor device according to a first embodiment. In this diagram, the semiconductor device is represented by reference character 1E, and the semiconductor device 1E constitutes an MCU. In order to achieve functions of the MCU, the semiconductor device 1E incorporates a plurality of logic circuits, and FIG. 19 representatively shows logic circuits 40 to 43 among the plurality of logic circuits. LBIST control circuits 10 to 13, pattern generators 20 to 23, and pattern compressors 30 to 33 are provided in the semiconductor device 1E, in order to carry out a self-diagnosis. In the first embodiment, the LBIST control circuits 10 to 13, the pattern generators 20 to 23, the pattern compressors 30 to 33, and the logic circuits 40 to 43 correspond to one another on a one-to-one basis. For example, the LBIST control circuit 10, the pattern generator 20, the pattern compressor 30, and the logic circuit 40 correspond to one another on a one-to-one basis. The remaining LBIST control circuits 11 to 13, the remaining pattern generators 21 to 23, the remaining pattern compressors 31 to 33, and the remaining logic circuits 41 to 43 also correspond to one another on a one-to-one basis.

The pattern generators 20 to 23 are switched so as to operate or stop functions thereof by PRPG control signals 1020 to 1023 from the corresponding LBIST control circuits 10 to 13, respectively. The pattern compressors 30 to 33 are also switched so as to operate or stop functions thereof by MISR control signals 1030 to 1033 from the corresponding LBIST control circuits 10 to 13, respectively. In the first embodiment, the pattern generators operate when the PRPG control signals 1020 to 1023 from the corresponding LBIST control circuits 10 to 13 are at the high level, and the pattern generators stop operating when the PRPG control signals are at the low level. Similarly, the pattern compressors operate when the MISR control signals 1030 to 1033 from the corresponding LBIST control circuits 10 to 13 are at the high level, and the pattern compressors stop operating when the MISR control signals are at the low level.

The LBIST control circuit 10 will be described by way of example. When the LBIST control circuit 10 outputs the PRPG control signal 1020 which is at the high level, the corresponding pattern generator 20 operates. Conversely, when the LBIST control circuit 10 outputs the PRPG control signal 1020 which is at the low level, the corresponding pattern generator 20 stops operating. Also, when the LBIST control circuit 10 outputs the MISR control signal 1030 which is at the high level, the corresponding pattern compressor 30 operates. Conversely, when the LBIST control circuit 10 outputs the MISR control signal 1030 which is at the low level, the corresponding pattern compressor 30 stops operating. Also regarding the remaining LBIST control circuits 11 to 13, operations of the corresponding pattern generators 21 to 23 and the corresponding pattern compressors 31 to 33 are controlled in the same manner.

The pattern generators 20 to 23 and the corresponding pattern compressors 30 to 33 are strung with the corresponding LBIST control circuits 10 to 13 by PRPG/MISR chains 1010 to 1013. While shift operations are repeated in the corresponding pattern generators, the corresponding pattern compressors, and the corresponding LBIST control circuits via the PRPG/MISR chains 1010 to 1013, an initial value is supplied from the corresponding one of the LBIST control circuits 10 to 13 to the corresponding one of the pattern generators 20 to 23 to set the initial value to each of the pattern generators 20 to 23. Moreover, by repeating the shift operations, the corresponding LBIST control circuits 10 to 13 collect diagnosis results from the corresponding pattern compressors 30 to 33 via the PRPG/MISR chains 1010 to 1013, respectively. The LBIST control circuit 10 will be also described herein by way of example. Shift operations are repeated among the pattern generator 20, the pattern compressor 30, and the LBIST control circuit 10 via the PRPG/MISR chain 1010. In these repeated shift operations, an initial value is supplied from the LBIST control circuit 10 to the corresponding pattern generator 20 to be set. Moreover, in the shift operations, the LBIST control circuit 10 collects diagnosis results from the pattern compressor 30.

Each of the logic circuits 40 to 43 is formed by a plurality of flip-flops (FF) and a combinational circuit. In self-diagnosis operations, a certain number of flip-flops (FF) among the plurality of flip-flops (FF) in the logic circuits 40 to 43 are connected by stringing with one another by scan chains 400 to 403. Input sides of the scan chains 400 to 403 are connected to the pattern generators 20 to 23, respectively, and output sides thereof are connected to the pattern compressors 30 to 33, respectively. If the logic circuit 40 is taken as an example, in the self-diagnosis operations, inputs/outputs of a certain number of flip-flops (FF) are connected by stringing with one another, and a test pattern from the pattern generator 20 is sequentially stored in the flip-flops (FF) by the scan chain 400. The test pattern stored in the strung flip-flops (FF) is supplied to the combinational circuit. In accordance with the supplied test pattern, the combinational circuit operates, and the operation result thereof is input to the plurality of flip-flops (FF). The flip-flops (FF) to which the operation result of the combinational circuit is input are connected by stringing with one another, and the operation result is supplied to the pattern compressor 30 by the scan chain 400. The pattern compressor 30 compresses the supplied operation result and supplies it to the corresponding LBIST control circuit 10 as a diagnosis result via the PRPG/MISR chain 1010. The logic circuits 41, 42, and 43 also operate in the same manner as the logic circuit 40, and the LBIST control circuits 10, 11, 12, and 13 can be independently controlled.

In the first embodiment, cut-off circuits 50 to 53 are provided in the semiconductor device 1E. The cut-off circuits 50 to 53 are the circuits which prevent signals (boundary signals) from being transmitted between the logic circuits 40, 41, 42, and 43 in self-diagnosis operations. In the self-diagnosis operations, for example, the cut-off circuit 50 controls such that boundary signals are not transmitted between the logic circuits 40 and 41, the cut-off circuit 51 controls such that boundary signals are not transmitted between the logic circuits 41 and 42, the cut-off circuit 52 controls such that boundary signals are not transmitted between the logic circuits 42 and 43, and the cut-off circuit 53 controls such that boundary signals are not transmitted between the logic circuits 43 and 40. Cut-off by each of the cut-off circuits 50 to 53 means fixing each boundary signal to a predetermined voltage (logical value) in the self-diagnosis operations.

For example, each of the cut-off circuits 50 to 53 has flip-flops corresponding to the number of boundary signals to be cut off. In a case of having the semiconductor device 1E function as an MCU, the flip-flops are configured to change the state thereof in accordance with the boundary signals to be cut-off in the self-diagnosis operations. Accordingly, in a case of having the semiconductor device 1E function as the MCU, transmitting boundary signals between the logic circuits 40 to 43 becomes possible. Meanwhile, in the case of the self-diagnosis operations, the flip-flops are set to predetermined states. Accordingly, fixing each boundary signal to a predetermined voltage (a logical value) becomes possible, so that the transmission of the boundary signals between the logic circuits 40 to 43 can be cut off.

In the first embodiment, the LBIST control circuits 10 to 13 have counters 10C, 11C, 12C, and 13C, respectively. An initial value is set to each of the counters 10C to 13C by a pattern-number adjusting circuit 60. More specifically, before the self-diagnosis operations are started, initial values are each set to the counters 10C, 11C, 12C, and 13C by the pattern-number adjusting circuit 60. In the first embodiment, it is configured that the set initial values are made to be different from one another. For example, it is configured that the initial values increase in the order of the counters 10C, 11C, 12C, and 13C. More specifically, the initial value of the counter 11C is set to be larger than that of the counter 10C, the initial value of the counter 12C is set to be larger than that of the counter 11C, and the initial value of the counter 13C is set to be larger than that of the counter 12C.

When the self-diagnosis operations are started, the counters 10C, 11C, 12C, and 13C count down in synchronization with one another. Also, when the self-diagnosis operations are started, the LBIST control circuits 10 to 13 set the PRPG control signals 1020 to 1023 to be valid (high level) substantially at the same time, respectively. After the PRPG control signals 1020 to 1023 are set to be valid, the LBIST control circuits 10 to 13 change the MISR control signals 1030 to 1033 to be valid (high level) substantially at the same time, respectively. The LBIST control circuits 10 to 13 set the PRPG control signals 1020 to 1023 and the MISR control signals 1030 to 1033 to be valid, respectively, until the counters 10C, 11C, 12C, and 13C owned by the respective LBIST control circuits 10 to 13 become a predetermined value (for example, 0) as a result of count-down operations. When the counters 10C, 11C, 12C, and 13C each reach the predetermined value, the LBIST control circuits 10 to 13 set the PRPG control signals 1020 to 1023 and the MISR control signals 1030 to 1033 to be invalid (low level), respectively.

For example, when the LBIST control circuit 10 is taken as an example, after the PRPG control signal 1020 and the MISR control signal 1030 are set to be valid, the PRPG control signal 1020 and the MISR control signal 1030 are maintained in the valid state until the value of the counter 10C owned by the LBIST control circuit 10 becomes 0. Meanwhile, when the value of the counter 10C reaches 0, the LBIST control circuit 10 causes the PRPG control signal 1020 and the MISR control signal 1030 to be changed to the invalid state. The same applies also to the other LBIST control circuits 11 to 13. Accordingly, the pattern generators stop operations in the order from the pattern generators 20 to 23, and the pattern compressors stop operations in the order from the pattern compressors 30 to 33. Accordingly, the operations are stopped in the order from the pattern generators 20 to 23, so that changes in the supplied test patterns are eliminated in the order from the logic circuits 40 to 43. Therefore, the current consumption in the logic circuits 40 to 43 is gradually reduced, and accordingly, rapid current changes can be prevented, so that the current change rate can be made small.

Note that, in FIG. 19, voltage wires are represented by reference numerals 500 and 501. In this case, the voltage wire 500 represents the voltage wire which supplies a power supply voltage for operating the circuits, and the voltage wire 501 represents the voltage wire which supplies a ground voltage. Moreover, the voltage wires 500 and 501 are each connected to power-supply external terminals (not shown) provided in the semiconductor device 1E, and the power supply voltage and the ground voltage are supplied from the outside of the semiconductor device 1E to the voltage wires 500 and 501 via the power-supply external terminals, respectively.

Figure 20:
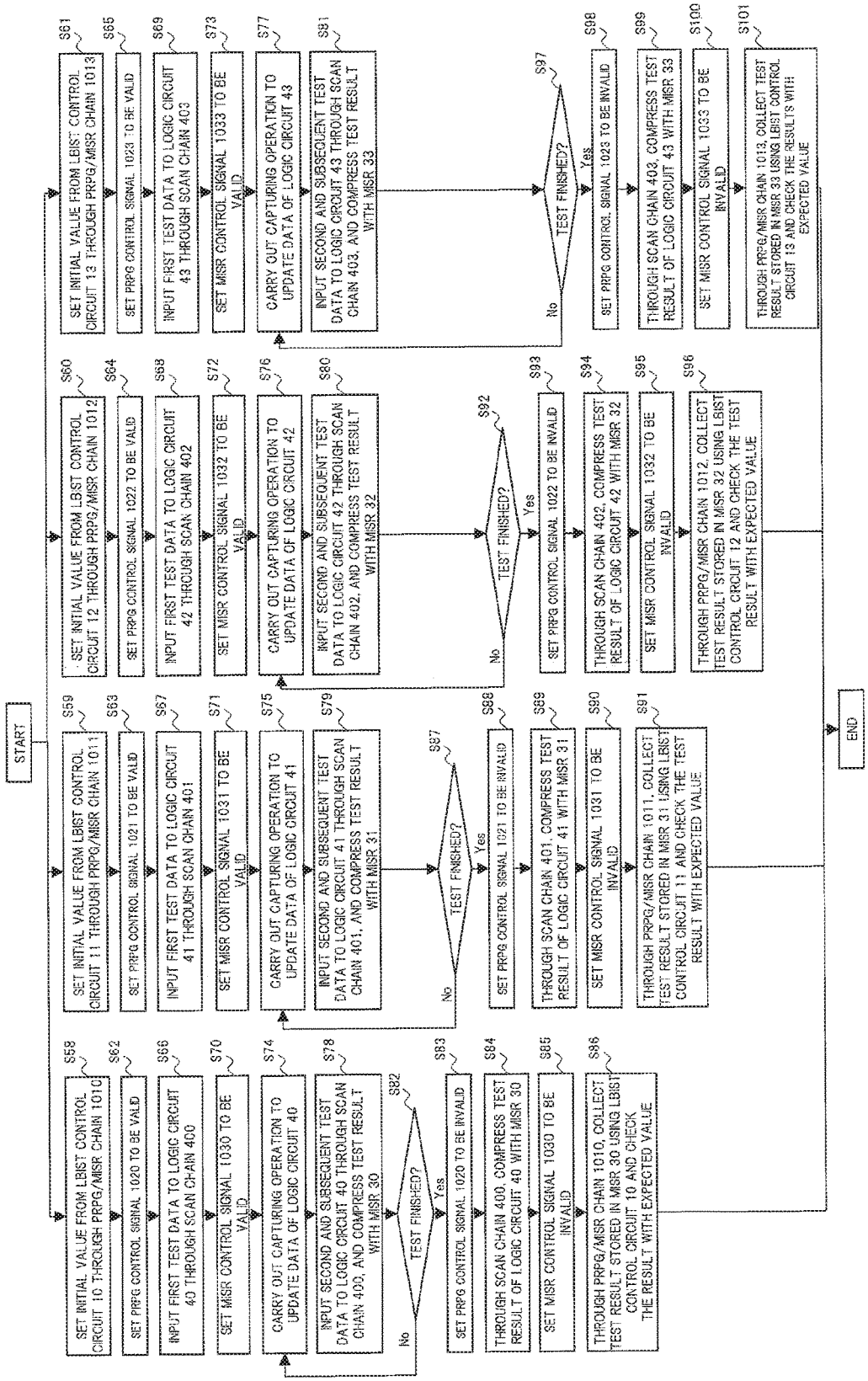
FIG. 20 is a flow chart showing operations of the semiconductor device according to the first embodiment.

FIG. 20 is a flow chart showing operations of the self-diagnosis of the semiconductor device 1E according to the first embodiment. In this chart, operation events are connected by respective arrows, and occurrences of events are shown by time series in accordance with the directions of the respective arrows. Note that the vertical direction of the flow chart shows approximate elapse of time in order to facilitate understanding of the outline of the operations, and accordingly, the lower the events are positioned in the vertical direction, the later the events occur.

In FIG. 20, steps S58, S62, S66, S70, S74, S78, and S82 to S86 show the processes carried out in the LBIST control circuit 10, the pattern generating circuit 20, the logic circuit 40, and the pattern compressor 30; and steps S59, S63, S67, S71, S75, S79, and S87 to S91 show the processes carried out in the LBIST control circuit 11, the pattern generating circuit 21, the logic circuit 41, and the pattern compressor 31. Similarly, steps S60, S64, S68, S72, S76, S80, and S92 to S96 show the processes carried out in the LBIST control circuit 12, the pattern generating circuit 22, the logic circuit 42, and the pattern compressor 32; and steps S61, S65, S69, S73, S77, S81, and S97 to S101 show the processes carried out in the LBIST control circuit 13, the pattern generating circuit 23, the logic circuit 43, and the pattern compressor 33.

The processes carried out in the LBIST control circuit 10, the pattern generating circuit 20, the logic circuit 40, and the pattern generator 30, the processes carried out in the LBIST control circuit 11, the pattern generating circuit 21, the logic circuit 41, and the pattern compressor 31, the processes carried out in the LBIST control circuit 12, the pattern generating circuit 22, the logic circuit 42, and the pattern compressor 32, and the processes carried out in the LBIST control circuit 13, the pattern generating circuit 23, the logic circuit 43, and the pattern compressor 33 are mutually the same. Therefore, in this case, the processes carried out in the LBIST control circuit 10, the pattern generating circuit 20, the logic circuit 40, and the pattern compressor 30 will be described with reference to FIG. 20.

First, a self-diagnosis operation is started. Before the self-diagnosis operation is started, initial values are set to the counter 10C by the pattern-number adjusting circuit 60 as described by FIG. 19. When the self-diagnosis operation is started, the counter 10C starts a count-down operation.

In step S58, the LBIST control circuit 10 sets an initial value to the pattern generator 20 through the PRPG/MISR chain 1010. Then, in step S62, the PRPG control signal 1020 is set to be valid (high level). As a result, a first test pattern (test data) is input from the pattern generator 20 to the logic circuit 40 through the scan chain 400 (step S66).

Then, in step S70, the LBIST control circuit 10 sets the MISR control signal 1030 to be valid (high level). The logic circuit 40 operates in accordance with the test pattern input in step S66 (step S74). In step S78, the pattern generator 20 inputs a second and subsequent test patterns (test data) to the logic circuit 40 through the scan chain 400, and the pattern compressor 30 receives the result of the logic circuit, which has been updated in step S74, through the scan chain 400 and compresses the test result.

Then, in step S82, whether the test has been finished or not is determined. In the first embodiment, whether the counter 10C has reached the predetermined value (0) or not as a result of the count-down operation is determined in step S82. When the count value of the counter 10C has not reached the predetermined value, steps S74, S78, and S82 are repeatedly executed. Conversely, when the count value of the counter 10C has reached the predetermined value, step S83 is executed. In step S83, the LBIST control circuit 10 sets the PRPG control signal 1020 to be invalid (low level). The pattern compressor 30 receives the result of the updated logic circuit through the scan chain 400 and compresses the test result (step S84). Then, the LBIST control circuit 10 sets the MISR control signal 1030 to be invalid (low level) (step S85).

In step S86, through the PRPG/MISR chain 1010, the compressed test result stored in the pattern compressor 30 is collected by the LBIST control circuit 10 and checked with an expected value.

In the same manner as the operations described above, operations are each carried out in the LBIST control circuits 11 to 13, the pattern generating circuits 21 to 23, the logic circuits 41 to 43, and the pattern compressors 31 to 33, and the self-diagnosis operations are finished. Since the respective initial values of the counters 10C, 11C, 12C, and 13C provided in the LBIST control circuits 10 to 13 are different from one another, the time at which finish of the test is determined in steps S82, S87, S92, and S97 is different for each step. Accordingly, a stop timing at which the operation of each of the logic circuits 40 to 43 is stopped is configured to be different for each logic circuit.

Figure 21:
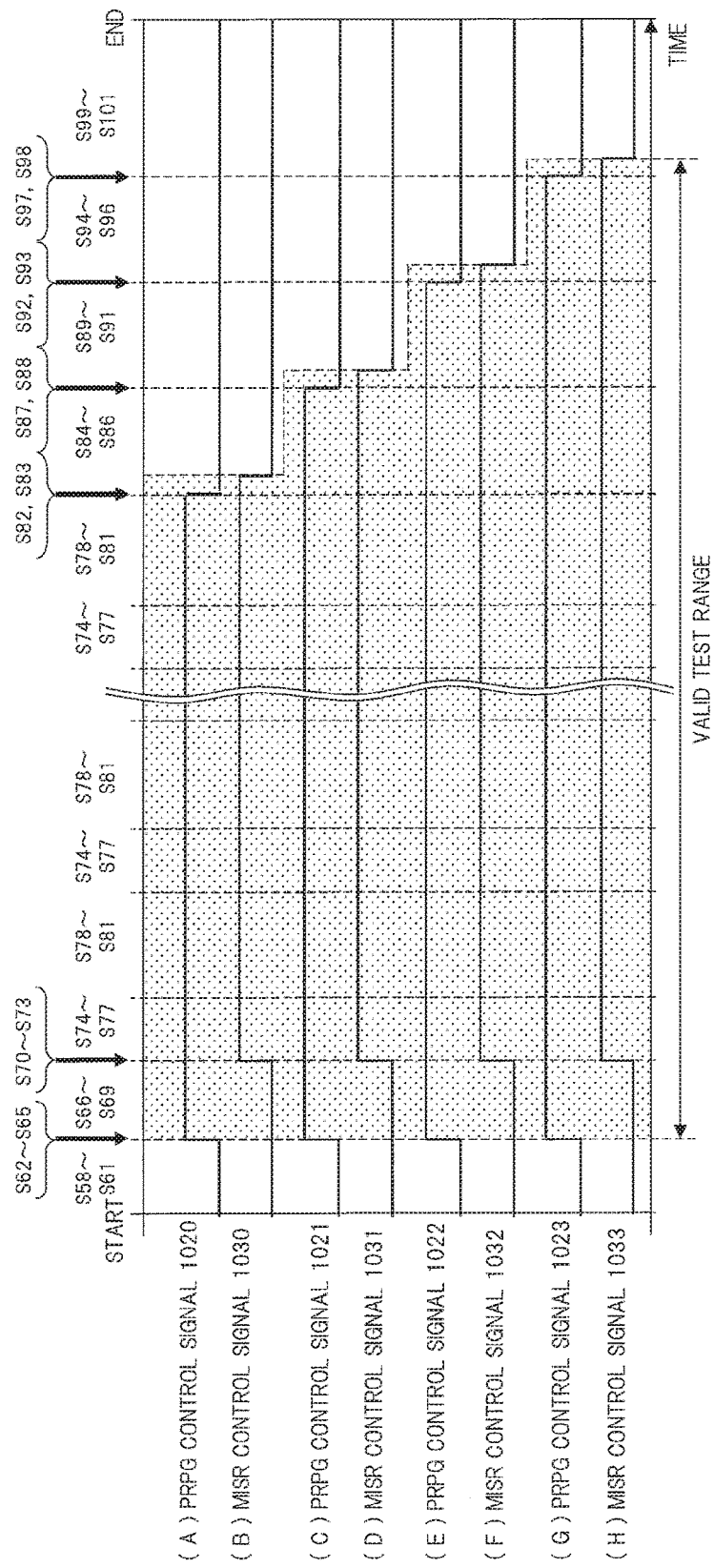
FIGS. 21(A) to 21(H) are waveform diagrams showing the operation of the semiconductor device according to the first embodiment.

FIGS. 21(A) to 21(H) are waveform diagrams showing the operations described in FIG. 20. In FIG. 21, a horizontal axis shows time, and a vertical axis shows voltages. In this case, FIG. 21(A) shows a waveform of the PRPG control signal 1020, FIG. 21(C) shows a waveform of the PRPG control signal 1021, FIG. 21(E) shows a waveform of the PRPG control signal 1022, and FIG. 21(G) shows a waveform of the PRPG control signal 1023. Also, FIG. 21(B) shows a waveform of the MISR control signal 1030, FIG. 21(D) shows a waveform of the MISR control signal 1031, FIG. 21(F) shows a waveform of the MISR control signal 1032, and FIG. 21(H) shows a waveform of the MISR control signal 1033. Meanwhile, reference characters S58 to S101 attached along the horizontal axis in FIG. 21 correspond to steps S58 to S101 described in FIG. 20, respectively.

In this case, the period from S66 to S84 is a valid test range of the logic circuit 40, and the period from S66 to S89 is a valid test range of the logic circuit 41. Similarly, the period from S66 to S94 is a valid test range of the logic circuit 42, and the period from S66 to S99 is a valid test range of the logic circuit 43. In the respective periods of the valid test ranges, the logic circuits 40 to 43 repeat random operations and consume electric power by the test patterns generated by the pattern generators 20, 21, 22, and 23, respectively.

Figure 22:
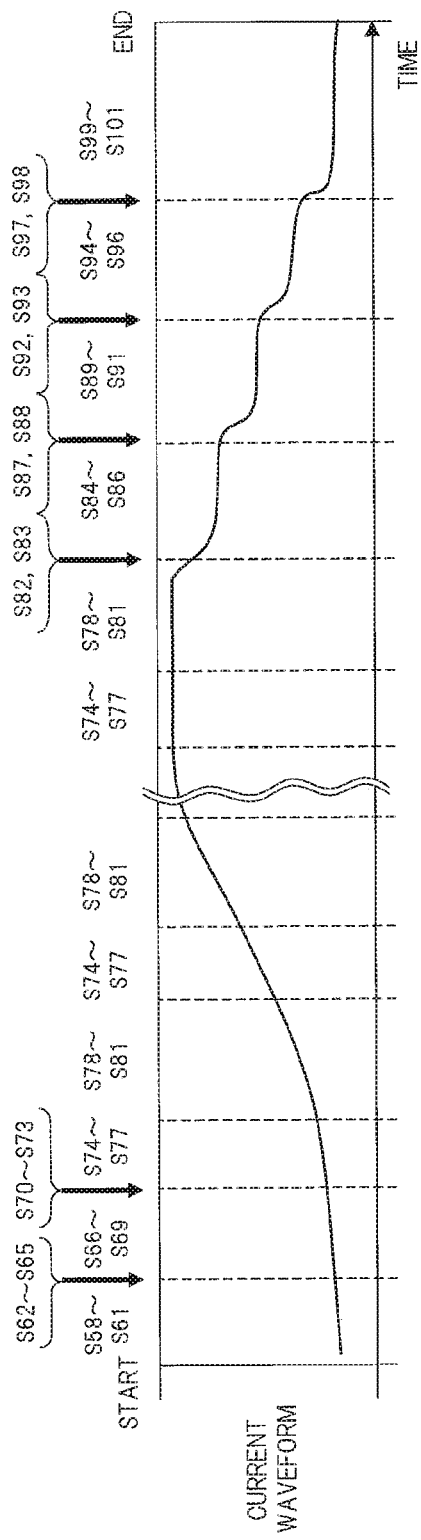
FIG. 22 is a waveform diagram schematically showing a current waveform of the semiconductor device according to the first embodiment.

FIG. 22 is a waveform diagram schematically showing the current waveform in the self-diagnosis operations of the semiconductor device 1E according to the first embodiment. In this diagram, a horizontal axis shows time, and a vertical axis shows a magnitude of current consumption. When the current waveform goes more upward in this diagram, the larger the current consumption becomes. Reference characters S58 to S101 attached along the horizontal axis correspond to steps S58 to S101 described in FIG. 24, respectively.

As shown in FIG. 22, the current consumption gradually increases from step S62 in which supply of the test patterns is started, and the current consumption reaches a peak at the time at which the repeated operations of step S74 to S81 are occurring. Then, the current consumption is gradually reduced from around the period in which the PRPG control signal 1020 is set to the low level by the event of step S83 and causes the pattern generator 20 to be in a stopped state, and the current corresponding to the amount of the electric power consumed by the logic circuit 40 is reduced around the period of step S85 in which the MISR control signal 1030 is changed to the low level and causes the pattern compressor 30 to be in a stopped state. This is because a change in a logical value in the logic circuit 40 is no longer generated as a result of stopping of the operations of the pattern generator 20 and the pattern compressor 30. Then, with predetermined time intervals, the logic circuits 41 to 43 are stopped in the order of the logic circuits 41, 42, and 43 by the same procedure as that of the logic circuit 40.

Figure 23:
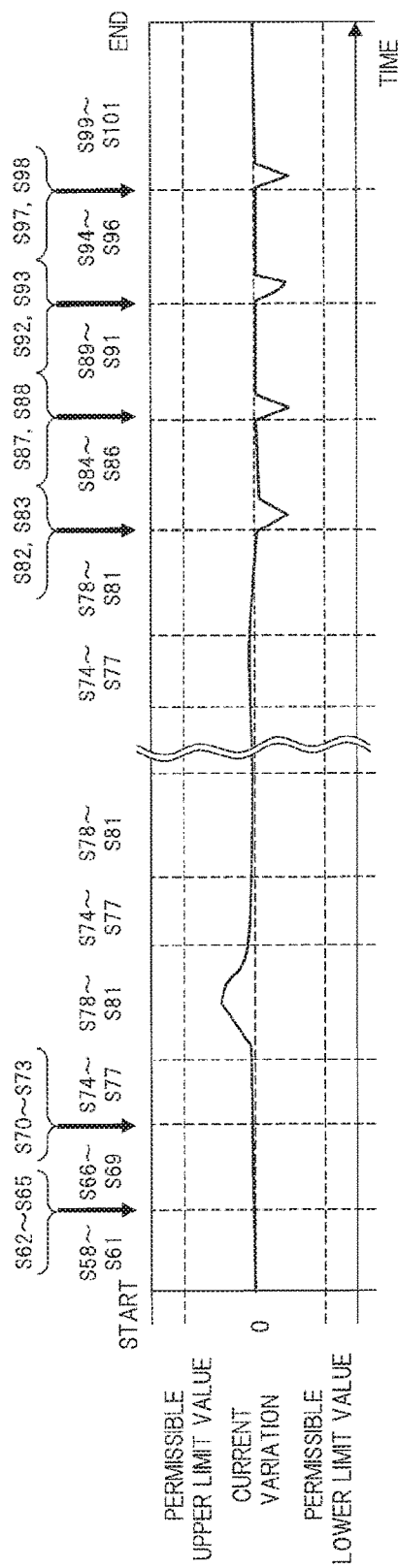
FIG. 23 is a waveform diagram showing current variation of the semiconductor device according to the first embodiment.

FIG. 23 is a waveform diagram showing current variation per unit time in the semiconductor device 1E according to the first embodiment. In this diagram, a horizontal axis shows time, and a vertical axis shows a magnitude of current variation. A central line represents "0" at which there is no variation in the current. The current variation in the diagram is extended upward when the current increases, and the current variation in the diagram is extended downward when the current decreases. Reference characters S58 to S101 attached along the horizontal axis correspond to steps S58 to S101 described in FIG. 24, respectively.

When FIG. 28 and FIG. 23 are compared with each other, it can be understood that a change in current value per time, in other words, a current change rate (di/dt) is suppressed to be low in the semiconductor device 1E according to the first embodiment, and the permissible upper limit value and the permissible lower limit value (for example, 80 mA/20 us) are also satisfied.

Note that the circuits shown in FIG. 19 are formed on a single semiconductor substrate by known semiconductor techniques. Also, the counters 10C, 11C, 12C, and 13C have been described to count down in synchronization with one another. However, as a matter of course, the counters may count up in synchronization with one another. In this case, the count-down operations described above become count-up operations.

Second Embodiment

<Overall Configuration of Semiconductor Device>

FIG. 1 is a block diagram showing an overall configuration of a semiconductor device according to a second embodiment. In this diagram, a semiconductor device is represented by reference character 1A, and the semiconductor device 1A constitutes an MCU. In order to achieve functions of the MCU, the semiconductor device 1A incorporates a plurality of logic circuits. Some logic circuits among the plurality of logic circuits are shown as reference numerals 40 to 43 in this diagram. Moreover, similarly to the first embodiment, in order to carry out self-diagnoses of the logic circuits, the semiconductor device 1A includes an LBIST control circuit 10, pattern generators (PRPG) 20, 21, 22, and 23, and pattern compressors (MISR) 30, 31, 32, and 33. Although there is no limitation, in this second embodiment, the pattern generators 20 to 23, the pattern compressors 30 to 33, and the logic circuits 40 to 43 correspond to one another on a one-to-one basis.

The semiconductor device 1A is further provided with a PRPG control circuit 2A connected to the pattern generators 20 to 23 and controlling the pattern generators 20 to 23, and an MISR control circuit 3A connected to the pattern compressors 30 to 33 and controlling the pattern compressors 30 to 33. The PRPG control circuit 2A and the MISR control circuit 3A are connected to the LBIST control circuit 10 and are controlled by the LBIST control circuit 10.

The operations of the pattern generators 20 to 23 are controlled, respectively, by PRPG control signals 200 to 203 from the PRPG control circuit 2A, and the operations of the pattern compressors 30 to 33 are controlled, respectively, by MISR control signals 300 to 303 from the MISR control circuit 3A. The control by the PRPG control circuit 2A and the MISR control circuit 3A will be described in the following by taking the pattern generator 20 and the pattern compressor 30 as examples. The PRPG control circuit 2A switches so as to operate or stop the function of the pattern generator 20 by the PRPG control signal 200. For example, the PRPG control circuit 2A sets the PRPG control signal 200 to the high level, thereby operating the function of the pattern generator 20 and sets the PRPG control signal 200 to the low level, thereby stopping the function of the pattern generator 20. Similarly, the MISR control circuit 3A sets the MISR control signal 300 to the high level, thereby operating the function of the pattern compressor 30 and sets the MISR control signal 300 to the low level, thereby stopping the function of the pattern compressor 30.

Also regarding the remaining pattern generators 21 to 23, similarly to the pattern generator 20, the PRPG control circuit 2A sets the PRPG control signals 201 to 203 corresponding to the respective pattern generators 21 to 23 to the high level, thereby operating the functions of the corresponding pattern generators 21 to 23, and the PRPG control circuit 2A sets the PRPG control signals 201 to 203 to the low level, thereby stopping the functions of the corresponding pattern generators 21 to 23. Moreover, also regarding the remaining pattern compressors 31 to 33, similarly to the pattern compressor 30, the MISR control circuit 3A sets the MISR control signals 301 to 303 corresponding to the respective pattern compressors 31 to 33 to the high level, thereby operating the functions of the corresponding pattern compressors 31 to 33, and the MISR control circuit 3A sets the MISR control signals 301 to 303 to the low level, thereby stopping the functions of the corresponding pattern compressors 31 to 33.

The PRPG control circuit 2A is capable of separately controlling such that the PRPG control signals 200 to 203 corresponding to the respective pattern generators 20 to 23 are set to the high-level/low-level. Moreover, the MISR control circuit 3A is also capable of separately controlling such that the MISR control signals 300 to 303 corresponding to the respective pattern compressors 30 to 33 are set to the high-level/low-level.

All the pattern generators 20 to 23 and all the pattern compressors 30 to 33 are strung with the LBIST control circuit 10 by a PRPG/MISR chain 101. Data are shifted between the pattern generators 20 to 23, the pattern compressors 30 to 33, and the LBIST control circuit 10 via the PRPG/MISR chain 101. The above data include initial values set to the pattern generators 20 to 23 and compressed test results. While repeating shift operations, the LBIST control circuit 10 supplies the initial values to the respective pattern generators 20 to 30 via the PRPG/MISR chain 101 and sets the initial values to the respective pattern generators 20 to 23. Moreover, by repeating the shift operations, the compressed test results in the pattern compressors 30 to 33 are sequentially collected by the LBIST control circuit 10 via the PRPG/MISR chain 101.

Although an example of the logic circuits 40 to 43 will be described later in detail with reference to the drawings, each of the logic circuits 40 to 43 has a plurality of flip-flops (FF) and a combinational circuit. In self-diagnosis operations, of the plurality of flip-flops, inputs/outputs of a certain number of the flip-flops are connected by stringing with one another by scan chains 400. Input sides of the scan chains 400 are connected to the respective pattern generators 20 to 23, and output sides thereof are connected to the respective pattern compressors 30 to 33. In the self-diagnosis operations, through the scan chains 400, test patterns from the corresponding pattern generators 20 to 23 are sequentially retrieved into the flip-flops. The test patterns retrieved into the flip-flops are each supplied to the combinational circuits, and each combinational circuit operates in accordance with the corresponding test pattern. The data (test results) obtained as a result of operation of the combinational circuits are each supplied to the flip-flops, which are connected by stringing with one another, through the scan chains 400 to be sequentially supplied from the flip-flops to the pattern compressors 30 to 33.

The test results supplied to the pattern compressors 30 to 33 through the scan chains 400 are compressed, and the compressed test results are supplied to the LBIST control circuit 10 via the PRPG/MISR chain 101. The test results collected by the LBIST control circuit 10 are subjected to determination with reference to expected values to carry out a self-diagnosis.

In FIG. 1, similarly to the first embodiment, voltage wires are represented by reference numerals 500 and 501. The voltage wires 500 and 501 are each connected to the pattern generators 20 to 23, the pattern compressors 30 to 33, the logic circuits 40 to 43, the PRPG control circuit 2A, the MISR control circuit 3A, and the LBIST control circuit 10. Similarly to the first embodiment, the voltage wire 500 supplies a power supply voltage for operating each of the connected circuits to each of the circuits, and the voltage wire 501 supplies a ground voltage to each of the circuits. Similarly to the first embodiment, the voltage wires 500 and 501 are each connected to power-supply external terminals (not shown) provided in the semiconductor device 1A, and the power supply voltage and the ground voltage are supplied from the outside of the semiconductor device 1A to the voltage wires 500 and 501 via the power-supply external terminals, respectively.

In FIG. 1, reference numerals and characters 102, 103, 104, 105-I, 105-O, 106, and 107L represent signals, and these signals 102, 103, 104, 105-I, 105-O, 106, and 107L will be described later, but the signal 104 is a clock signal to be supplied from the outside via an external terminal (not shown) provided in the semiconductor device 1A.

Although there is no limitation, the semiconductor device 1A shown in FIG. 1 is manufactured by known semiconductor manufacturing techniques, and the circuit block shown in FIG. 1 is formed on a single semiconductor substrate.

<PRPG Control Circuit>

Figure 6:
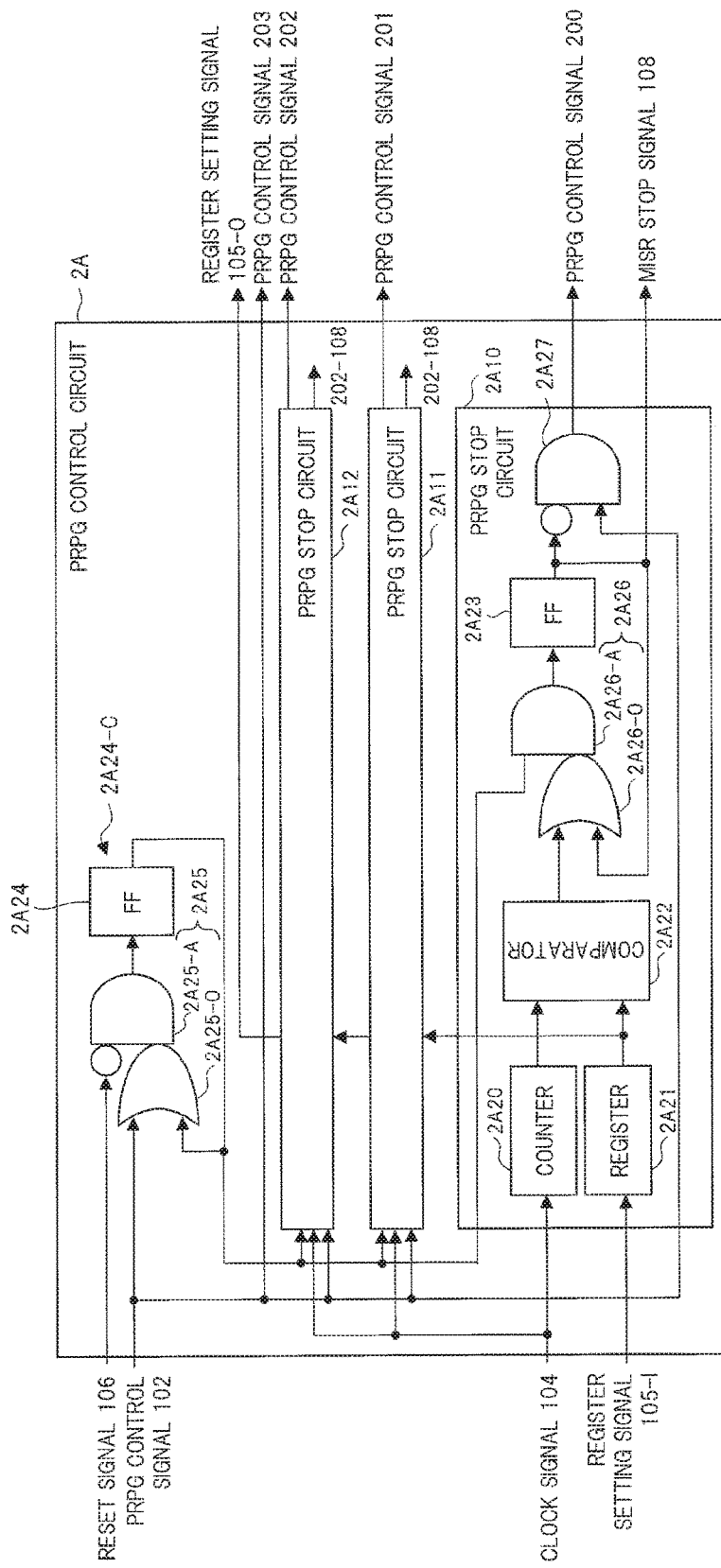
FIG. 6 is a block diagram showing a configuration of a PRPG control circuit according to the second embodiment.

FIG. 6 is a block diagram showing a configuration of a PRPG control circuit 2A according to the second embodiment. The PRPG control circuit 2A includes a plurality of PRPG stop circuits 2A10 to 2A12 and a control circuit 2A24-C. The plurality of PRPG stop circuits 2A10 to 2A12 have mutually the same configurations, and FIG. 6 representatively shows the configuration of the PRPG stop circuit 2A10 in detail. In the second embodiment, the PRPG stop circuits 2A10 to 2A12 correspond to the pattern generators 20 to 22 on a one-to-one basis, respectively.

The control circuit 2A24-C is a control circuit which controls the PRPG stop circuits 2A10 to 2A12, and the plurality of PRPG stop circuits 2A10 to 2A12 are controlled by the single control circuit 2A24-C. The control circuit 2A24-C has a flip-flop 2A24 and a combinational circuit 2A25. In this case, the combinational circuit 2A25 receives the PRPG control signal 102 from the LBIST control circuit 10, the reset signal 106, and an output of the flip-flop 2A24, and the flip-flop 2A24 receives an output of the combinational circuit 2A25.

When the LBIST control circuit 10 resets the PRPG control circuit 2A, the LBIST control circuit 10 sets the reset signal 106 to the high level, and conversely, when the reset is cancelled, the LBIST control circuit 10 asserts the reset signal 106 to the low level. The combinational circuit 2A25 has a 2-input AND (AND) circuit 2A25-A and a 2-input OR circuit (OR) 2A25-O. In this case, the reset signal 106 whose phase is inverted is supplied to one input of the 2-input AND circuit 2A25-A, and an output of the 2-input OR circuit 2A25-O is supplied to the other input of the 2-input AND circuit 2A25-A. Note that an inverter circuit inverting the phase of the reset signal 106 is represented by a circle mark attached to the one input of the 2-input AND circuit 2A25-A in FIG. 6. Also, the PRPG control signal 102 from the LBIST control circuit 10 is supplied to one input of the 2-input OR circuit 2A25-O, and the output of the flip-flop 2A24 is supplied to the other input thereof.

In resetting, the reset signal 106 becomes the high level, and, therefore, an output of the 2-input AND circuit 2A25-A becomes the low level. The flip-flop 2A24 retrieves and retains the output of this 2-input AND circuit 2A25-A and continues outputting the retrieved level. Therefore, in resetting, the output of the flip-flop 2A24 becomes the low level. Meanwhile, when the LBIST control circuit 10 asserts the reset signal 106 to the low level and cancels the reset, the 2-input AND circuit 2A25-A inputs a voltage in accordance with the voltage (logical value) of the input of the 2-input OR circuit 2A25-O to the flip-flop 2A24.

When the LBIST control circuit 10 sets the pattern generators 20 to 23 to an active state, in other words, sets the PRPG control circuit 2A to an active state, the LBIST control circuit 10 sets the PRPG control signal 102 to the high level, and conversely, when the LBIST control circuit 10 sets the pattern generators 20 to 23 to a stopped state, the LBIST control circuit 10 sets the PRPG control signal 102 to the low level. If the PRPG control signal 102 is at the low level when the reset state is cancelled, the output of the 2-input OR circuit 2A25-O is at the low level, and therefore, the flip-flop 2A24 continues maintaining the low level and outputs the low level. Meanwhile, if the PRPG control signal 102 is set to the high level such that the PRPG control circuit 2A becomes an active state when the reset is cancelled, the output of the 2-input OR circuit 2A25-O becomes the high level, the flip-flop 2A24 retrieves the high level (logical value "1"), and the output is changed from the low level to the high level. Since the output of the flip-flop 2A24 is supplied to the other input of the 2-input OR circuit 2A25-O, the output of the flip-flop 2A24 is maintained at the high level even if the PRPG control signal 102 is changed to the low level thereafter. Until the LBIST control circuit 10 changes the reset signal 106 to the high level so as to instruct reset again, the high level of the flip-flop 2A24 is continued to be maintained.

The output of the flip-flop 2A24 is the output of the control circuit 2A24-C. Therefore, it can be considered that the flip-flop 2A24 controls the start and the end of the control by the PRPG control circuit 2A.

Then, configurations of the PRPG stop circuits 2A10 to 2A12 will be described. Since these PRPG stop circuits 2A10 to 2A12 have mutually the same configurations as described above, the PRPG stop circuit 2A10 representatively shown will be taken as an example and described.

The PRPG stop circuit 2A10 has a counter 2A20, a register 2A21, a comparator 2A22, a combinational circuit 2A26, a flip-flop 2A23, and a 2-input AND circuit 2A27. The counter 2A20 is a counter which receives the clock signal 104 supplied from the outside the semiconductor device 1A to count the clock signal 104. Although there is no particular limitation, in the second embodiment, self-diagnosis operations are executed in synchronization with the clock signal 104.

The register 2A21 is a register whose value is set by a register setting signal 105-I supplied from the LBIST control circuit 10 to this PRPG stop circuit 2A10.

The LBIST control circuit 10 supplies a value corresponding to a stop timing at which the test pattern generated in each of the pattern generators 20 to 22 corresponding to the respective PRPG stop circuits 2A10 to 2A12 is stopped, and the value is stored in the register 2A21. Taking the PRPG stop circuit 2A10 as an example, the value corresponding to the stop timing at which the test pattern generated in the pattern generator 20 corresponding to the PRPG stop circuit 2A10 is supplied to the register 2A21 as the register setting signal 105-I and is stored in the register 2A21.

The comparator 2A22 compares a count value of the counter 2A20 with the value stored in the register 2A21. The count value is, for example, increased by counting the clock signal 104 by the counter 2A20; and, when the value stored in the register 2A21 and the counter value of the counter 2A20 become equal to each other, the comparator 2A22 outputs a high-level signal.

The combinational circuit 2A26 has a 2-input OR circuit 2A26-O and a 2-input AND circuit 2A26-A. The output of the control circuit 2A24-C is supplied to one input of the 2-input AND circuit 2A26-A, and an output of the 2-input OR circuit 2A26-O is supplied to the other input of the 2-input AND circuit 2A26-A. An output of the 2-input AND circuit 2A26-A serves as an output of the combinational circuit 2A26, and the output of the combinational circuit 2A26 is input to the flip-flop 2A23. An output of the above described comparator 2A22 is supplied to one input of the 2-input OR circuit 2A26-O, and an output of the above described flip-flop 2A23 is supplied to the other input of the 2-input OR circuit 2A26-O.

As described above, the control circuit 2A24-C outputs the high level in the period in which the reset is cancelled and the PRPG control circuit 2A is in an active state, and the control circuit 2A24-C outputs the low level in the reset state or while the PRPG control circuit 2A is not activated. Therefore, in the reset state or in the period in which the PRPG control circuit 2A is not activated, the 2-input AND circuit 2A26-A supplies the low level to an input of the flip-flop 2A23.

Meanwhile, in the period in which the reset is cancelled and the PRPG control circuit 2A is in the active state, the 2-input AND circuit 2A26-A supplies the voltage in accordance with the input of the 2-input OR circuit 2A26-O to the input of the flip-flop 2A23. For example, in this period, when an output of the comparator 2A22 becomes the high level, the 2-input AND circuit 2A26-A supplies a high level to the flip-flop 2A23 as the output of the combinational circuit 2A26. As a result, the flip-flop 2A23 retrieves and stores the high level. When the high level is stored, an output voltage from the flip-flop 2A23 is changed from the low level to the high level. Since the voltage of the high level is supplied to the other input of the 2-input OR circuit 2A26-O, the flip-flop 2A23 continuously outputs the high-level voltage even if the voltage of the comparator 2A22 is changed to the low level. When the voltage of the control circuit 2A24-C is changed to the low level, the voltage output from the flip-flop 2A23 is changed from the high level to the low level.

The output of the flip-flop 2A23 is supplied to one input of the 2-input AND circuit 2A27. In this case, a circle mark attached to the one input of the 2-input AND circuit 2A27 means an inverter circuit. Therefore, the output of the flip-flop 2A23 is subjected to phase inversion to be supplied to the one input of the 2-input AND circuit 2A27. Meanwhile, the PRPG control signal 102 is supplied to the other input of the 2-input AND circuit 2A27. Therefore, the 2-input AND circuit 2A27 outputs the high level in the period that the PRPG control signal 102 is at the high level and that the output of the flip-flop 2A23 is at the low level. Until the count value of the counter 2A20 reaches (until it becomes equal to) the value stored in the register 2A21 after the PRPG control circuit 2A is activated, the flip-flop 2A23 outputs the low level.

Therefore, until the time corresponding to the value stored in the register 2A21 elapses after the LBIST control circuit 10 activates the PRPG control circuit 2A, the 2-input AND circuit 2A27 outputs the high level, and, when the time corresponding to the value stored in the register 2A21 elapses, the 2-input AND circuit 2A27 outputs the low level. The output of the 2-input AND circuit 2A27 serves as the PRPG control signal 200 supplied to the corresponding pattern generator 20. Meanwhile, the output of the flip-flop 2A23 serves as an MISR stop signal 108 supplied to the MISR control circuit 3A.

Also for each of the remaining PRPG stop circuits 2A11 and 2A12, the configurations and operations similar to those of the above described PRPG stop circuit 2A10 are carried out. More specifically, after the PRPG control circuit 2A is activated, until the time corresponding to the value stored in the register 2A21 provided in the PRPG stop circuit 2A11 elapses, the PRPG stop circuit 2A11 supplies the high-level PRPG control signal 201 to the corresponding pattern generator 21. Meanwhile, when the time corresponding to the value stored in the register 2A21 elapses, the PRPG stop circuit 2A11 supplies the low-level PRPG control signal 201 to the corresponding pattern generator 21. Also, after the PRPG control circuit 2A is activated, until the time corresponding to the value stored in the register 2A21 provided in the PRPG stop circuit 2A12 elapses, the PRPG stop circuit 2A12 supplies the high-level PRPG control signal 202 to the corresponding pattern generator 22. Meanwhile, when the time corresponding to the value stored in the register 2A21 elapses, the PRPG stop circuit 2A12 supplies the low-level PRPG control signal 202 to the corresponding pattern generator 22.

Similar to the PRPG stop circuit 2A10, the PRPG stop circuits 2A11 and 2A12 also output MISR stop signals 201-108 and 202-108. However, in the second embodiment, the MISR stop signals 201-108 and 202-108 formed by the PRPG stop circuits 2A11 and 2A12 are not supplied to the MISR control circuit 3A.

In the second embodiment, before the PRPG control circuit 2A is activated, the LBIST control circuit 10 sets the value corresponding to time to each of the registers 2A21 in the respective PRPG stop circuits 2A10 to 2A12. In this case, the values are set such that the time to be set in the registers 2A21 in the respective PRPG stop circuits 2A10 to 2A12 become different from one another. Specifically, for example, the value corresponding to the shortest time is set as the value set to the register 2A21 of the PRPG stop circuit 2A10, the value corresponding to the second shortest time is set as the value set to the register 2A21 of the PRPG stop circuit 2A11, and the value corresponding to the longest time is set as the value set to the register 2A21 of the PRPG stop circuit 2A12.

When the PRPG control circuit 2A is activated (the PRPG control signal 102 is changed to the high level) by changing length of time set to the registers 2A21 in the PRPG stop circuits 2A10 to 2A12 in this manner, voltages of the MISR stop signals 108, 201-108, and 202-108 are changed in this order from the low level to the high level. Although description will be given later, the MISR stop signals are used for stopping the functions of the pattern compressors 30 to 33. By stopping the pattern compressors 30 to 33 through use of the MISR stop signal 108, which is changed to the high level fastest, unnecessary operations of the pattern compressors can be reduced, and electric power consumption can be also reduced. In this case, the PRPG control signals become the low level in the order of the PRPG control signals 200, 201, and 202.

In addition, in the second embodiment, the PRPG control signal 102 is used without change as the PRPG control signal 203 supplied to the pattern generator 23.

Also in the second embodiment, the pattern generators 20 to 23 are controlled by the corresponding PRPG control signals 200 to 203. More specifically, when the corresponding PRPG control signals 200 to 203 become the high level, the pattern generators 20 to 23 operate. Operation of the pattern generators 20 to 23 generate test patterns to supply to the corresponding logic circuits 40 to 43 through the scan chains 400. Meanwhile, when the corresponding PRPG control signals 200 to 203 are changed to the low level, the corresponding pattern generators 20 to 23 stop operating. In this case, stop of operations of the pattern generators 20 to 23 means that the signals output from the respective pattern generators 20 to 23 are fixed to predetermined voltages and are not changed in terms of time. Therefore, when the pattern generators 20 to 23 stop operating, it can be considered that the test patterns are also stopped.

According to the second embodiment, when the PRPG control circuit 2A is activated by the PRPG control signal 102, in response to this activation, each of the PRPG control signals 200 to 203 becomes the high level substantially at the same time. As a result, the pattern generators 20 to 23 start operating and generate test patterns to supply to the logic circuits 40 to 43, respectively. Then, when time elapses based on the values for time set in advance to the respective registers 2A21 of the PRPG stop circuits 2A10 to 2A12, the voltages of the PRPG control signals 200, 201, and 202 are changed in this order from the high level to the low level. As a result, in the order of the logic circuits 40, 41, and 42, the voltages of the signals supplied from the pattern generators 20 to 22 are fixed, and current consumption is reduced in the order of the logic circuits 40, 41, and 42. As a result, rapid variation of current consumption can be prevented.

The number of the PRPG stop circuits provided in the PRPG control circuit 2A is increased or decreased depending on the number of the pattern generators mounted in the semiconductor device 1A and is, at a maximum, the same as the number of the pattern generators. However, the upper limit thereof is not limited by the number of the pattern generators. In addition, a single PRPG stop circuit may be shared by a plurality of pattern generators. Like the PRPG control signal 203, a PRPG control signal which is not controlled by the PRPG stop circuit may be present.

In addition, computation of logical sum may be executed between the MISR stop signals (108, 201-108, and 202-108) from the PRPG stop circuits 2A10 to 2A12, and the obtained results of the logical sum may be used as the stop signal 108 (FIG. 1). In this case, the value for the time set to the register 2A21 of the PRPG stop circuit 2A10 may not be the value corresponding to the shortest time. More specifically, when the logical sum is obtained, the timing of the MISR stop signal which becomes the low level fastest is transmitted to the MISR control circuit 3A, and therefore, the degree of freedom of the values set to the respective registers can be increased, so that setting of the self-diagnosis operations can be facilitated.

In addition, the configurations of the control circuit 2A24-C and the PRPG stop circuits 2A10 to 2A12 are not limited to the configurations shown in FIG. 6. For example, the counters 2A20 provided in the respective PRPG stop circuits 2A10 to 2A12 may be a single common counter. In this case, in each of the PRPG stop circuits, it is only required to compare the value of the common counter with the value of the register. In addition, the counter 2A20 and the common counter may be each configured to obtain the count value by count-up operation or may be each configured to obtain the count value by count-down operation based on the clock signal 104.

In the case in which the values for time are set to the registers 2A21 in the respective PRPG stop circuits 2A10 to 2A12, the registers 2A21 in the respective PRPG stop circuits 2A10 to 2A12 are serially connected. More specifically, an output of the register 2A21 in the PRPG stop circuit 2A10 is connected to an input of the register 2A21 in the PRPG stop circuit 2A11, and an output of the register 2A21 in the PRPG stop circuit 2A11 is connected to an input of the register 2A21 in the PRPG stop circuit 2A12. These serially connected registers are operated as a shift register. The values to be set to the respective registers 2A21 are each sequentially supplied as the register setting signals 105-I from the LBIST control circuit 10 to the input of the register 2A21 in the PRPG stop circuit 2A10. In this case, the values for time (initial values) can be set to the registers 2A21 in the respective PRPG stop circuits 2A10 to 2A12 by operating the serially connected registers as the shift register.

Moreover, by serially connecting the registers 2A21 and operating them as a shift register, the LBIST control circuit 10 can read the values, which are stored in the respective registers 2A21, as the register setting signals 105-O.

As a matter of course, initial values for time may be set as the register setting signals 105-I separately to the respective registers 2A21.

<MISR Control Circuit 3A>

Figure 7:
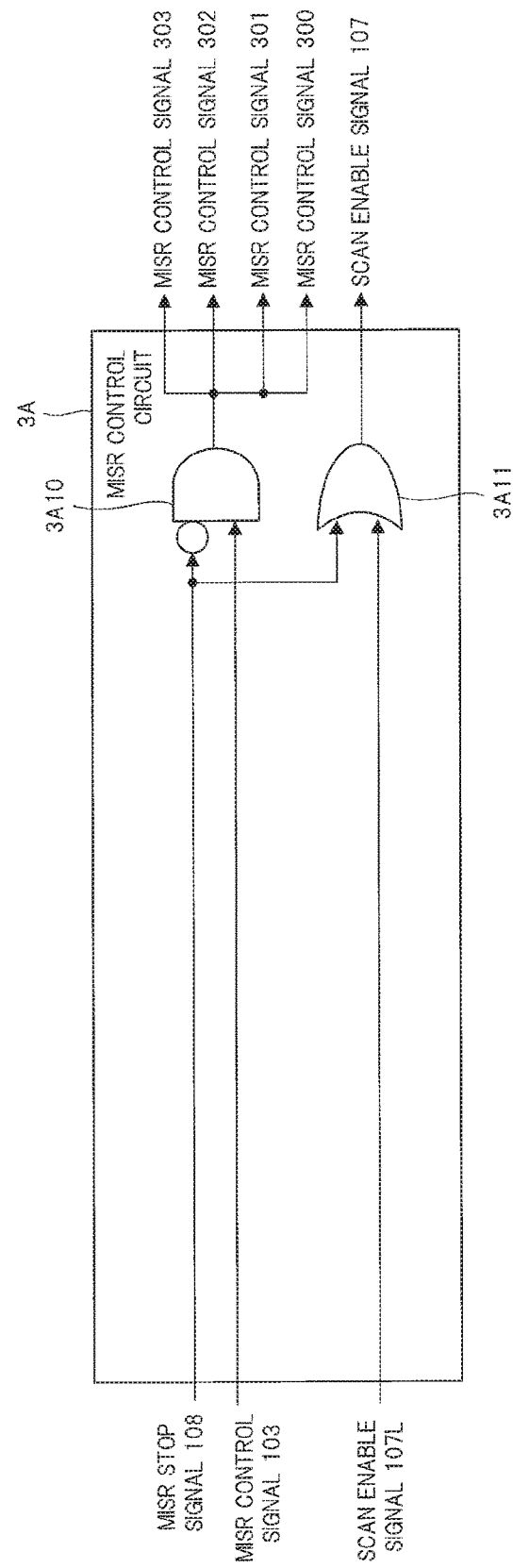
FIG. 7 is a block diagram showing a configuration of an MISR control circuit according to the second embodiment.

FIG. 7 is a block diagram showing a configuration of the MISR control circuit 3A according to the second embodiment. The MISR control circuit 3A has a 2-input AND circuit 3A10 and a 2-input OR circuit 3A11. The MISR stop signal 108 described in FIG. 6 is subjected to phase inversion and supplied to one input of the 2-input AND circuit 3A10, and the MISR control signal 103 from the LBIST control circuit 10 is supplied to the other input thereof. In this case, a circle mark attached to the one input of the 2-input AND circuit 3A10 represents an inverter circuit, and it shows that the MISR stop signal 108 is subjected to the phase inversion by the inverter circuit of the circle mark and is supplied to the one input of the 2-input AND circuit 3A10.

An output of the 2-input AND circuit 3A10 is supplied to the pattern compressors 30 to 33 as the MISR control signals 300 to 303. In addition, the MISR stop signal 108 and the scan enable signal 107L from the LBIST control circuit 10 are supplied to the 2-input OR circuit 3A11, and an output of the 2-input OR circuit 3A11 is supplied to each of the logic circuits 40 to 43 as a scan enable signal 107.

The LBIST control circuit 10 sets the MISR control signal 103 to the high level when the MISR control circuit 3A is activated, and the LBIST control circuit 10 sets the MISR control signal 103 to the low level when the MISR control circuit 3A is stopped. Meanwhile, as described in FIG. 6, the MISR stop signal 108 is at the low level until the value stored in the register 2A21 and the count value of the counter 2A20 become equal to each other after the PRPG control circuit 2A is activated, and the MISR stop signal 108 becomes the high level when the value of the register 2A21 and the count value become equal to each other. More specifically, the MISR stop signal 108 is at the low level until the time set in the register 2A21 elapses after the PRPG control circuit 2A is activated, and the MISR stop signal 108 becomes the high level after the time elapses.

Therefore, until the time set in the register 2A21 elapses after the LBIST control circuit 10 activates the MISR control circuit 3A, the 2-input AND circuit 3A10 causes each of the MISR control signals 300 to 303 to be at the high level, and, when the time elapses, the 2-input AND circuit 3A10 changes each of the MISR control signals 300 to 303 to the low level.

The MISR control signals 300 to 303 output from the MISR control circuit 3A correspond to the pattern compressors 30 to 33 on a one-to-one basis. The pattern compressors 30 to 33 each operate when the corresponding MISR control signals 300 to 303 are at the high level and stop operating when the corresponding MISR control signals 300 to 303 are changed to the low level.

While operating, the pattern compressors 30 to 33 receive the operation results (test results) from the logic circuits 40 to 43, respectively, through the scan chains 400, compress them, and supply them to the LBIST control circuit 10 through the PRPG/MISR chain 101. When the time set in the register 2A21 elapses, the operations thereof are stopped.

In self-diagnosis operations, when test patterns are sequentially transferred to the flip-flops FF in the logic circuits 40 to 43, the LBIST control circuit 10 sets the scan enable signal 107L to the high level, and, when operation results (test results) of the logic circuits 40 to 43 are retrieved into the flip-flops FF, in other words, in capturing operations, the LBIST control circuit 10 sets the scan enable signal 107L to the low level. When the PRPG control signal 200 is at the high level, the pattern generator 20 generates a test pattern. At this point, as described in FIG. 6, the MISR stop signal 108 is at the low level. However, since the LBIST control circuit 10 is outputting the high-level scan enable signal 107L, the high-level scan enable signal 107 is supplied from the 2-input OR circuit 3A11 to the logic circuits 40 to 43, and therefore, the test patterns can be sequentially transferred to the flip-flops FF in the logic circuits 40 to 43. Moreover, when the LBIST control circuit 10 sets the scan enable signal 107L to the low level, the 2-input OR circuit 3A11 sets the scan enable signal 107 to the low level, and therefore, the flip-flops FF can be updated by the operation results of the logic circuits by capturing operations.

Meanwhile, when the MISR stop signal 108 becomes the high level in order to stop the pattern compressors 30 to 33, the 2-input OR circuit 3A11 outputs the high-level scan enable signal 107. Accordingly, when the pattern compressors 30 to 33 are stopped, capturing operations can be prevented from being carried out, and invalid operation results can be prevented from being retrieved into the flip-flops in the logic circuits.

<Example of Logic Circuit 40>

Figure 18:
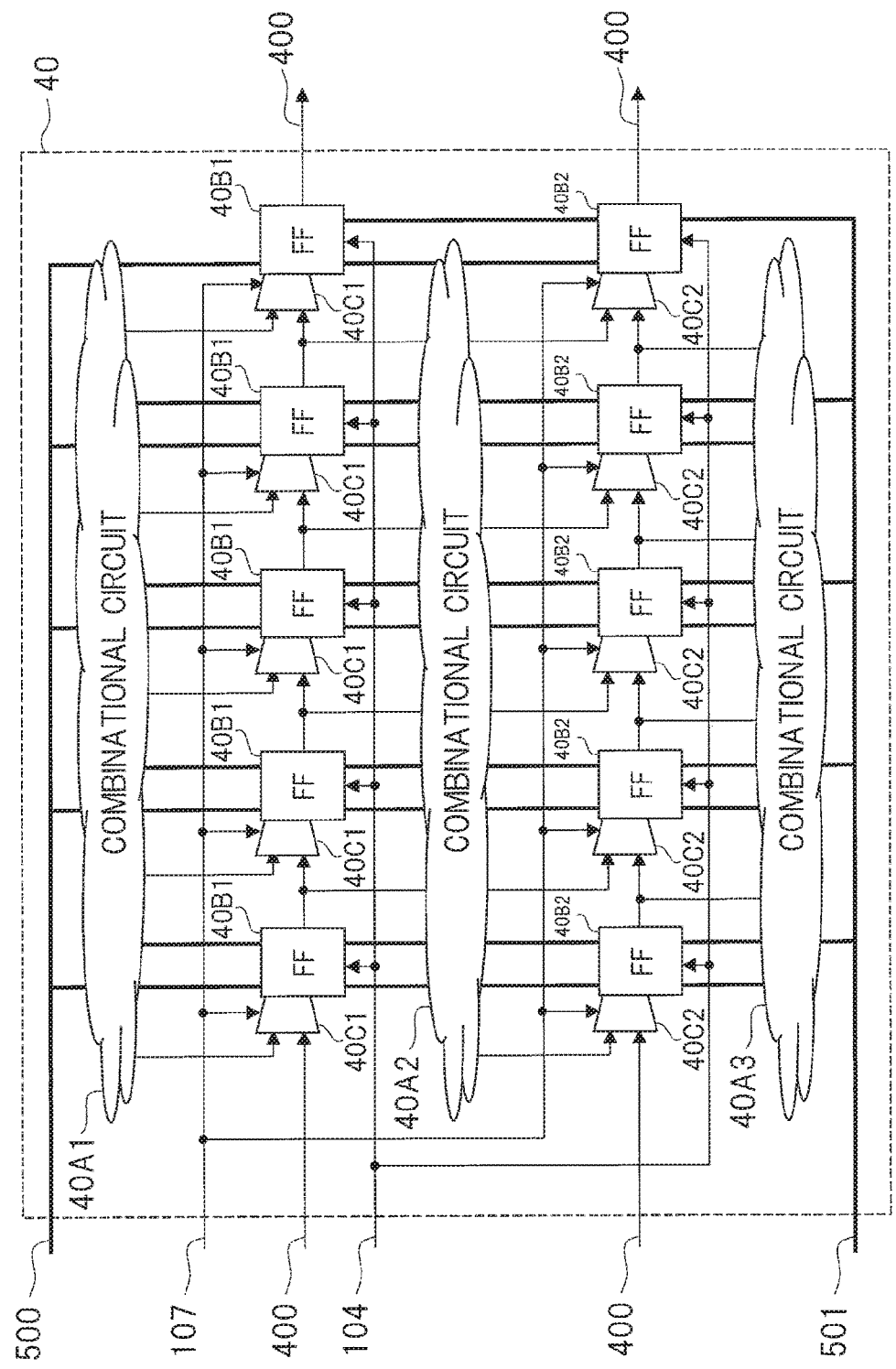
FIG. 18 is a block diagram showing a configuration of a logic circuit.

Next, among the logic circuits 40 to 43, a configuration example of the logic circuit 40 will be described. In this case, a configuration in a case of self-diagnosis operations will be described. FIG. 18 is a block diagram showing a partial configuration in the logic circuit 40.

In FIG. 18, each of reference characters 40A1 to 40A3 is a combinational circuit, reference characters 40B1 and 40B2 are flip-flops (retaining circuits), and reference characters 40C1 and 40C2 are selectors. In this diagram, in order to facilitate description, five flip-flops 40B1 and five flip-flops 40B2 are shown. Inputs of each of the flip-flops 40B1 are connected to an output of the flip-flop 40B1 in the former stage via the selector 40C1 and to an output of the combinational circuit 40A1. Since the flip-flop in the first stage, in other words, the flip-flop 40B1 shown on the leftmost side in the diagram has no former-stage flip-flop 40B1, it is connected to an output of the corresponding pattern generator 20 through the scan chain 400. Meanwhile, an output of the flip-flop 40B1 in the last stage is connected to an input of the pattern compressor 40 through the scan chain 400.

Each of the flip-flops 40B1 receives the output of the selector 40C1, retrieves, retains, and outputs the output of the selector 40C1 in synchronization with the clock signal 104. For example, in synchronization with a rise of the clock signal 104, the output of the selector 40C1 is retrieved, retained, and output. Each of the selectors 40C1 selects the output from the combinational circuit 40A1 or the output from the former stage (including the scan chain 400) in accordance with a voltage of the scan enable signal 107 and outputs. More specifically, when the voltage of the scan enable signal 107 is at the high level, the selector 40C1 outputs the output from the former stage (scan chain 400) to the flip-flop 40B1. Meanwhile, when the voltage of the scan enable signal 107 is at the low level, the selector 40C1 outputs the output of the combinational circuit 40A1 to the flip-flop 40B1. Moreover, the output of the flip-flop 40B1 is supplied to the combinational circuit 40A2 as an input.

The combinational circuits 40A1, 40A2, and 40A3 and the flip-flops 40B1 and 40B2 are each connected to the voltage wires 500 and 501, the power supply voltage for operating these circuits is supplied via the voltage wire 500, and the ground voltage is supplied via the voltage wire 501.

In the self-diagnosis operations, first, the scan enable signal 107 output from the MISR control circuit 3A is set to the high level. As a result, the selector 40C1 outputs the output from the former stage (scan chain 400) to the flip-flop 40B1. When the voltage of the clock signal 104 is cyclically changed, the test patterns supplied to the scan chain 400 are sequentially transmitted to the flip-flops 40B1. More specifically, in this diagram, the test patterns are moved from the left side toward the right side and are sequentially stored in the flip-flops 40B1. In other words, the plurality of flip-flops 40B1 constitute a shift register, and the test patterns move in the shift register in accordance with the changes of the clock signal 104. In this case, the test patterns can be also considered as shift data which moves in the shift register.

When the shift data moves in the shift register, the outputs of the flip-flops 40B1 are supplied to the combinational circuit 40A2, and accordingly, the combinational circuit 40A2 operates in accordance with the outputs of the flip-flops 40B1. More specifically, the state in the combinational circuit 40A2 is changed in accordance with the voltage (logical value) supplied thereto. According to these changes of the state, values of current flowing through the voltage wires 500 and 501 are changed.

Like the case in which the state of reset is cancelled by the reset signal 106, at the time point when the self-diagnosis operations are started, for example, each of the flip-flops 40B1 stores, for example, a logical value "0." The outputs of the flip-flops 40B1 corresponding to the logical values "0" are supplied to the combinational circuit 40A2. When the self-diagnosis operations are started, in this diagram, the test patterns are moved from the left side toward the right side, and therefore, the states of the flip-flops are changed from the left side toward the right side in accordance with the test patterns. More specifically, at the point of time when the self-diagnosis operations are started, regarding the logical values supplied to the combinational circuit 40A2, the logical value supplied to the combinational circuit part on the left side in this diagram is changed, and the logical value supplied to the combinational circuit part on the right side is not changed. As a result, in the combinational circuit 40A2, current consumption is changed in the left-side part, but change in the current consumption in the right-side part is small.

Meanwhile, when the self-diagnosis operations progress, a state in which the test patterns are stored in all of the five flip-flops 40B1 shown in this diagram is obtained. In this state, for example, the flip-flop 40B1 further retrieves the test pattern in synchronization with the clock signal 104, many of the logical values supplied to the combinational circuit 40A2 and stored in the respective five flip-flops 40B1 are changed. More specifically, both of the logical value supplied to the left-side circuit part of the combinational circuit 40A2 and the logical value supplied to the right-side circuit part are changed. Therefore, when the self-diagnosis operations progress, the current consumption consumed in the combinational circuit 40A2 is increased compared with the time point when the self-diagnosis operations are started.

When the pattern generators are stopped while the self-diagnosis operations are progressing, the increased current consumption is rapidly reduced, and therefore, particularly the voltage in the voltage wire 501 is rapidly increased. Therefore, it is particularly desired to change the stop timing at which the pattern generators are stopped.

When the scan enable signal 107 is changed to the low level, the selectors 40C1 supplies the outputs from the combinational circuit 40A1 to the flip-flops 40B1. When the clock signal 104 is changed, the flip-flops 40B1 retrieve and store the outputs from the combinational circuit 40A1. Then, the scan enable signal 107 is set to the high level and the clock signal 104 is changed, and as a result, the outputs of the combinational circuits 40A1 stored in the flip-flops 40B1 are moved from the left side to the right side in the diagram and are sequentially supplied to the pattern compressor 40 through the scan chain 400. In this embodiment, when the pattern compressor is stopped, the scan enable signal 107 becomes the high level. Therefore, the outputs of the combinational circuit 40A1 can be prevented from being retrieved by the flip-flops 40B1.

Since the flip-flops 40B2, the selectors 40C2, and the combinational circuit 40A3 are also the same as the flip-flops 40B1, the selectors 40C1, and the combinational circuits 40A1 and 40A2, description thereof is omitted.

<Self-Diagnosis Operations>

Figure 2:
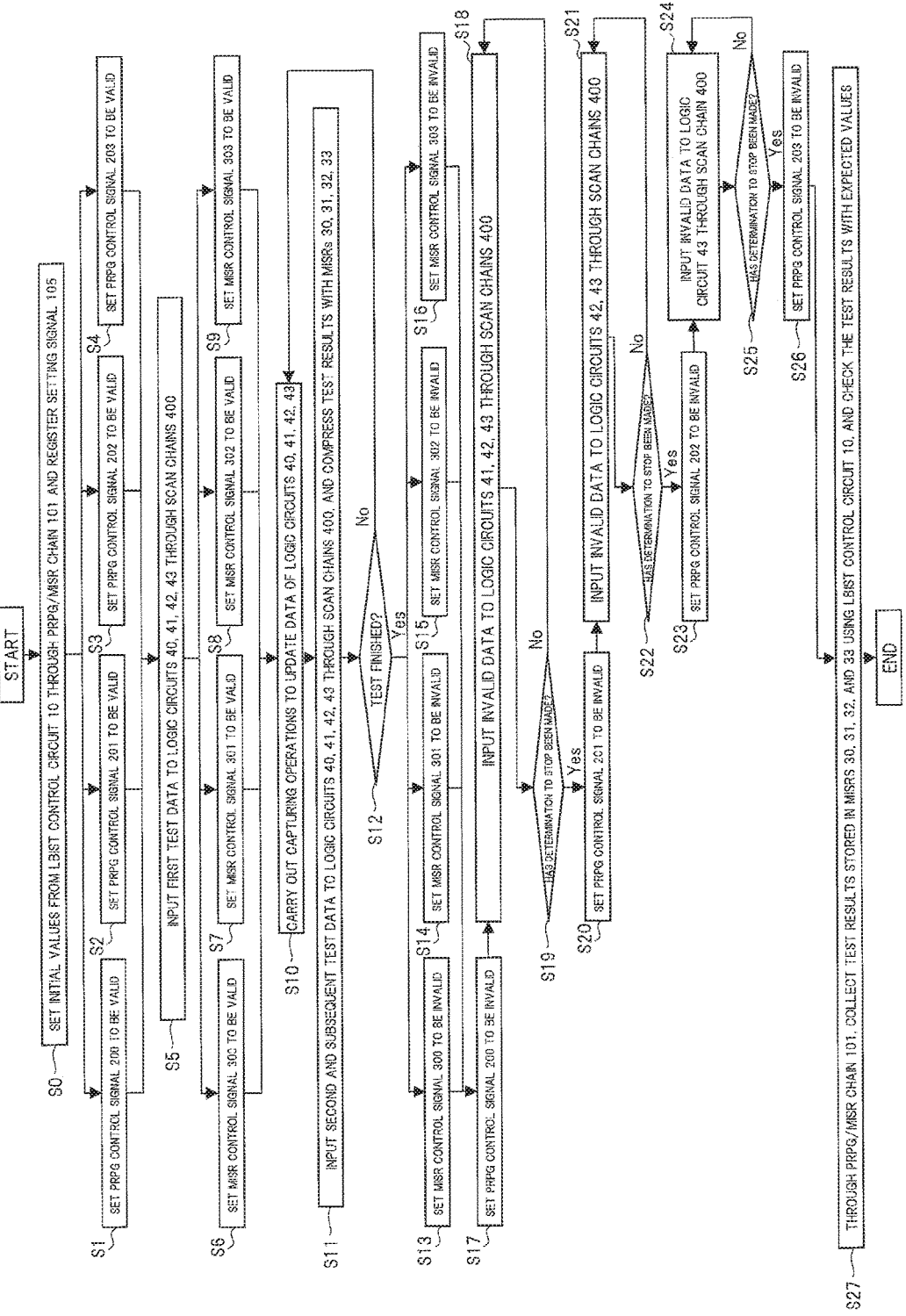
FIG. 2 is a flow chart showing operations of the semiconductor device according to the second embodiment.

FIG. 2 is a flowchart showing operations of a self-diagnosis of the semiconductor device 1A according to the second embodiment.

In this chart, operation events are connected by respective arrows, and occurrences of events are shown by time series in accordance with the directions of the respective arrows. Branching arrows show parallel processes. Note that rhombic events each show branching and each downward arrow indicates a next process to be moved when an answer of the contents of the event is yes.

When the self-diagnosis operations of the semiconductor device 1A are started, in step S0, the LBIST control circuit 10 sets an initial value to each of the pattern generators 20, 21, 22, and 23 and the pattern compressors 30, 31, 32, and 33 through the PRPG/MISR chain 101. Moreover, at this point, an initial value corresponding to time is set to each of the registers 2A21 in the respective PRPG stop circuits 2A10 to 2A12, by the register setting signal 105-I. When the setting of these initial values is completed, furthermore, in step S0, in order to carry out a first scan shift, the LBIST control circuit 10 changes the reset signal 106 from the high level to the low level to cancel reset. Moreover, at this point, the LBIST control circuit 10 sets the PRPG control signal 102 to the high level (active state).

Although the PRPG control signal 102 is input to the PRPG control circuit 2A (FIG. 6), the flip-flops 2A23 in the respective PRPG stop circuits 2A10 to 2A12 are in an initial state in which reset is cancelled, and accordingly, the outputs of the flip-flops 2A23 are at the low level. Therefore, the high level (valid) of the PRPG control signal 102 passes through the 2-input AND circuit 2A27 and is input to the pattern generators 20 to 23 as the PRPG control signals 200 to 203 (step S1 to S4).

Since the high-level PRPG control signals 200 to 203 are supplied, the pattern generators 20 to 23 each operate and generate test patterns. Each of the generated test patterns is input to the corresponding one of logic circuits 40 to 43 as first test data (test patterns) through the scan chains 400 (step S5).

When the input of the test data is completed, the LBIST control circuit 10 sets the MISR control signal 103 to the high level (active state). The MISR control signal 103 is input to the MISR control circuit 3A (FIG. 7). At this point, the flip-flop 2A23 of the PRPG stop circuit 2A10 is at the low level, which is the initial state. Therefore, the MISR control signal 103 passes through the 2-input AND circuit 3A10 in the MISR control circuit 3A and is input to the pattern compressors 30, 31, 32, and 33 as the MISR control signals 300 to 303 (steps S6 to S9). Note that this diagram describes as follows: set the MISR control signals 300 to 303 to be valid.

Then, in step S10, capturing operations of scan tests are carried out to update the data of the logic circuits 40 to 43. A second and subsequent test data generated in each of the pattern generators 20 to 23 are input to each of the logic circuits 40 to 43 through the scan chains 400 (step S11).

Then, in step S12, whether the self-diagnosis operations have been completed or not is determined. The determination whether the self-diagnosis operations have been completed or not is made by the comparator 2A22 checking whether the values of the counter 2A20 and the register 2A21 in the PRPG stop circuit 2A10 are equal to each other or not. When they are not equal, it is considered that the self-diagnosis operations have not been completed, and accordingly, the process returns to step S10. Then, steps S10 to S12 are repeated until the self-diagnosis operations are determined to be completed.

When the self-diagnosis operations have been completed, the flip-flop 2A23 in the PRPG stop circuit 2A10 described in FIG. 6 outputs the high level. As a result, the 2-input AND circuit 3A10 in the MISR control circuit 3A fixes each of the MISR control signals 300 to 303 to the low level. More specifically, the flip-flops 2A23 are fixed to the high level, and the outputs of the 2-input AND circuit 3A10 are fixed to the low level by the high-level MISR stop signal 108 (step S13 to S16). Note that FIG. 2 describes as follows: set the MISR control signals 300 to 303 to be invalid. The MISR control signals 300 to 303 are set to the low level, and accordingly, the functions of the pattern compressors 40 to 43 are stopped.

At this point, since the high-level MISR stop signal 108 is supplied also to the 2-input OR circuit 3A11 in the MISR control circuit 3A, the scan enable signal 107 is fixed to the high level. As a result, the logic circuits 40 to 43 are prevented from retrieving data from the paths other than the scan chains 400.

Since the output of the flip-flop 2A23 in the PRPG stop circuit 2A10 becomes the high level, the PRPG control signal 200 output from the PRPG stop circuit 2A10 is fixed to the low level. More specifically, since the output of the flip-flop 2A23 is fixed to the high level, the output of the 2-input AND circuit 2A27 is fixed to the low level (step S17). The PRPG control signal 200 becomes the low level, and accordingly, the function of the pattern generator 20 to which the PRPG control signal 200 is supplied is stopped. Note that FIG. 2 describes as follows: set the PRPG control signal 200 to be invalid.

As described in FIG. 6, in the register 2A21 in the PRPG stop circuit 2A11, the value (initial value) corresponding to the time longer than that of the register 2A21 in the PRPG stop circuit 2A10 is set. Moreover, in the register 2A21 in the PRPG stop circuit 2A12, the value (initial value) corresponding to the time longer than that of the register 2A21 in the PRPG stop circuit 2A11 is set.

Therefore, at the point of time when the PRPG control signal 200 output from the PRPG stop circuit 2A10 becomes the low level, the flip-flops 2A23 in the respective PRPG stop circuits 2A11 and 2A12 are still outputting the low level. This is because, in each of the PRPG stop circuits 2A11 and 2A12, the count value according to the counter 2A20 and the initial value stored in the register 2A21 are not equal to each other.

Since the flip-flops 2A23 in the respective PRPG stop circuits 2A11 and 2A12 are still outputting the low level, the PRPG control signals 201 to 203 are at the high level, and the pattern generators 21 to 23 are operating and continue generating the test patterns.

The respective test patterns generated by the pattern generators 21 to 23 are input to the logic circuits 41 to 43 through the scan chains 400 (step S18). In this case, since the functions of the pattern compressors 30 to 33 have already been stopped in steps S13 to S16, the results of the logic circuits 41 to 43 based on the respective test patterns generated by the pattern generators 21 to 23 are not used in the self-diagnoses. Therefore, at this point, the respective test patterns generated by the pattern generators 21 to 23 can be considered as invalid data. Moreover, since the pattern generator 20 is in a stopped state at this point, a fixed value is always input to the logic circuit 40.

Then, in step S19, whether the test has been finished or not is determined. Based on the determination herein, whether the pattern generator 21 is stopped or not is determined (determination to stop). More specifically, the comparator 2A22 in the PRPG stop circuit 2A11 compares the count value of the counter 2A20 in the PRPG stop circuit 2A11 with the initial value stored in the register 2A21 in the PRPG stop circuit 2A11. As a result of the comparison, when they are not equal, steps S18 and S19 are repeated until they become equal. When they are equal as a result of the comparison, in step S20, the flip-flop 2A23 in the PRPG stop circuit 2A11 outputs the high level. Accordingly, the PRPG stop circuit 2A11 outputs the low-level PRPG control signal 201. As a result, the pattern generator 21 which receives the PRPG control signal 201 stops. Note that FIG. 9 describes as follows: set the PRPG control signal 201 to be invalid in step S20.

Since the initial value set in the register 2A21 in the PRPG stop circuit 2A12 is the value corresponding to the longest time, the flip-flop 2A23 in the PRPG stop circuit 2A12 is still outputting the low level. Therefore, the pattern generator 22 and the pattern generator 23 are operating and continuously generating the test patterns. Therefore, the respective test patterns generated by the pattern generators 22 and 23 through the scan chains 400 are continued to be supplied to the logic circuits 42 and 43 as invalid data, and the logic circuits 42 and 43 are operating in accordance with the invalid data (step S21).

Then, in step S22, whether the test has been finished or not is determined again. Based on the determination herein, whether the pattern generator 22 is stopped or not is determined (determination to stop). More specifically, the comparator 2A22 in the PRPG stop circuit 2A12 compares the count value of the counter 2A20 in the PRPG stop circuit 2A12 with the initial value stored in the register 2A21 in the PRPG stop circuit 2A12. As a result of the comparison, when they are not equal, steps S21 and S22 are repeated until they become equal. When they are equal as a result of the comparison, in step S23, the flip-flop 2A23 in the PRPG stop circuit 2A12 outputs the high level. As a result, the PRPG stop circuit 2A12 outputs the low-level PRPG control signal 202. As a result, the pattern generator 22 which receives the PRPG control signal 202 stops. Note that FIG. 9 describes as follows: set the PRPG control signal 202 to be invalid in step S23.

In the second embodiment, as shown in FIG. 6, the PRPG control signal 102 is supplied to the pattern generator 23 as the PRPG control signal 203. Therefore, the pattern generator 23 is operating and continuously generating the test patterns. Therefore, the test patterns generated by the pattern generator 23 through the scan chains 400 are continued to be supplied to the logic circuit 43 as invalid data, and the logic circuit 43 is operating in accordance with the invalid data (step S24).

Step S25 is also a step to determine whether the test is stopped or not. The determination (determination to stop) carried out in this step S25 is made until the PRPG control signal 102 from the LBIST control circuit 10 becomes a stopped state. More specifically, until the PRPG control signal 102 from the LBIST control circuit 10 becomes the low level, steps S24 and S25 are repeated. The LBIST control circuit 10 supplies the PRPG control signal 102 of the low level indicating a stopped state to the PRPG control circuit 2A, and accordingly, in step S26, the PRPG control circuit 2A outputs the low-level PRPG control signal 203, so that the pattern generator 23 stops. Note that FIG. 9 describes as follows: set the PRPG control signal 203 to be invalid in step S26.

Setting the PRPG control signal 102 to the stopped state means to complete, at this point, the pattern generation controlled by the LBIST control circuit 10. Therefore, this means that the operations until the stopped state is set by the PRPG control signal 102 have been carried out entirely independently from the control by the LBIST control circuit 10.

In the end, in step S27, the respective test results stored in the pattern compressors 30, 31, 32, and 33 are collected by the LBIST control circuit 10 through the PRPG/MISR chain 101 and are checked with expected values, and the process ends.

In this manner, in the second embodiment, the PRPG stop circuits 2A10 to 2A12 provided in the PRPG control circuit 2A, respectively, stop the pattern generators 20 to 22 one by one independently from the control by the LBIST control circuit 10. In this case, stop means to fix the signals, which are supplied to the logic circuits 40 to 42, without changing in terms of time.

<Operation Waveforms of Semiconductor Device>

Figure 3:
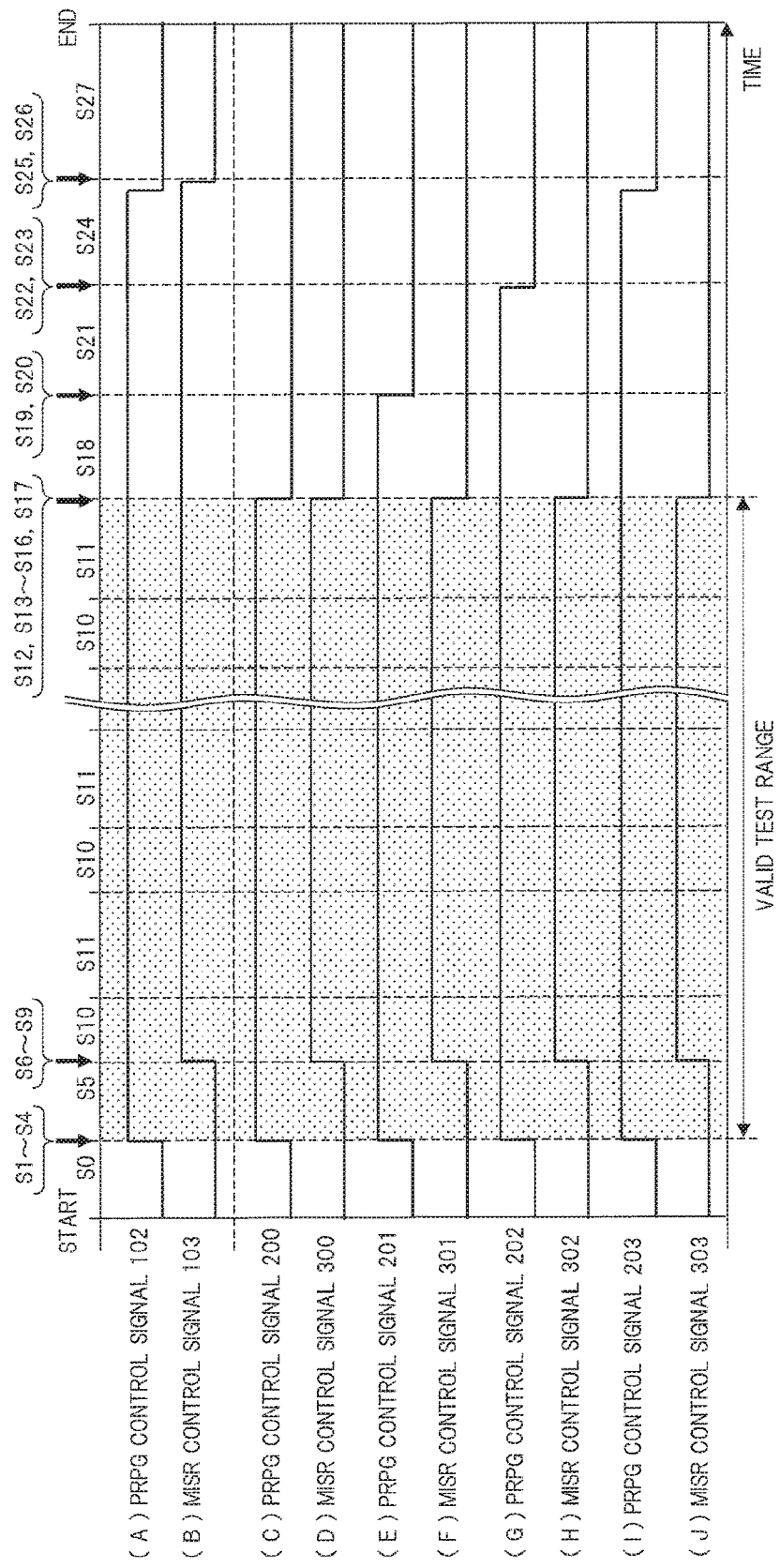
FIGS. 3(A) to 3(J) are waveform diagrams showing waveforms of the semiconductor device according to the second embodiment.

FIGS. 3(A) to 3(J) are waveform diagrams showing waveforms of the semiconductor device in a case in which the operations described by the flow chart of FIG. 2 have been carried out. In FIG. 3, a horizontal axis shows elapse of time, and a vertical axis shows voltages. FIGS. 3(A) and 3(B), respectively, show waveforms of the PRPG control signal 102 and the MISR control signal 103 which are output by the LBIST control circuit 10. In addition, FIGS. 3(C), 3(E), 3(G), and 3(I), respectively, show waveforms of the PRPG control signals 200, 201, 202, and 203 which are output by the PRPG control circuit 2A, and FIGS. 3(D), 3(F), 3(H), and 3(J), respectively, show waveforms of the MISR control signals 300, 301, 302, and 303 which are output by the MISR control circuit 3A.

Reference characters S0 to S27 attached along the horizontal axis in FIG. 3 correspond to steps S0 to S27 described in FIG. 2, respectively. In FIG. 3, the period from S5 to S11 is a valid test range in the self-diagnosis operations. In this period, the logic circuits 40 to 43 repeatedly execute random operations in accordance with the test patterns generated by the pattern generators 20 to 23 and consume electric power. The results of the operations carried out by the logic circuits 40 to 43 in this period are compressed by the pattern compressors 30 to 33, are supplied to the LBIST control circuit 10, and are checked with expected values in the LBIST control circuit 10.

The logic circuit 40 operates in the period from S5 to S11 and stops since the corresponding pattern generator 20 stops in S11 as shown in FIG. 3(C).

Meanwhile, regarding the logic circuit 41, as shown in FIG. 3(E), the corresponding PRPG control signal 201 is at the high level also in the period of S18. Therefore, the pattern generator 21 corresponding to the logic circuit 41 operates also in the period of S18, and the logic circuit 41 repeatedly executes random operations in accordance with the test patterns generated by the pattern generator 21 and consumes electric power.

Similarly, regarding the logic circuit 42, as shown in FIG. 3(G), the corresponding PRPG control signal 202 is at the high level also in the period of S18 to S21. Therefore, the corresponding pattern generator 22 operates also in the period of S18 to S21, and the logic circuit 42 repeatedly executes random operations in accordance with the test patterns generated by the pattern generator 22 and consumes electric power. Furthermore, regarding the logic circuit 43, as shown in FIG. 3(I), the corresponding PRPG control signal 203 is at the high level also in the period of S18 to S24. Therefore, the corresponding pattern generator 23 operates also in the period of S18 to S24, and the logic circuit 43 repeatedly executes random operations also in the period of S18 to S24 in accordance with the test patterns generated by the pattern generator 22 and consumes electric power.

By sequentially reducing the number of the operating logic circuits 40 to 43 in this manner, the change rate of the current flowing in the semiconductor device 1A can be reduced.

Meanwhile, as shown in FIG. 3, the MISR control circuit 3A changes the MISR control signals 300 to 303 at the same time from the low level to the high level and changes them at the same time from the high level to the low level. Accordingly, respective start timings at which the pattern compressors 30 to 33 start the processes of compression (compressing processes) are controlled to be mutually the same, and respective stop timings at which the compressing processes are stopped are controlled so as to be mutually the same.

<Current of Semiconductor Device>

Figure 4:
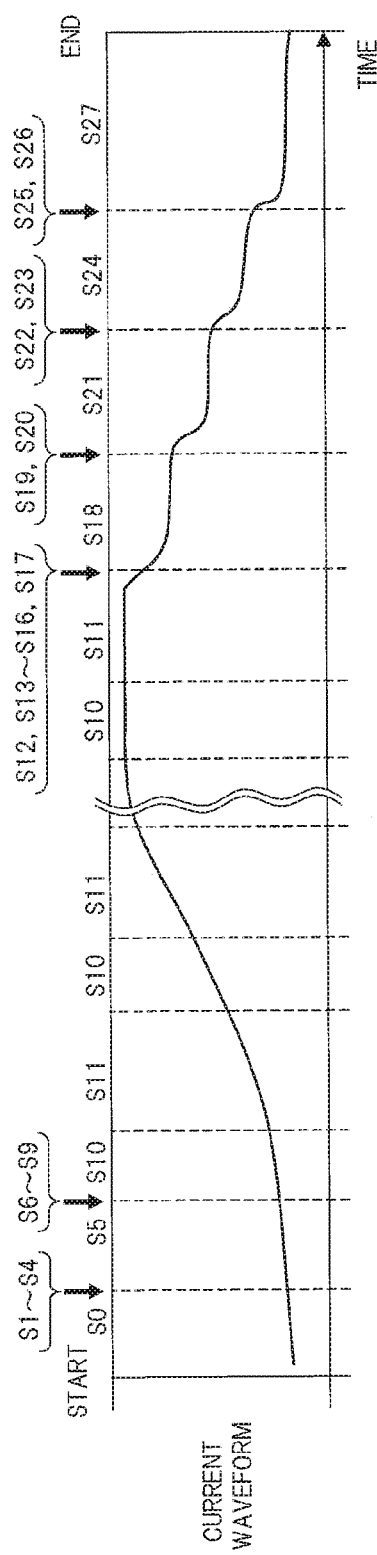
FIG. 4 is a waveform diagram schematically showing a current waveform of the semiconductor device according to the second embodiment.

FIG. 4 is a waveform diagram schematically showing the current waveform in the self-diagnosis operations of the semiconductor device 1A according to the second embodiment. In this diagram, a horizontal axis shows elapse of time, and a vertical axis shows a magnitude of current consumption. When the current waveform goes more upward in the diagram, the larger the current consumption becomes. Reference characters S0 to S27 attached along the horizontal axis correspond to steps S0 to S27 described in the flow chart of FIG. 2, respectively.

The current consumption gradually increases from step S5 in which supply of the test patterns is started, and the current consumption reaches a peak at the time at which the repeated operations of step S10 to S11 are occurring. Then, the PRPG control signal 200 becomes the low level because of the event of S17, and the pattern generator 20 becomes a stopped state; around this point, the current corresponding to the electric power which has been consumed by the logic circuit 40 is reduced. This is because a change in a logical value of the logic circuit 40 is no longer generated as a result of stopping of the operations of the pattern generator 20 and the pattern compressor 30. Then, with predetermined time intervals, the logic circuits 41, 42, and 43 are stopped by the same procedure as that of the logic circuit 40. As a result, the current consumption is reduced like steps in the order of S18, S21, S24, and S27. The predetermined time intervals herein correspond to the differences between the values stored in the respective registers 2A21 in the PRPG stop circuits 2A10 to 2A12.

Figure 5:
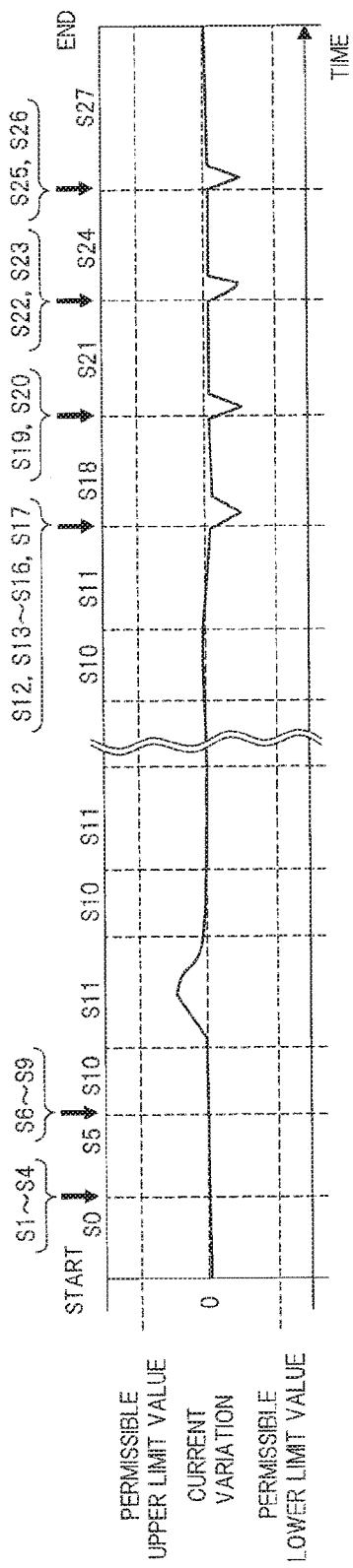
FIG. 5 is a waveform diagram showing current variation of the semiconductor device according to the second embodiment.

FIG. 5 is a waveform diagram showing current variation per unit time. In this diagram, a horizontal axis shows elapse of time, and a vertical axis shows a magnitude of current variation. A central line represents "0" at which there is no variation in the current. The current variation in the diagram is extended upward when the current increases, and the current variation in the diagram is extended downward when the current decreases. Reference characters S0 to S27 attached along the horizontal axis correspond to steps S0 to S27 described in the flow chart of FIG. 2, respectively.

When FIG. 5 is compared with FIG. 28, it can be understood that, in the semiconductor device 1A according to the second embodiment, the change rate (di/dt) of the current value per unit time is suppressed to be low and is within a permissible upper limit value and the permissible lower limit value. Also in this case, the permissible value is, for example, 80 mA/20 us.

Moreover, according to the second embodiment, increase in area of the semiconductor device can be suppressed. For example, in the semiconductor device 1E described in the first embodiment, the plurality of LBIST control circuits 10 to 13 corresponding to the pattern generators 20 to 23 and the pattern compressors 30 to 33, respectively, are provided. Moreover, in the semiconductor device 1E, the cut-off circuits 50 to 53 which fix the voltages of the respective boundary signals transmitted between the logic circuits 40 to 43 in the self-diagnosis operations are provided. The area occupied by the cut-off circuits 50 to 53 is increased in proportion to the number of the boundary signals. In the second embodiment, the number of the LBIST control circuits can be reduced, and the cut-off circuits are not required to be provided, so that increase in area of the semiconductor device can be suppressed, and increase in price of the semiconductor device can be also suppressed.

Furthermore, in the semiconductor device 1E described in the first embodiment, in the self-diagnosis operations, since the voltages of the boundary signals are fixed by the cut-off circuits, diagnosis including the boundary signals cannot be carried out. In contrast, in the second embodiment, since the cut-off circuits are not required, deterioration in quality of self-diagnoses can be reduced.

Third Embodiment

Figure 8:
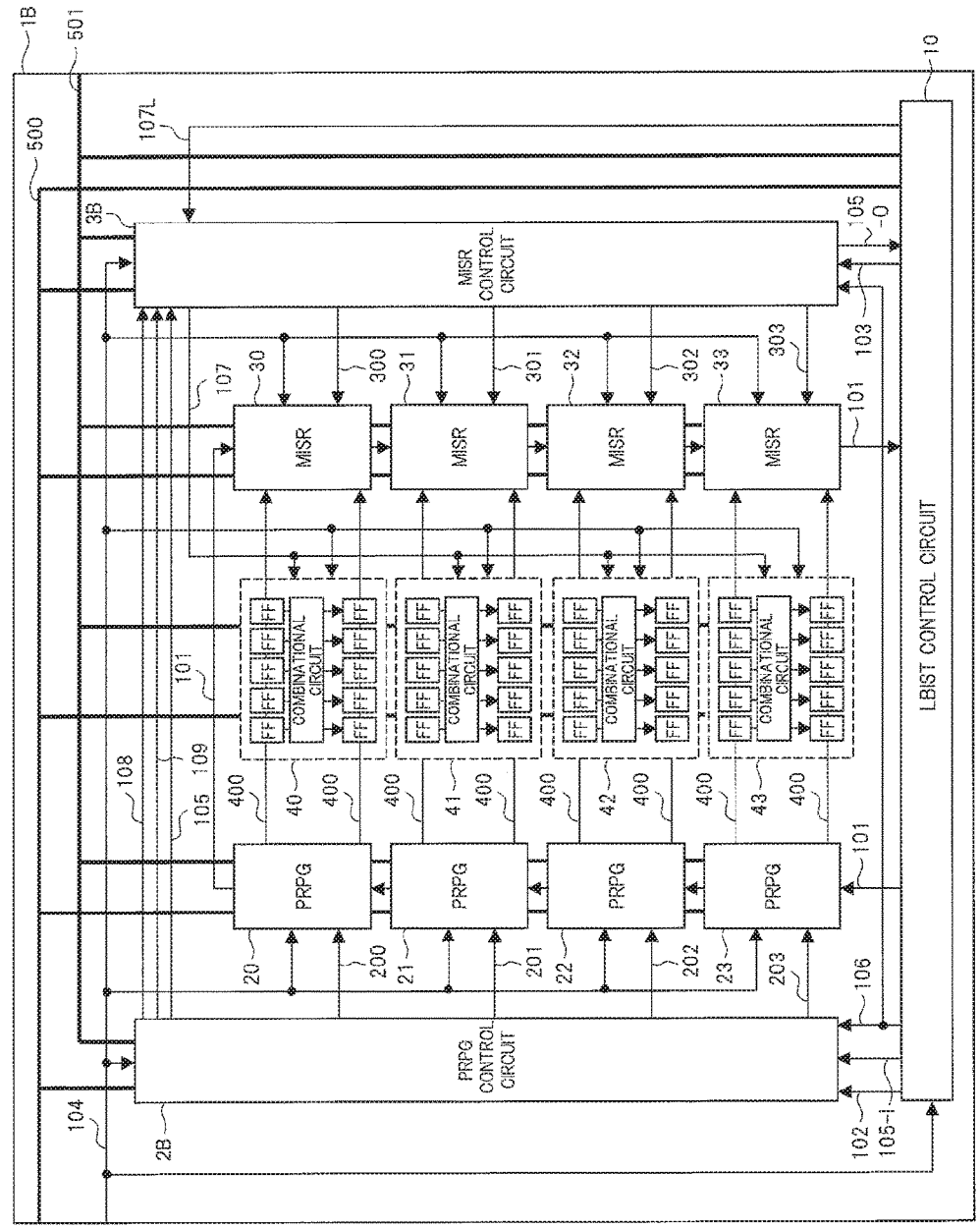
FIG. 8 is a block diagram showing a configuration of a semiconductor device according to a third embodiment.

FIG. 8 is a block diagram showing a configuration of a semiconductor device according to a third embodiment. Since a semiconductor device 1B according to the third embodiment is similar to the semiconductor device 1A shown in FIG. 1, different points will be mainly described herein. First, the points different between the semiconductor device 1A shown in FIG. 1 and the semiconductor device 1B according to the third embodiment are the configurations of the PRPG control circuit and the MISR control circuit. In the third embodiment, a PRPG control circuit 2B is used instead of the PRPG control circuit 2A, and an MISR control circuit 3B is used instead of the MISR control circuit 3A. Next, the PRPG control circuit 2B and the MISR control circuit 3B will be described.

<Configuration of PRPG Control Circuit 2B>

Figure 13:
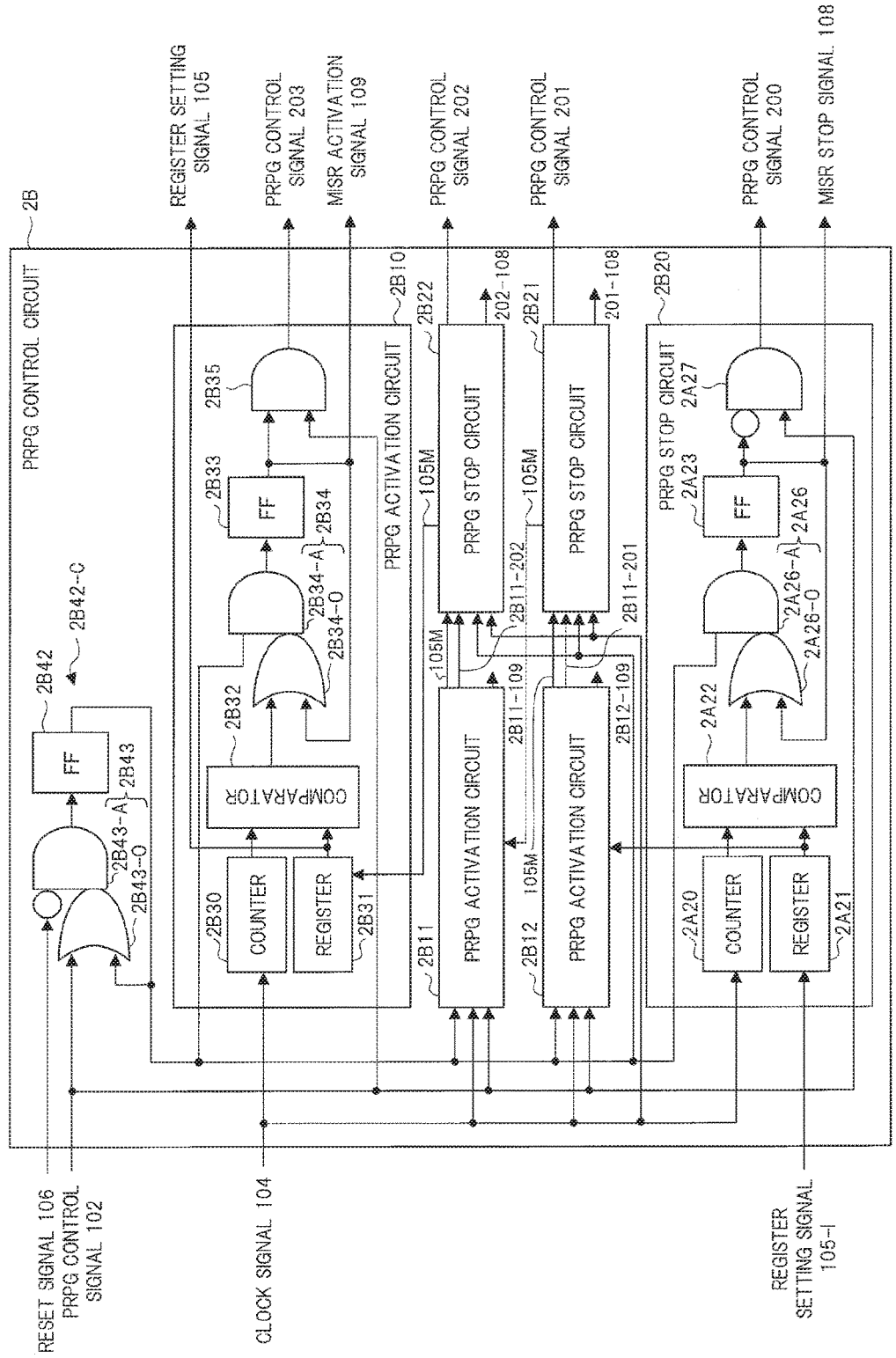
FIG. 13 is a block diagram showing a configuration of a PRPG control circuit according to the third embodiment.

FIG. 13 is a block diagram showing a configuration of the PRPG control circuit 2B according to the third embodiment. The PRPG control circuit 2B includes a control circuit 2B42-C, PRPG activation circuits 2B10 to 2B12, and PRPG stop circuits 2B20 to 2B22.

Similar to the control circuit 2A24-C described in FIG. 6, the control circuit 2B42-C has a 2-input AND circuit 2B43-A, a 2-input OR circuit 2B43-O, and a flip-flop 2B42. In this case, the 2-input AND circuit 2B43-A corresponds to the 2-input AND circuit 2A25-A of FIG. 6, the 2-input OR circuit 2B43-O corresponds to the 2-input OR circuit 2A25-A of FIG. 6, and the flip-flop 2B42 corresponds to the flip-flop 2A24 of FIG. 6. Note that, in FIG. 13, reference character 2B43 represents a combinational circuit formed by the 2-input AND circuit 2B43-A and the 2-input OR circuit 2B43-O and corresponds to the combinational circuit 2A25 of FIG. 6.

Similarly to FIG. 6, the reset signal 106 is supplied to one input of the 2-input AND circuit 2B43-A via an inverter circuit shown by a circle mark, the PRPG control signal 102 is supplied to one input of the 2-input OR circuit 2B43-O, and an output of the 2-input OR circuit 2B43-O is supplied to the other input of the 2-input AND circuit 2B43-A. In addition, an output of the 2-input AND circuit 2B43-A is supplied to an input of the flip-flop 2B42, and an output of the flip-flop 2B42 is supplied to the other input of the 2-input OR circuit 2B43-O. The output of the flip-flop 2B42 serves as an output of the control circuit 2B42-C.

The operation of the control circuit 2B42-C is the same as that of the control circuit 2A24-C described in FIG. 6, and when the reset signal 106 is at the high level indicating a reset state, the flip-flop 2B42 outputs a low-level control signal. Meanwhile, in the period in which the reset signal 106 is at the low level which means reset cancellation, the PRPG control signal 102 from the LBIST control circuit 10 becomes the high level, and accordingly, the flip-flop 2B42 outputs and maintains a high-level control signal. More specifically, when the PRPG control signal 102 from the LBIST control circuit 10 becomes the high level indicating an active state, the flip-flop 2B42 outputs the high level and maintains the high level until the reset signal 106 becomes the high level. Accordingly, similarly to the flip-flop 2A24 shown in FIG. 6, the flip-flop 2B42 controls the start and the end of the control by the PRPG control circuit 2B.

The numbers of the PRPG activation circuits and the PRPG stop circuits are respectively increased or reduced depending on the number of the pattern generators mounted in the semiconductor device 1B, and they are required at a maximum as many as the number of the pattern generators, but this number is not limited as an upper limit.

In the third embodiment, as shown in FIG. 8, the semiconductor device 1B has four pattern generators 20 to 23, but the PRPG control circuit 2B includes three PRPG activation circuits 2B10 to 2B12 and three PRPG stop circuits 2B20 to 2B22. In this case, the PRPG activation circuit 2B10 corresponds to the pattern generator 23, and the PRPG stop circuit 2B20 corresponds to the pattern generator 20. Also, the PRPG activation circuit 2B11 and the PRPG stop circuit 2B22 correspond to the pattern generator 22, and the PRPG activation circuit 2B12 and the PRPG stop circuit 2B21 correspond to the pattern generator 21. In this manner, it may be configured such that only the PRPG activation circuit corresponds to the pattern generator, such that only the PRPG stop circuit corresponds to the pattern generator, or furthermore, such that the PRPG activation circuit and the PRPG stop circuit correspond to the pattern generator in combination.

Furthermore, it may be configured such that a single PRPG activation circuit or a single PRPG stop circuit corresponds to a plurality of pattern generators. Alternatively, it may be configured such that a combination of a single PRPG activation circuit and a single PRPG stop circuit correspond to a plurality of pattern generators.

Since the PRPG activation circuits 2B10 to 2B12 have mutually the same configurations, FIG. 13 representatively shows the configuration of the PRPG activation circuit 2B10. In addition, since the PRPG stop circuits 2B20 to 2B22 also have mutually the same configurations, FIG. 13 representatively shows the configuration of the PRPG stop circuit 2B20.

The configuration of the PRPG stop circuit 2B20 has the same configuration as the PRPG stop circuit 2A10 described in FIG. 6. Therefore, the configurations and operations of the PRPG stop circuits 2B20 to 2B22 will be omitted.

Next, regarding the PRPG activation circuits, the PRPG activation circuit 2B10 whose configuration is shown as a representative will be described.

The PRPG activation circuit 2B10 has a counter 2B30, a register 2B31, a comparator 2B32, a flip-flop 2B33, a combinational circuit 2B34, and a 2-input AND circuit 2B35. In this case, the combinational circuit 2B34 has a 2-input AND circuit 2B34-A and a 2-input OR circuit 2B34-O.

A value for time is set as an initial value to the register 2B31, and the counter 2B30 outputs a count value by counting the clock signals 104. The value (initial value) set in the register 2B31 and the count value of the counter 2B30 are compared with each other in the comparator 2B32. When they are equal to each other as a result of this comparison, the comparator 2B32 outputs the high level. When they are not equal, the comparator 2B32 outputs the low level. An output of the comparator 2B32 is supplied to one input of the 2-input OR circuit 2B34-O. An output of the 2-input OR circuit 2B34-O is supplied to the other input of the 2-input AND circuit 2B34-A having one input to which an output from the above-described control circuit 2B42-C is supplied. An output of the 2-input AND circuit 2B34-A is supplied to an input of the flip-flop 2B33, and an output of the flip-flop 2B33 is supplied to one input of the 2-input AND circuit 2B35.

The output of the flip-flop is supplied to the other input of the 2-input OR circuit 2B34-O and is output as the MISR activation signal 109. In addition, the PRPG control signal 102 is supplied to the other input of the 2-input AND circuit 2B35, and an output of the 2-input AND circuit 2B35 is output as the PRPG control signal 203.

When the reset signal 106 is changed to the low level and the LBIST control circuit 10 sets the PRPG control signal 102 to the high level which indicates activation, similarly to the description in FIG. 6, an output of the control circuit 2B42-C becomes the high level. The counter 2B30 counts up or down in synchronization with the input clock signal 104, thereby outputting the count value. In the register 2B31, an arbitrary value for time is stored as an initial value.

When the initial value stored in the register 2B31 and the count value of the counter 2B30 are equal to each other, the comparator 2B32 outputs the high level. Since the output of the flip-flop 2B42, which is the output of the control circuit 2B42-C, is at the high level, the high level of the comparator 2B32 is transmitted to the input of the flip-flop 2B33 through the 2-input OR circuit 2B34-O and the 2-input AND circuit 2B34-A. As a result, the flip-flop 2B33 retrieves and stores a logical value "1" corresponding to the high level and outputs the high level. At this point, since the PRPG control signal 102 is at the high level, which indicates activation, the 2-input AND circuit 2B35 outputs the high-level PRPG control signal 203.

The PRPG control signal 203 becomes the high level, and accordingly, the high-level PRPG control signal 203 is supplied to the pattern generator 23 corresponding to the PRPG activation circuit 2B10, and the pattern generator 23 is activated, starts operating, and generates a test pattern. The active state of the pattern generator 23 continues until the reset signal 106 is set to the high level to set the output of the flip-flop 2B42 to the low level.

Meanwhile, when the count value of the counter 2B30 has not reached the initial value stored in the register 2B31, the comparator 2B32 outputs the low level. The low level of the comparator 2B32 is transmitted to the input of the flip-flop 2B33, and the flip-flop 2B33 continuously outputs the low level. As a result, the PRPG control signal 203 becomes the low level, and the corresponding pattern generator 23 is not activated.

More specifically, the PRPG control signal 102 is set to the high level, and accordingly, the time (activation timing) from activation to activation of the corresponding pattern generator 23 can be determined by the value stored in the register 2B31. Since the activation timing can be determined, the supply start timing to start the supply of the test patterns from the pattern generator 23 to the logic circuit 43 can be determined.

In addition, when the PRPG control signal 203 becomes the high level, the MISR activation signal 109 also becomes the high level. The MISR activation signal 109 is supplied to the MISR control circuit 3B. Although description will be given by use of FIG. 14, the MISR activation signal 109 becomes the high level, and accordingly, the pattern compressors 30 to 33 can be activated.

Also in the PRPG activation circuits 2B11 and 2B12, similarly to the PRPG activation circuit 2B10, values for time are stored as initial values in the respective registers 2B31. The values for the time stored in the respective registers 2B31 of the PRPG activation circuits 2B10 to 2B12 are made different from one another, so that the supply start timings of the test patterns can be made different from one another among the logic circuits 41 to 43.

In this embodiment, regarding the pattern compressors 30 to 33, the MISR activation signal from the PRPG activation circuit which activates the pattern generator last among the pattern generators 20 to 23 is supplied to the MISR control circuit 3B. In the configuration shown in FIG. 13, the value stored as the initial value in the register 2B31 in the PRPG activation circuit 2B10 serves as the value corresponding to the longest time. More specifically, the value stored as the initial value in the register 2B31 in the PRPG activation circuit 2B11 is the value corresponding to the time shorter than the value stored in the register 2B31 in the PRPG activation circuit 2B10. Also, the value stored as the initial value in the register 2B31 in the PRPG activation circuit 2B12 is the value corresponding to the time shorter than the value stored in the register 2B31 in the PRPG activation circuit 2B11. Therefore, MISR activation signals 2B11-109 and 2B12-109 output from the PRPG activation circuits 2B11 and 2B12 are not supplied to the MISR control circuit 3B.

However, for example, computation of logical sum may be carried out among the MISR activation signals 109, 2B11-109, and 2B12-109, and the computation result thereof may be used as the MISR activation signal 109.

In the third embodiment, the supply start timings of the test patterns to the logic circuits are determined by the PRPG activation circuits corresponding to these logic circuits. Moreover, the supply stop timings of the test patterns to the logic circuits are determined by the PRPG stop circuits corresponding to these logic circuits. Furthermore, the PRPG activation circuit and the PRPG stop circuit correspond to the logic circuit in combination, and accordingly, each of the start timing and the stop timing of supply of the test patterns supplied to the logic circuit can be determined.

Next, an example in which the PRPG activation circuit and the PRPG stop circuit are combined will be described. In FIG. 13, the PRPG activation circuit 2B11 and the PRPG stop circuit 2B22 are combined and correspond to the pattern generator 22. Moreover, the PRPG activation circuit 2B12 and the PRPG stop circuit 2B21 are combined and correspond to the pattern generator 21.

A control signal 2B12-201 which determines the activation timing of the corresponding pattern generator 21 is supplied from the PRPG activation circuit 2B12 to the PRPG stop circuit 2B21. In this case, the control signal 2B21-201 is a control signal which is output from the 2-input AND circuit 2B35 in the PRPG activation circuit 2B12. In the PRPG stop circuit 2B21, instead of the PRPG control signal 102, the control signal 2B12-201 from the PRPG stop circuit 2B21 is supplied to the other input of the 2-input AND circuit 2A27 which constitutes the PRPG stop circuit 2B21. Except that the control signal 2B12-201 is supplied instead of the PRPG control signal 102, similarly to the PRPG stop circuit 2B20, the clock signal 104 is supplied to the counter 2A20 in the PRPG stop circuit 2B21, and the output from the flip-flop 2B42 is supplied to the one input of the 2-input AND circuit 2A26-A.

The initial value stored in the register 2B31 in the PRPG activation circuit 2B12 and the count value of the counter 2B30 become equal to each other, and accordingly, the PRPG activation circuit 2B12 changes the control signal 2B12-201 from the low level to the high level. Meanwhile, in the PRPG stop circuit 2B21, the output of the flip-flop 2A23 is at the low level until the initial value of the register 2A21 in the PRPG stop circuit 2B21 and the count value of the counter 2A20 become equal to each other. Therefore, the control signal 2B12-201 is changed from the low level to the high level, and accordingly, the PRPG control signal 201 which is the output of the PRPG stop circuit 2B21 is changed from the low level to the high level. When the initial value of the register 2A21 and the count value of the counter 2A20 in the PRPG stop circuit 2B20 become equal to each other, the output of the flip-flop 2A23 becomes the high level, and therefore, the PRPG control signal 201 is changed from the high level to the low level. Accordingly, the corresponding pattern generator 21 is activated at the timing determined by the value stored in the register 2B31 in the PRPG activation circuit 2B12 and is stopped at the timing determined by the value stored in the register 2A21 in the PRPG stop circuit 2B21. In other words, the start timing and the stop timing of supply of the test patterns supplied to the logic circuit 41 corresponding to the pattern generator 21 can be controlled.

The PRPG activation circuit 2B11 and the PRPG stop circuit 2B22 are also similar to the PRPG activation circuit 2B12 and the PRPG stop circuit 2B21.

Also in this third embodiment, the register 2B31 in the PRPG activation circuits 2B10 to 2B12 and the register 2A21 in the PRPG stop circuits 2B20 to 2B22 are serially connected when the initial values are set. As described in the second embodiment, the initial values are sequentially set in the registers. In FIG. 13, an output of the register 2A21 in the PRPG stop circuit 2B20 is connected to an input of the register 2B31 in the PRPG activation circuit 2B12, and an output of the register 2B31 of the PRPG activation circuit 2B12 is input to the register 2A21 of the PRPG stop circuit 2B21. Similarly, an output of the register 2A21 of the PRPG stop circuit 2B21 is connected to an input of the register 2B31 of the PRPG activation circuit 2B11, an output of the register 2B31 of the PRPG activation circuit 2B11 is connected to an input of the register 2A21 of the PRPG stop circuit 2B22, and an output of the register 2A21 of the PRPG stop circuit 2B22 is connected to an input of the register 2B31 of the PRPG activation circuit 2B10.

In FIG. 13, the signal transmitted from the register 2B31 of the PRPG activation circuit 2B12 to the register 2B31 of the PRPG stop circuit 2B21 when the initial values are set in the registers, and the signal transmitted from the register 2B31 of the PRPG activation circuit 2B11 to the register 2B31 of the PRPG stop circuit 2B22 are shown as reference character 105M. Similarly, the signal transmitted from the register 2A21 of the PRPG stop circuit 2B21 to the register 2B31 of the PRPG activation circuit 2B11 when the initial values are set in the registers, and the signal transmitted from the register 2A21 of the PRPG stop circuit 2B22 to the register 2B31 of the PRPG activation circuit 2B10 are also shown as reference character 105M.

<Configuration of MISR Control Circuit 3B>

Figure 14:
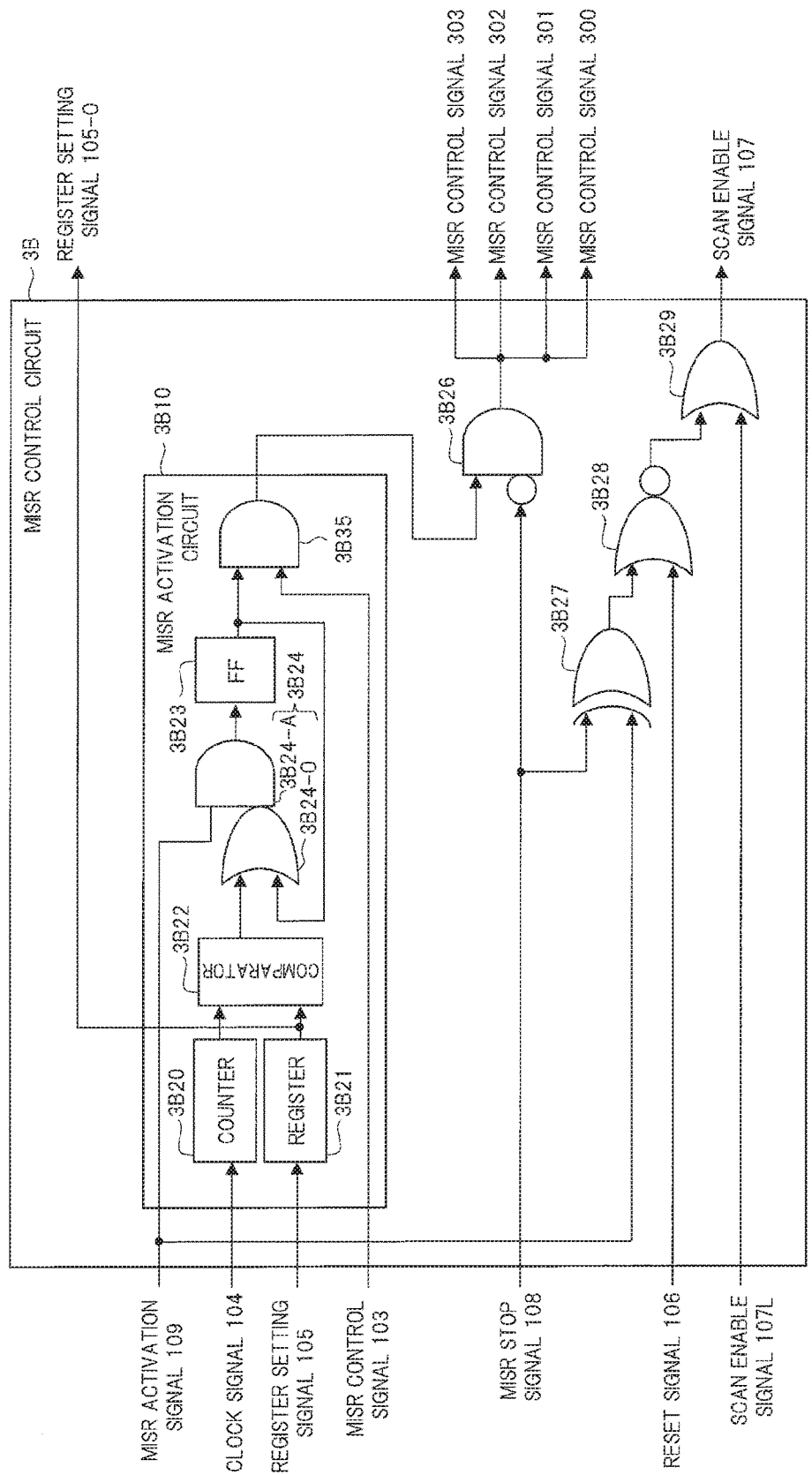
FIG. 14 is a block diagram showing a configuration of an MISR control circuit according to the third embodiment.

FIG. 14 is a block diagram showing a configuration of the MISR control circuit according to the third embodiment. The MISR control circuit 3B includes an MISR activation circuit 3B10, a 2-input AND circuit 3B26, a 2-input XOR circuit 3B27, a 2-input NOR circuit 3B28, and a 2-input OR circuit 3B29.

The MISR activation signal 109, the register setting signal 105, and the MISR stop signal 108 are supplied from the PRPG control circuit 2B shown in FIG. 13 to the MISR control circuit 3B. Moreover, the MISR control signal 103, the reset signal 106, and the scan enable signal 107L are supplied from the LBIST control circuit 10.

The MISR stop signal 108 supplied from the PRPG control circuit 2B becomes the high level, and accordingly, the MISR stop signal 108 is subjected to phase inversion by an inverter circuit shown by a circle mark and is supplied to an input of the 2-input AND circuit 3B26. Therefore, an output of the 2-input AND circuit 3B26 becomes the low level. The output of the 2-input AND circuit 3B26 is supplied to the pattern compressors 30 to 33 as the MISR control signals 300 to 303. The MISR control signals 300 to 303 become the low level, and accordingly, the functions of the respective pattern compressors 30 to 33 are stopped. When the MISR stop signal 108 is maintained at the high level, the MISR control signals 300 to 303 are maintained at the low level. Therefore, each of the pattern compressors 30 to 33 continues the state in which the function is stopped.

Meanwhile, when the MISR stop signal 108 is at the low level, the 2-input AND circuit 3B26 outputs the MISR control signals 300 to 303 in accordance with the output of the MISR activation circuit 3B10. In other words, the pattern compressors 30 to 33 are each controlled by the MISR activation circuit 3B10.

Next, the MISR activation circuit 3B10 will be described. The MISR activation circuit 3B10 has a counter 3B20, a register 3B21, a comparator 3B22, a flip-flop 3B23, a combinational circuit 3B24, and a 2-input AND circuit 3B25. In this case, the combinational circuit 3B24 has a 2-input AND circuit 3B24-A and a 2-input OR circuit 3B24-O, the MISR activation signal 109 is supplied to one input of the 2-input AND circuit 3B24-A, and an output of the 2-input OR circuit 3B24-O is supplied to the other input thereof. Moreover, an output of the comparator 3B22 is supplied to one input of the 2-input OR circuit 3B24-O, and an output of the flip-flop 3B23 is supplied to the other input thereof. Furthermore, an output of the 2-input AND circuit 3B24-A is supplied to an input of the flip-flop 3B23.

The counter 3B20 counts up or down in synchronization with the input clock signal 104 and outputs a count value. In the register 3B21, a value for time is stored as an initial value. The comparator 3B22 compares the count value of the counter 3B20 with the value stored in the register 3B21. When they are equal to each other as a result of the comparison, the comparator 3B22 outputs the high level. Meanwhile, when the count value has not reached the value stored in the register 3B21, the comparator 3B22 outputs the low level.

In the case in which the MISR activation signal 109 from the PRPG control circuit 2B shown in FIG. 13 is at the high level, if the count value of the counter 3B20 and the value stored in the register 3B21 are equal to each other, the high level output from the comparator 3B22 is transmitted to the input of the flip-flop 3B23 through the 2-input OR circuit 3B24-O and the 2-input AND circuit 3B24. The flip-flop 3B23 retrieves and stores this high level and outputs the high level. At this point, since the LBIST control circuit 10 is outputting the high-level MISR control signal 103, the 2-input AND circuit 3B25 outputs the high level as the output of the MISR activation circuit 3B10. The high level is output from the MISR activation circuit 3B10, and accordingly, the 2-input AND circuit 3B26 changes each of the MISR control signals 300 to 303 from the low level to the high level. Each high-level state of the MISR control signals 300 to 303 is continued until the state of the flip-flop 2B42 (FIG. 13) is changed by the reset signal 106. The MISR control signals 300 to 303 become the high level, so that the pattern compressors 30 to 33 are respectively activated and become an operated state.

Meanwhile, if the count value of the counter 3B20 and the value stored in the register 3B21 are not equal, the comparator 3B22 outputs the low level. As a result, the MISR activation circuit 3B10 outputs the low level.

As an alternative, the counter 3B20 may be, for example, a common use counter shared by the plurality of PRPG activation circuits or the PRPG stop circuits shown in FIG. 13.

In addition, when the initial value for time is set to the register 3B21, it is serially connected with the registers 2A21 and 2B31 described in FIG. 13. More specifically, an input of the register 3B21 is connected to the output of the register 2B31 of FIG. 13 via the register setting signal 105 shown in FIG. 13. When the initial values are set, the registers 2A21, 2B31, and 3B21 constitute a shift register, the initial values for time are sequentially supplied and set from the LBIST control circuit 10 to the registers 2A21, 2B31, and 3B21. Note that, also in this third embodiment, an output of the register 3B21 is supplied to the LBIST control circuit 10 through the register setting signal 105-O. Accordingly, by constituting these registers as the shift register, the LBIST control circuit 10 can confirm the initial values set to these registers 2A21, 2B31, and 3B21.

<Operations of Semiconductor Device 1B>

Figure 9:
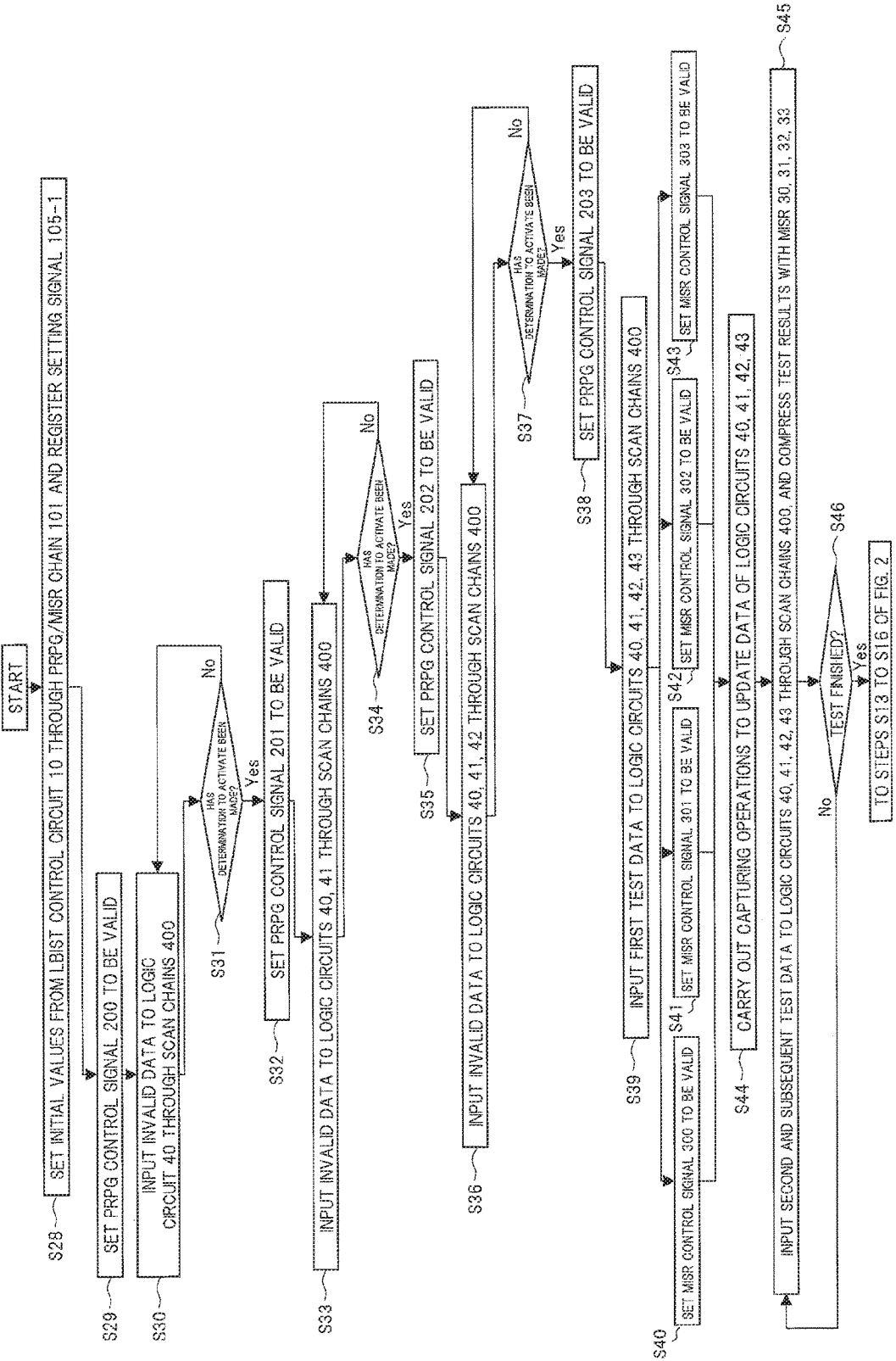
FIG. 9 is a flow chart showing operations of the semiconductor device according to the third embodiment.

FIG. 9 is a flow chart showing operations in self-diagnosis operations of the semiconductor device 1B. In FIG. 9, operation events are connected by respective arrows, and occurrences of events are shown by time series in accordance with the directions of the respective arrows. Branching arrows show parallel processes. However, rhombic events each show branching, and each downward arrow indicates a next process to be moved when an answer of the contents of the event is yes.

When the self-diagnosis operations of the semiconductor device 1B shown in FIG. 8 are started, in step S28, initial values are set in the respective pattern generators 20, 21, 22, and 23 and the respective pattern compressors 30, 31, 32, and 33 from the LBIST control circuit 10 through the PRPG/MISR chain 101. Moreover, in this process, the LBIST control circuit 10 supplies and sets the initial values for time in the respective registers 2A21 and 2B31 shown in FIG. 13 and the register 3B21 shown in FIG. 14 through the register setting signal 105-I. When the initial values are set to the respective registers 2A21, 2B31, and 3B21, as described above, the registers 2A21, 2B31, and 3B21 are serially connected and constitute the shift register.

In order to facilitate following description, the description will be given on the assumption that the initial values set to the registers are in the following. The initial value corresponding to the shortest time for activation is set to the register 2B31 of the PRPG activation circuit 2B12, and the initial value corresponding to the time longer than the time set to the register 2B31 of the PRPG activation circuit 2B12 is set to the register 2B31 of the PRPG activation circuit 2B11. Moreover, the initial value corresponding to the time longer than the time set to the register 2B31 of the PRPG activation circuit 2B11 is set to the register 2B31 of the PRPG activation circuit 2B10. In other words, the initial value corresponding to the longest time for activation is set to the register 2B31 of the PRPG activation circuit 2B10.

Moreover, the initial value corresponding to the shortest time for stop is set to the register 2A21 in the PRPG stop circuit 2B21, and the initial value corresponding to the time longer than the time set to the register 2A21 of the PRPG stop circuit 2B21 is set to the register 2A21 in the PRPG stop circuit 2B22. Moreover, the initial value corresponding to the time longer than the time set to the register 2A21 of the PRPG stop circuit 2B22 is set to the register 2A21 of the PRPG stop circuit 2B20. In other words, the initial value corresponding to the longest time for stop is set to the register 2A21 of the PRPG stop circuit 2B20.

Moreover, the shortest time for stop is the time longer than the longest time for activation.

In addition, the initial values for the time to operate the respective pattern compressors 30 to 33 are set to the register 3B21 shown in FIG. 14. In this third embodiment, the initial value corresponding to the time between the shortest time for stop and the longest time for activation is set to the register 3B21.

When the setting of the initial values is completed, in order to carry out a scan shift of a first time, the LBIST control circuit 10 sets the PRPG control signal 102 to the high level (active state). The PRPG control signal 102 is input to the PRPG control circuit 2B; however, since the PRPG control circuit 2B is in a reset cancelled state, the flip-flop 2B33 of the PRPG activation circuit 2B10 outputs the low level, which is the initial state. Therefore, the high-level PRPG control signal 102 is blocked by the 2-input AND circuit 2B35, and the 2-input AND circuit 2B35 outputs the low-level PRPG control signal 203. Therefore, the low-level PRPG control signal 203 is input to the pattern generator 23 corresponding to this PRPG activation circuit 2B10. Similar to the PRPG activation circuit 2B10, the PRPG activation circuit 2B11 and the PRPG activation circuit 2B12 also output low-level control signals 2B11-202 and 2B12-201, respectively.

Since the PRPG activation circuit 2B10 is not provided with the PRPG stop circuit in the latter stage of the PRPG activation circuit 2B10, the PRPG control signal 203, which is an output thereof, is input to the corresponding pattern generator 23 (step S29). Since the PRPG control signal 203 is at the low level, the pattern generator 23 is still stopping operation in step S29. At this point, also in the PRPG stop circuits 2B21 and 2B22, since the low-level control signals 2B12-201 and 2B12-202 are each supplied to the other input of each of the 2-input AND circuits 2A27, the low-level PRPG control signals 201 and 202 are output. Therefore, in step S29, operations of the pattern generators 21 and 22 corresponding to the respective PRPG stop circuits 2B21 and 2B22 are stopped.

Meanwhile, since the PRPG control circuit 2B is in a reset-cancelled state, the flip-flop 2A23 in the PRPG stop circuit 2B20 is also outputting the low level. Therefore, the high level is supplied to the 2-input AND circuit 2A27 in the PRPG stop circuit 2B20 via the inverter circuit shown by the circle mark. As a result, in step S29, this 2-input AND circuit 2A27 changes the PRPG control signal 200 from the low level to the high level. In other words, the PRPG control signal 200 is set to be valid. The PRPG control signal 200 is changed to the high level, and accordingly, the pattern generator 20 corresponding to this PRPG stop circuit 2B20 starts operating and generates test patterns in step S30. The generated test patterns are supplied to the logic circuit 40 through the scan chains 400. Note that, in this third embodiment, the test patterns in this process are invalid data since they are not used in self-diagnosis operations. In step S30, since the pattern generators 21, 22, and 23 have not started operations, fixed values are always input to the logic circuits 41, 42, and 43.

Then, in step S31, activation of the pattern generator 21 is determined. Whether the pattern generator 21 is activated or not is determined by the comparator 2B32 checking whether the count value of the counter 2B30 in the PRPG activation circuit 2B12 and the initial value of the register 2B31 are equal to each other or not. When the comparator 2B32 in the PRPG activation circuit 2B12 determines that they are not equal, the events of steps S30 and S31 are repeated until they become equal.

In contrast, when the comparator 2B32 in the PRPG activation circuit 2B12 determines that they are equal, the value of the flip-flop 2B33 in the PRPG activation circuit 2B12 is fixed to the high level. As a result, since the high level is supplied to the other input of the 2-input AND circuit 2B35 in the PRPG activation circuit 2B12, the PRPG control signal 201, which is an output of the PRPG activation circuit 2B12, is changed from the low level to the high level. In other words, in step S32, the PRPG control signal 201 is set to be valid. The PRPG control signal 201 becomes the high level, and accordingly, the pattern generator 21 starts operating and generates test patterns.

The generated test patterns are input to the logic circuit 41 through the scan chains 400 (step S33). At this point, since the pattern generator 20 is also operating, supply of the test patterns from the pattern generator 20 to the logic circuit 40 is continued through the scan chains 400. In addition, the test patterns generated by the pattern generators 20 and 21 are invalid data since they are not used for self-diagnoses. Note that, since the pattern generators 22 and 23 have not started operations yet in step S33, fixed voltages are supplied to the logic circuits 42 and 43.

Except that the activation of the pattern generator 22 is determined instead of the pattern generator 21 and that the pattern generator 22 is activated instead of the pattern generator 21, steps S34 to S36 are the same as steps S31 to S33, respectively; therefore, description thereof will be omitted. Similarly, except that the activation of the pattern generator 23 is determined instead of the pattern generator 21 and that the pattern generator 23 is activated instead of the pattern generator 21, steps S37 to S39 are the same as steps S31 to S33, respectively; therefore, description thereof will be omitted.

In this manner, in accordance with the initial values for time set to the respective registers 2B31 in the PRPG activation circuits, the PRPG activation circuits each sequentially activate the corresponding pattern generator one by one.

In step S39, each of the pattern generators 30 to 33 is activated. Therefore, in this step, test patterns are supplied from the pattern generators 30 to 33 to the logic circuits 40 to 43, respectively, through the scan chains 400. Specifically, valid data for self-diagnosis is supplied to each of the logic circuits 40 to 43. Therefore, in step S39, the test data input to each of the logic circuits (40 to 43) through the scan chains 400 is the first test data.

Then, in steps S40 to S43, the MISR control signals 300, 301, 302, and 303 are each set to the high level. This is carried out by the MISR control circuit 3B shown in FIG. 14. In the MISR control circuit 3B, the MISR control signal 103 is supplied from the LBIST control circuit 10 to the MISR control circuit 3B. The LBIST control circuit 10 has, for example, changed the MISR control signal 103 to the high level in step S30. This is because the LBIST control circuit 10 has started a scan test in step S30. Moreover, the PRPG activation circuit 2B10, which has the initial value set to the time for the last activation, has changed the PRPG control signal 203 from the low level to the high level in step S38. In synchronization with the PRPG control signal 203, the MISR activation signal 109 is also changed from the low level to the high level at the timing of step S38.

In addition, in the register 3B21 in the MISR activation circuit 3B10, the initial value corresponding to the time between the longest time for activation and the shortest time for stop is set. Therefore, after step S39, the count value of the counter 3B20 and the initial value of the register 3B21 become equal to each other. When they become equal, the output of the flip-flop 3B23 is changed from the low level to the high level. Regarding the MISR stop signal 108, since the initial value set to the register 2A21 in the PRPG stop circuit 2B20 and the count value of the counter 2A20 are not equal, the flip-flop 2A23 is maintaining the low level. As a result, the MISR control circuit 3B outputs the high-level MISR control signals 300 to 303.

The high level of the MISR control signals 300 to 303 is described as follows in FIG. 9: set the MISR control signals 300 to 303 to be valid (steps S40 to S43). In FIG. 9, steps S44 to S46 are the same as steps S10 to S12 shown in FIG. 2, respectively. In addition, after step S46, steps S13 to S27 shown in FIG. 2 are executed. Therefore, although detailed description will be omitted herein, as described in the second embodiment, in accordance with the initial values for time which are stored in the respective registers 2A21 in the PRPG stop circuits 2B20, 2B12, and 2B11, the voltages of the PRPG control signals 200, 201, and 202 are changed in this order from the high level to the low level. Accordingly, in the order from the pattern generators 20 to 22, the pattern generators are stopped. As a result of the stopping of the pattern generators, a fixed voltage is supplied as an input to corresponding one of the logic circuits.

Note that, by setting the reset signal 106 to the high level indicating reset or the PRPG control signal 102 to the low level, the PRPG control signal 203 becomes the low level, and the corresponding pattern generator 23 stops.

\<Operation Waveforms of Semiconductor Device 1B\>

Figure 10:
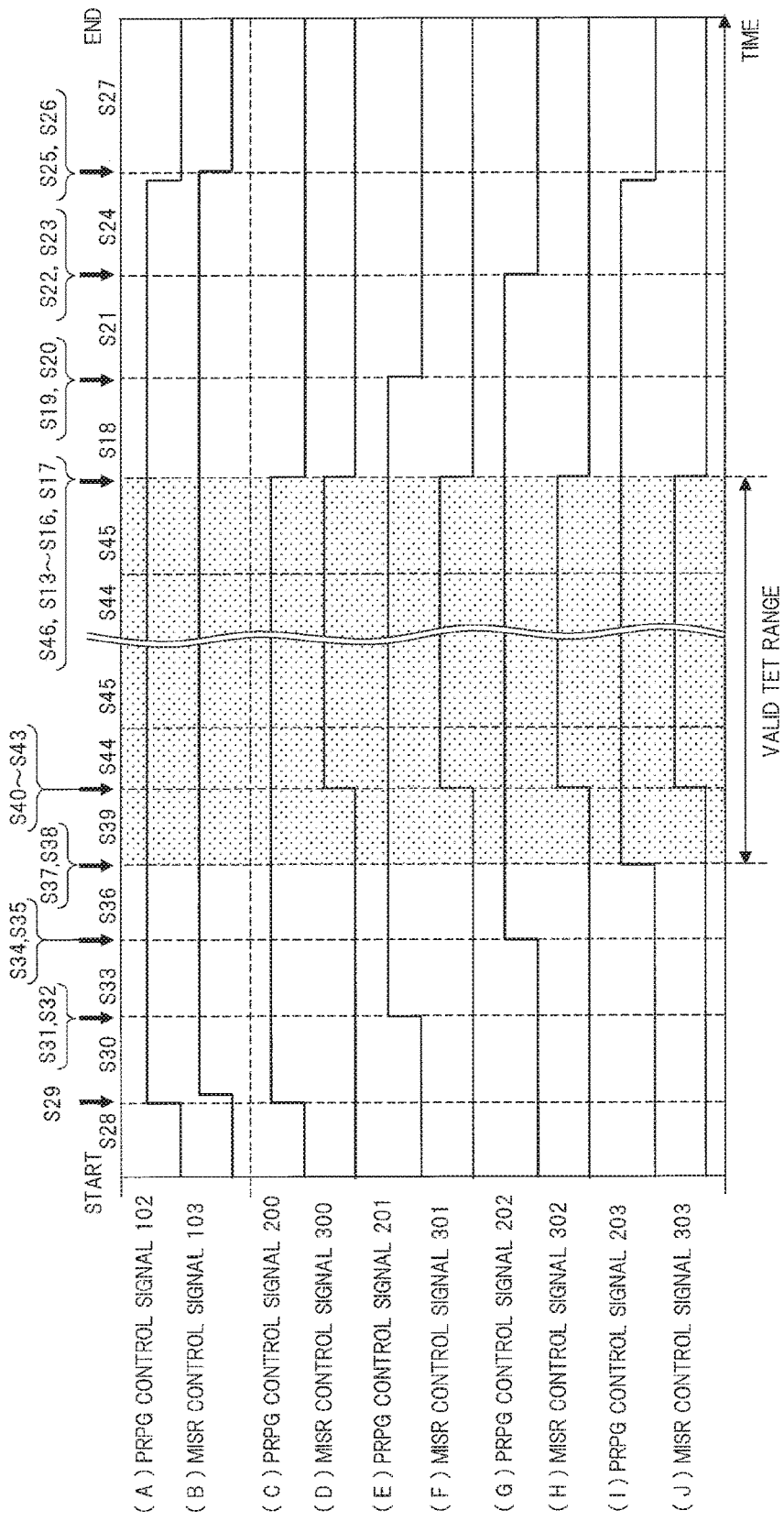
FIGS. 10(A) to 10(J) are waveform diagrams showing waveforms of the semiconductor device according to the third embodiment.

FIGS. 10(A) to 10(J) are waveform diagrams showing waveforms in the self-diagnosis operations in the semiconductor device 1B according to the third embodiment. In FIG. 10, a horizontal axis shows elapse of time, and a vertical axis shows voltages. FIGS. 10(A) and 10(B) show respective waveforms of the PRPG control signal 102 and the MISR control signal 103, which are output by the LBIST control circuit 10. In addition, FIGS. 10(C), 10(E), 10(G), and 10(I) show respective waveforms of the PRPG control signals 200 to 203 output by the PRPG control circuit 2B shown in FIG. 13, and FIGS. 10(D), 10(F), 10(H), and 10(J) show respective waveforms of the MISR control signals 300 to 303 output by the MISR control circuit 3B shown in FIG. 14.

Furthermore, in FIG. 10, reference characters from S28 to S46 and S13 to S27 attached along the horizontal axis correspond to steps S28 to S46 and S13 to S27 described in the flow chart of FIG. 9 and FIG. 2, respectively. In this case, a period between S39 and S45 is a valid test range, and, in the period of this valid test range, the logic circuits 40 to 43 repeatedly execute random operations in accordance with the test patterns generated by the respective pattern generators and consume electric power.

In addition, in the period S30 to S36 before the valid test, the logic circuit 40 repeatedly executes random operations in accordance with the test patterns, which are invalid data. In the period S33 to S36 before the valid test and in the period S18 after the valid test, the logic circuit 41 repeatedly executes random operations in accordance with the test patterns, which are invalid data. Similarly, in the period S36 before the valid test and in the period S18 to S21 after the valid test, the logic circuit 42 repeatedly executes random operations in accordance with the test patterns, which are invalid data. Furthermore, in the period S18 to S24 after the valid test, the logic circuit 43 repeatedly executes random operations in accordance with the test patterns, which are invalid data.

In this manner, by sequentially increasing and reducing the number of the logic circuits which operate in accordance with the test patterns, which are invalid data, a rapid change in the current flowing in the semiconductor device 1B can be suppressed, and the current change rate can be suppressed to be small. In this third embodiment, since the current change rate can be suppressed to be small even before the valid test, occurrence of erroneous operations can be further reduced. Furthermore, by changing the initial value for time which is set to the register 3B21, the pattern compressors can be activated at arbitrary timing.

Note that, in this third embodiment, the pattern generators start operating before the valid test is started in the self-diagnosis operations, in other words, before the valid test range. Therefore, it is difficult to generate expected values corresponding to the test patterns by use of ATPG (Automatic Test Pattern Generator). This is because the expected values generated by ATPG are generated based on the initial values input in step S28 in FIG. 9. However, the expected values can be separately obtained by executing logic simulations by use of a simulator.

Figure 11:
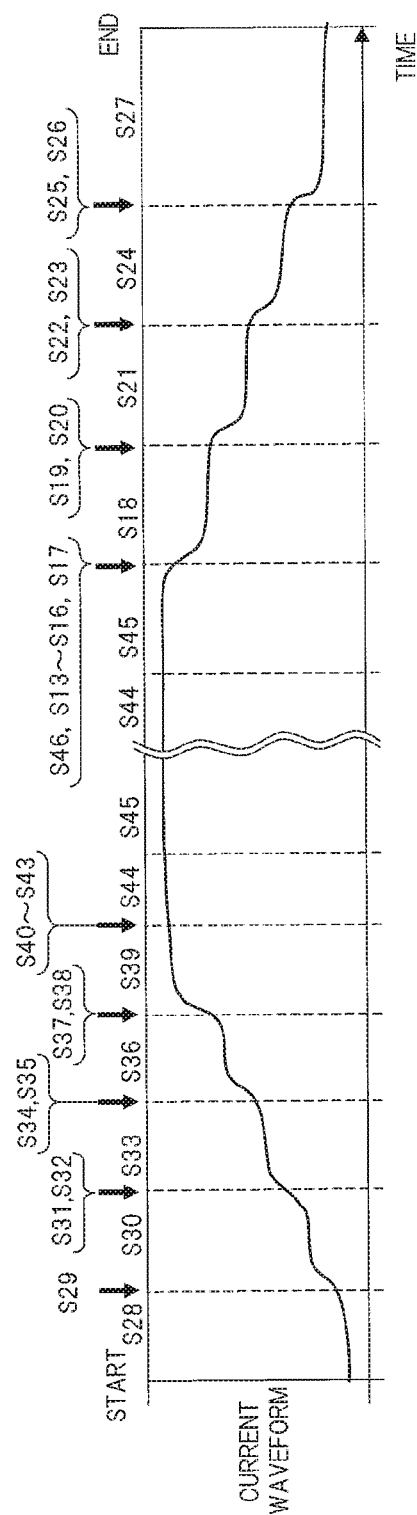
FIG. 11 is a waveform diagram schematically showing a current waveform of the semiconductor device according to the third embodiment.

FIG. 11 is a waveform diagram schematically showing the current waveform in the self-diagnosis operations of the semiconductor device 1B according to the third embodiment. In this diagram, a horizontal axis shows elapse of time, and a vertical axis shows a magnitude of current consumption. When the current waveform goes more upward in this diagram, the larger the current consumption becomes. Reference characters S28 to S46 and S13 and S27 attached along the horizontal axis correspond to steps S28 to S46 and S13 to S27 described in FIG. 9 and FIG. 2, respectively. As is understood from FIG. 11, the current consumption of the semiconductor device 1B is increased like steps as the number of the logic circuits operating in accordance with the test patterns increases, and the current consumption is reduced like steps as the number of the logic circuits operating in accordance with the test patterns is reduced. Therefore, at the start and the end of the self-diagnosis operations, a rapid change in the current consumption of the semiconductor device 1B can be suppressed.

Figure 12:
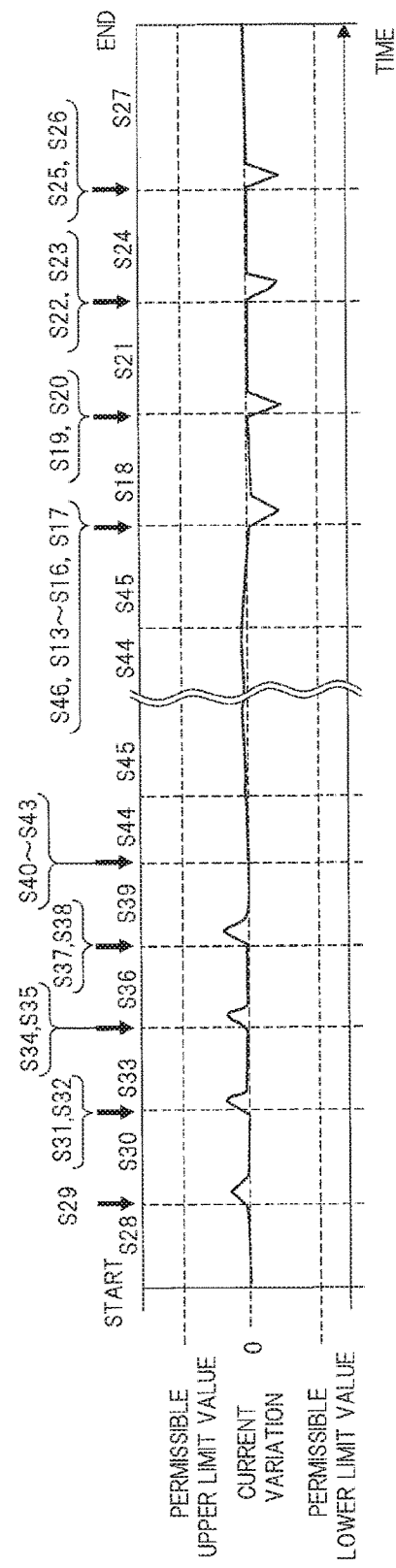
FIG. 12 is a waveform diagram showing current variation of the semiconductor device according to the third embodiment.

In addition, FIG. 12 is a waveform diagram showing current variation per unit time in the semiconductor device 1B according to the third embodiment. In this diagram, a horizontal axis shows elapse of time, and a vertical axis shows a magnitude of current variation. A central line of FIG. 12 represents "0" at which there is no variation in the current. The current variation in the diagram is extended upward when the current increases, and the current variation in the diagram is extended downward when the current decreases. Reference characters S28 to S46 and S13 and S27 attached along the horizontal axis correspond to steps S28 to S46 and S13 to S27 described in FIG. 9 and FIG. 2, respectively. As shown in this diagram, the current changes can be kept within a range between the permissible upper limit value and the permissible lower limit value.

According to the third embodiment, compared with the first and second embodiments, control is carried out so as to suppress a rapid change in the electric power consumption between steps S30 to S36 in which supply of the test patterns is started. Therefore, the change rate (di/dt) of the current value per time at the start of the self-diagnosis operations can be also reduced.

In the third embodiment, the scan enable signal 107 is formed by the 2-input XOR circuit 3B27, the 2-input NOR circuit 3B28, and the 2-input OR circuit 3B29. The MISR stop signal 108 becomes the high level in the period in which the MISR activation signal 109 is at the high level, and accordingly, the low level is output from the 2-input XOR circuit 3B27. As a result, the scan enable signal 107 supplied to the selector 40C1 (FIG. 18) becomes the high level. As a result, similarly to the second embodiment, the flip-flops 40B1 in the logic circuits can be prevented from retrieving undesired data from the combinational circuits.

In addition, the MISR activation signal 109 is output from the PRPG activation circuit 2B10 having the register 2B31 in which the initial value corresponding to the longest time for activation is set. Therefore, until the pattern generator 23 which is activated last is activated, the MISR activation signal 109 is at the low level, and the MISR stop signal 108 is also at the low level. Therefore, until the test patterns which serve as valid data are supplied to the logic circuits 40 to 43, the 2-input XOR circuit 3B27 outputs the low level. As a result, until supply of the test patterns, which are valid data, to the logic circuits 40 to 43 is started, the scan enable signal 107 supplied to the selectors 40C1 (FIG. 18) becomes the high level. As a result, in the period in which the invalid data is supplied to the logic circuits, the flip-flops 40B1 can be prevented from retrieving undesired data from the combinational circuits.

In FIG. 13, the PRPG control circuit 2B includes the PRPG activation circuits 2B10 to 2B12 and the PRPG stop circuits 2B20 to 2B22. However, the PRPG control circuit 2B may be configured to include the PRPG activation circuits 2B10 to 2B12 and the control circuit 2B42-C without including the PRPG stop circuits 2B20 to 2B22. Also in this case, at the start of the self-diagnosis operations, the current change rate of the current flowing in the semiconductor device 1B can be suppressed, and occurrence of erroneous operations can be prevented.

Modification Example

In the third embodiment, at the start of the self-diagnosis test, the PRPG control signals 200 to 203 are subjected to time division and are sequentially set to the high level. In other words, the pattern generators 30 to 33 sequentially operate with time intervals. Therefore, seed values of the pattern generators 20 to 22 at the point of time when the valid test is actually started (step S39 of FIG. 9) become different from the values at the point of time of input as initial values (step S28 of FIG. 9). This means that it is difficult to use the outputs of ATPG calculated based on the initial values input in step S28 of FIG. 9 as expected values. As a countermeasure, it is conceivable to acquire expected values from the results of logic simulations by a simulator.

Figure 17:
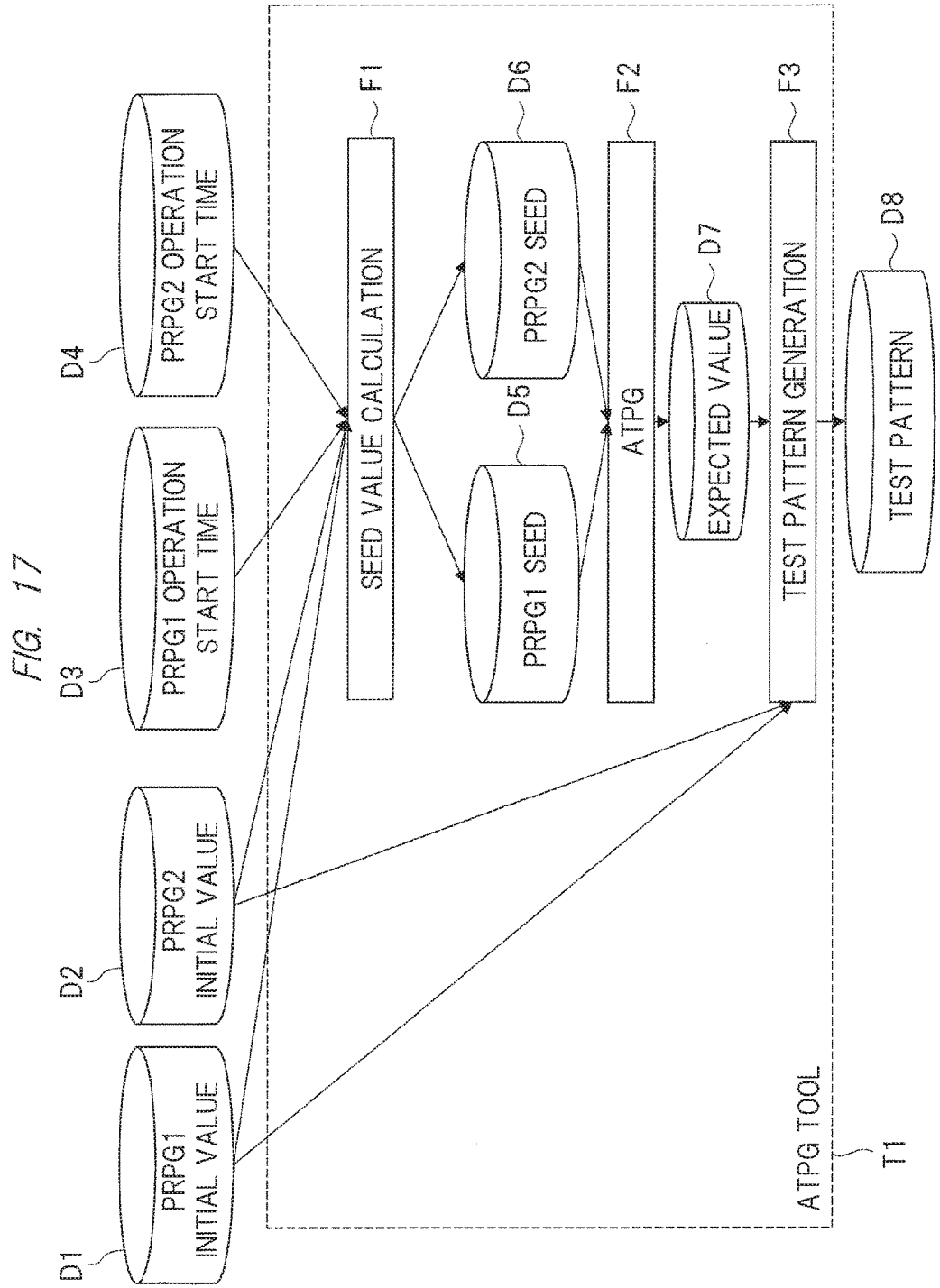
FIG. 17 is a flow chart showing a test-pattern generating method.

A modification example discloses a test-pattern generating method in which expected values suitable for the third embodiment are generated by ATPG. FIG. 17 is a flow chart showing the test-pattern generating method. In this diagram, reference character T1 represents an ATPG tool. In FIG. 17, in order to facilitate description, a case in which two pattern generators PRPG1 and PRPG2 are used will be described. In this case, the pattern generator PRPG1 corresponds to, for example, the pattern generator 20 of FIG. 8, and the pattern generator PRPG2 corresponds to, for example, the pattern generator 21 of FIG. 8.

In order to obtain an expected value corresponding to a test pattern, initial values D1 and D2 of the respective pattern generators PRPG1 and PRPG2 are obtained (first step). Moreover, operation start time D3 and D4 of the respective pattern generators PRPG1 and PRPG2 are obtained (second step). The obtained initial values D1 and D2 and the operation start time D3 and D4 are input to the ATPG tool T1. The operation start time D3 and D4 of this case is the time corresponding to steps S29 and S32 of FIG. 9, respectively.

The ATPG tool T1 obtains seed values (initial values) D5 and D6 of the pattern generators of the time at which the valid test is actually started (step S39 of FIG. 9) by seed-value calculations F1 from the given initial values D1 and D2 of the pattern generators PRPG1 and PRPG2 and the operation start time D3 and D4 thereof (third step).

Then, the seed values D5 and D6 of the pattern generators are given to a main engine F2 of ATPG, a failure simulation is executed, and an expected value D7 at the time at which the valid test is actually started is obtained (fourth step). Based on the obtained expected value D7 and the initial values D1 and D2, test pattern generation F3 is carried out, and a test pattern D7 is output.

Accordingly, the expected value and the test pattern can be generated by use of ATPG. In this case, compared with the method of calculating the expected value by use of a simulator, the expected value can be calculated in a comparatively short period of time. Moreover, since the failure simulation is carried out, a precise failure detection rate can be calculated in a comparatively short period of time. This saves time since the simulation is carried out by picking up only capturing operations as the failure simulation by ATPG while the logic simulation by the simulator carries out the simulations of all cycles including scan shift operations.

Fourth Embodiment

Figure 15:
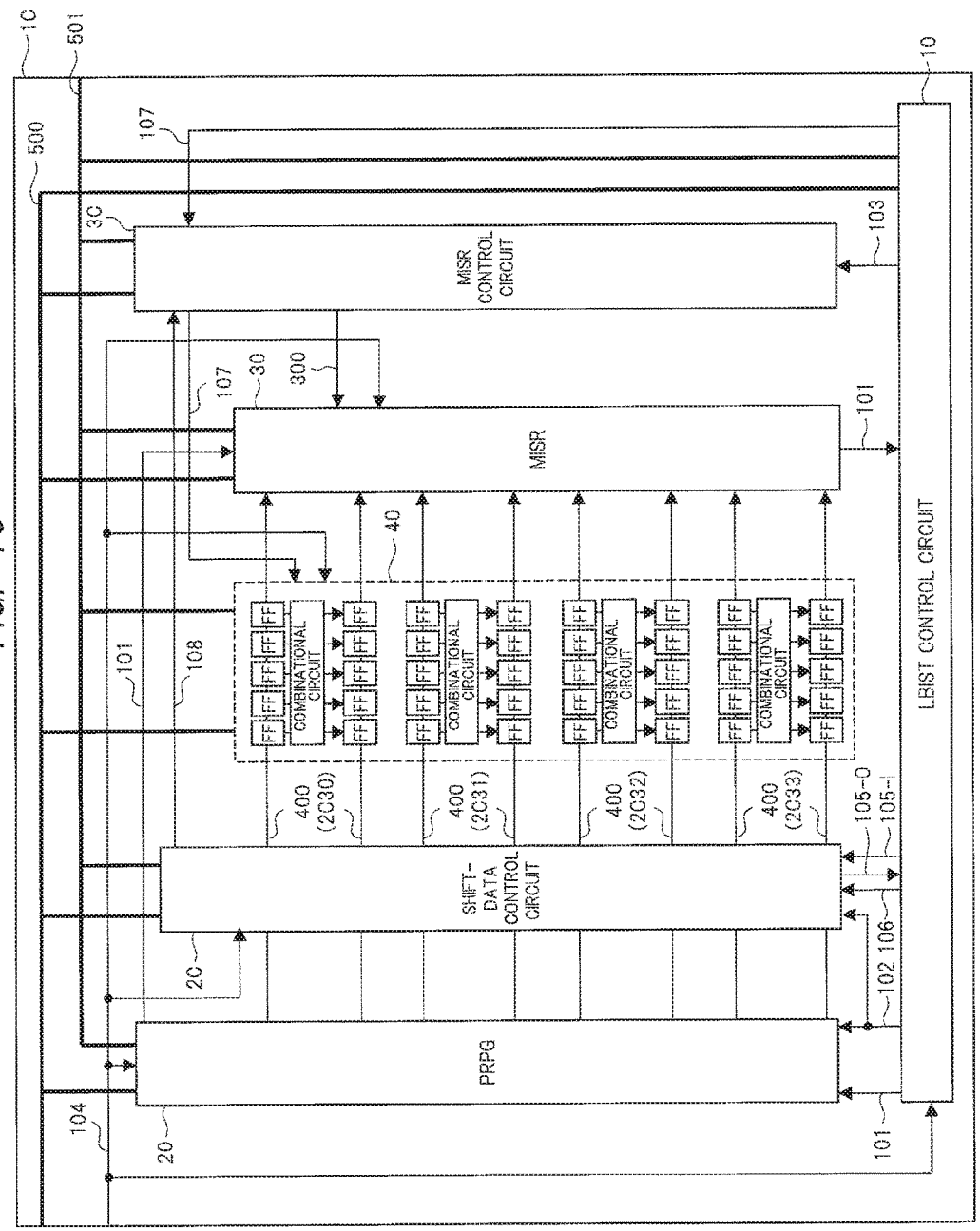
FIG. 15 is a block diagram showing a configuration of a semiconductor device according to a fourth embodiment.

FIG. 15 is a block diagram showing a configuration of a semiconductor device 1C according to a fourth embodiment. The semiconductor device 1C includes a logic circuit 40 as a configuration to achieve function thereof and includes an LBIST control circuit 10, a pattern generator 20, and a pattern compressor 30 for self-diagnosis of the logic circuit 40. Moreover, the semiconductor device 1C includes a shift-data control circuit 2C which controls shift data output by the pattern generator 20, and an MISR control circuit 3C which controls the pattern compressor 30.

The shift-data control circuit 2C is electrically connected to the LBIST control circuit 10 by the PRPG control signal 102. Moreover, the shift-data control circuit 2C is electrically connected to the pattern generator 20 and the logic circuit 40 by the scan chains 400 (2C30 to 2C33). The MISR control circuit 3C is electrically connected to the LBIST control circuit 10 by the MISR control signal 103. Moreover, the MISR control circuit 3C is electrically connected to the pattern compressor 30 by the MISR control signal 300.

The scan chains 400 (2C30 to 2C33) are subjected to switching between the operation start and the operation stop of the functions thereof by the shift-data control circuit 2C. The pattern compressor 30 is subjected to switching of the operation start and the operation stop of the function thereof by the MISR control signal 300 generated by the MISR control circuit 3C. In this embodiment, in both of the cases, the low level means the operation stop, and the high level means the operation start.

The pattern generator 20 and the pattern compressor 30 are strung with the LBIST control circuit 10 by the PRPG/MISR chain 101, and initial values are set in the pattern generator 20 and the pattern compressor 30 by the LBIST control circuit 10 by repeating shift operations. By similarly repeating shift operations, the LBIST control circuit 10 collects diagnosis results from the pattern compressor 30. The logic circuit 40 is constituted by flip-flops (FF), and a certain number of flip-flops are connected by stringing with one another by the scan chains 400 (2C30 to 2C33). The input sides of the scan chains 400 (2C30 to 2C33) are connected to the shift-data control circuit 2C, and the output sides thereof are connected to the pattern compressor 30. FIG. 15 shows that the semiconductor device 1C has the single pattern generator 20 and the single pattern compressor 30, but the numbers thereof are not limited thereto.

<Configuration of Shift-Data Control Circuit 2C>

Figure 16:
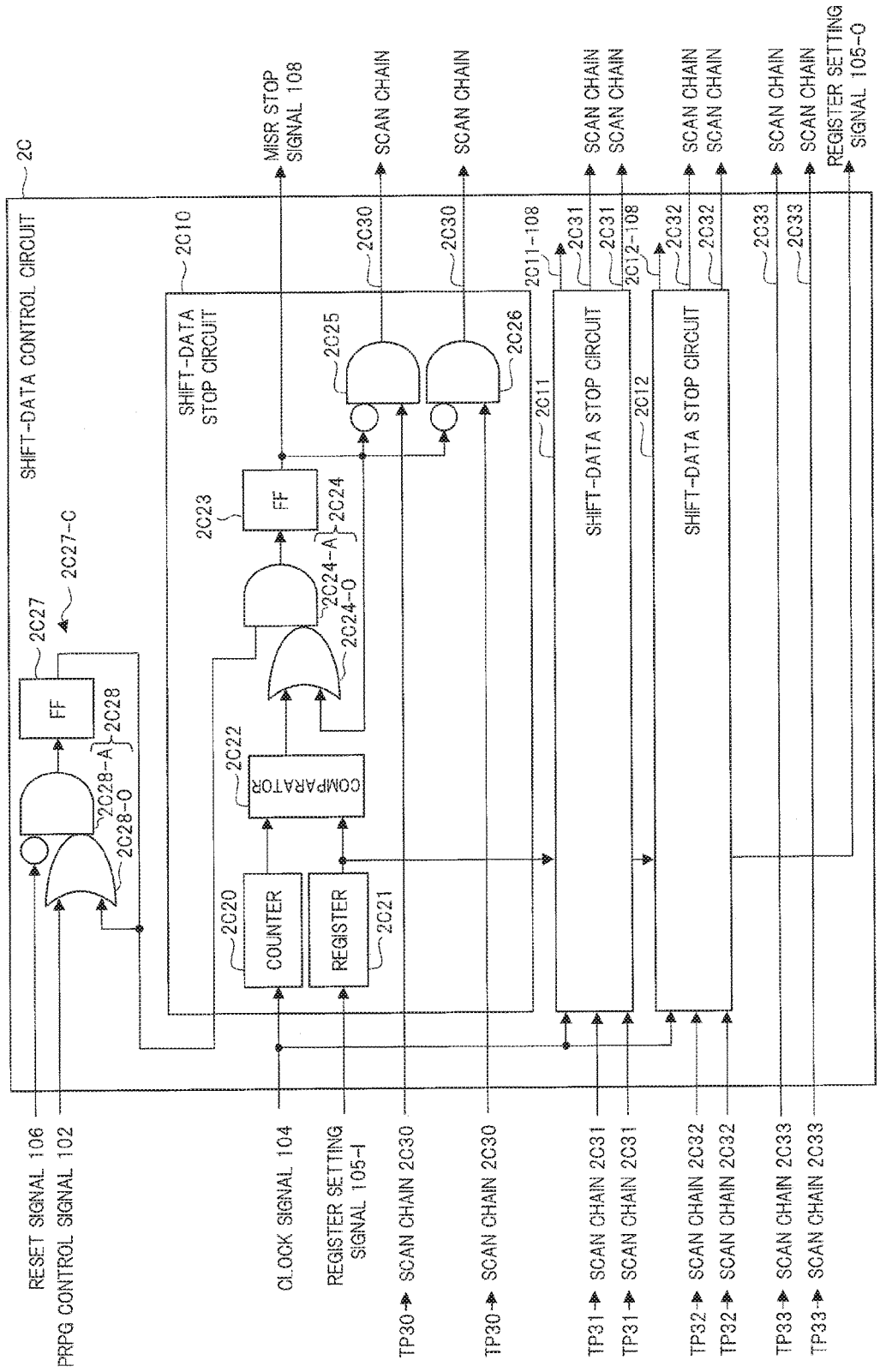
FIG. 16 is a block diagram showing a configuration of a shift-data control circuit according to the fourth embodiment.

FIG. 16 is a block diagram showing a configuration of the shift-data control circuit 2C according to the fourth embodiment. The shift-data control circuit 2C includes a control circuit 2C27-C and shift-data stop circuits 2C10, 2C11, and 2C12. The control circuit 2C27-C is a control circuit which carries out control of the shift-data control circuit 2C and includes a flip-flop 2C27 which controls the operation start and the operation end of the shift-data control circuit 2C, and a combinational circuit 2C28. In the control circuit 2C27-C, similarly to the control circuits 2A24-C and 2B42-C described above, the flip-flop 2C27 retains the state of the high level when the input PRPG control signal 102 becomes the active state (high level), and the flip-flop 2C27 continues the high level until the reset signal 106 is changed to the high level.

The shift-data stop circuits 2C10 to 2C12 have mutually the same configurations. Therefore, FIG. 16 shows the configuration of only the shift-data stop circuit 2C10. The number of the shift-data stop circuits is increased or reduced depending on the number of the scan chains mounted in the semiconductor device 1C, and they are required at a maximum as many as the number of the scan chains, but this number is not limited as an upper limit. Note that a plurality of scan chains may share a single shift-data stop circuit.

Moreover, in this diagram, a scan chain which is not controlled by the shift-data stop circuit may be present like the scan chain 2C33.

Next, the configuration of the shift-data stop circuit will be described by using the shift-data stop circuit 2C10 as a representative. The shift-data stop circuit 2C10 includes a counter 2C20, a register 2C21, a comparator 2C22, a flip-flop 2C23, a combinational circuit 2C24, and 2-input AND circuits 2C25 and 2C26. In this case, the combinational circuit 2C24 has a 2-input OR circuit 2C24-O having one input thereof to which an output of the comparator 2C22 is supplied and having the other input to which an output of the flip-flop 2C23 is supplied, and the combinational circuit 2C24 has a 2-input AND circuit 2C24-A having one input thereof to which an output from the control circuit 2C27-C is supplied and having the other input to which an output of the 2-input OR circuit 2C24-O is supplied.

The counter 2C20 counts up or down in synchronization with the input clock signal 104 and outputs a count value. In the register 2C21, an arbitrary value for time is stored by the register setting signal 105-I. The comparator 2C22 compares the count value of the counter 2C20 with the value stored in the register 2C21. When they are equal as a result of the comparison, the comparator 2C22 outputs the high level, and, when they are not equal, the comparator 2C22 outputs the low level.

When the count value of the counter 2C20 and the value stored in the register 2C21 are equal as a result of the comparison in the state in which the flip-flop 2C27 in the control circuit 2C27-C is at the high level, the high level from the comparator 2C22 is transmitted to the input of the flip-flop 2C23 via the combinational circuit 2C24, and the flip-flop 2C23 stores the logical value corresponding to this high level and outputs the high level. Conversely, when the count value of the counter 2C20 and the value stored in the register 2C21 are not equal as a result of the comparison, an output of the combinational circuit 2C24 outputs the low level, and the flip-flop 2C23 stores the logical value "0" and outputs the low level.

The output of the flip-flop 2C23 is subjected to phase inversion by an inverter circuit shown by a circle mark and is supplied to one input of the 2-input AND circuit 2C25. Similarly, the output of the flip-flop 2C23 is subjected to phase inversion by an inverter circuit shown by a circle mark and is supplied to one input of the 2-input AND circuit 2C26. Moreover, in this shift-data stop circuit 2C10, the output of the flip-flop 2C23 is output as the MISR stop signal 108.

In self-diagnosis operations, the pattern generator 20 generates test patterns TP30 to TP33. In FIG. 16, the pattern generator 20 supplies shift data TP30 in accordance with test patterns to the scan chain 2C30, supplies shift data TP31 in accordance with test patterns to the scan chain 2C31, supplies shift data TP32 in accordance with test patterns to the scan chain 2C32, and supplies shift data TP33 in accordance with test patterns to the scan chain 2C33.

In a case in which the count value of the counter 2C20 has not reached the value stored in the register 2C21, the flip-flop 2C23 outputs the low level. As a result, the 2-input AND circuits 2C25 and 2C26 supply the shift data TP30 to the logic circuit 40. In contrast, when the count value of the counter 2C20 is equal to the value stored in the register 2C21, the flip-flop 2C23 outputs the high level. As a result, the 2-input AND circuits 2C25 and 2C26 supply the low level to the logic circuit 40 regardless of the logical value of the shift data TP30.

An output of the 2-input AND circuit 2C25 shown in FIG. 16 is, for example, in the logic circuit 40 shown in FIG. 18, connected to the scan chain 400 shown on the upper side of this diagram, and an output of the 2-input AND circuit 2C26 is connected to the scan chain 400 shown on the lower side in FIG. 18. Accordingly, whether the voltages (logical values) supplied to the inputs of the flip-flops 40B1 and 40B2 provided in the logic circuit 40 are changed in accordance with the shift data or fixed to the low level can be determined by the value set in the register 2C21. Moreover, the timing to fix to the low level, in other words, the stop timing to stop supply of the shift data can be determined. Since the voltages (logical values) supplied to the inputs of the flip-flops 40B1 and 40B2 are each fixed to a predetermined voltage like the low level instead of shift data, this fixing can be considered as a stopped state in which the scan chain is stopped.

The stopped state in which the scan chains are stopped is continued until the value of the flip-flop 2C27 is cleared to the low level by the reset signal 106.

The other shift-data stop circuits 2C11 and 2C12 are also similar to the shift-data stop circuit 2C10. However, in the shift-data stop circuits 2C10, 2C11, and 2C12, the values for time set to the respective registers 2C21 are configured to be different from one another. In this fourth embodiment, the value corresponding to the shortest time is set to the register 2C21 in the shift-data stop circuit 2C10, and the value corresponding to the time longer than the time which is set to the register 2C21 in the shift-data stop circuit 2C10 is set to the register 2C21 in the shift-data stop circuit 2C11. Furthermore, the value corresponding to the time longer than the time which is set to the register 2C21 in the shift-data stop circuit 2C11 is set to the register 2C21 in the shift-data stop circuit 2C12.

Similarly to the second and the third embodiments, regarding setting of the respective registers 2C21 in the shift-data stop circuits 2C10, 2C11, and 2C12, these shift-data stop circuits 2C10, 2C11, and 2C12 are serially connected to one another to form a shift register, and the setting is made by sequentially supplying the values for time thereto from the LBIST control circuit 10 by the register setting signal 105-I.

The values for time are set to the respective registers 2C21 in this manner, and as a result, the scan chains 2C30 first become the stopped state, and the scan chains 2C31 and 2C32 become the stopped state in this order. Note that the scan chains 2C33 become the stopped state by setting the reset signal 106 to the high level. In this case, the value of the flip-flop 2C23 in the shift-data stop circuit 2C10 which first sets the scan chains to be in the stopped state is supplied to the MISR control circuit 3C as an MISR stop signal.

As described in the second embodiment, computation of logical sum is carried out with an MISR stop signal 2C11-108 output from the shift-data stop circuit 2C11, an MISR stop signal 2C12-108 output from the shift-data stop circuit 2C12, and an MISR stop signal 108 output from the shift-data stop circuit 2C10, and the computation result may be supplied to the MISR control circuit 3C as an MISR stop signal. In addition, the counter 2C20 may be shared by the plurality of shift-data stop circuits.

Since the configuration of the MISR control circuit 3C is the same as the MISR control circuit 3A described in FIG. 7, the description thereof will be omitted.

This fourth embodiment is different from the first to third embodiments in that the supply of the shift data in accordance with the test patterns generated by the pattern generators to the logic circuit is stopped instead of stopping the operations of the pattern generators and stopping the test patterns.

In the fourth embodiment, electric power consumption is controlled not in units of pattern generators, but in units of scan chains. As a result, more detailed control than the electric power control carried out in units of pattern generators can be carried out. Moreover, even if a set of the pattern generator and the pattern compressor is one, effects equivalent to or more than those of the second embodiments can be obtained.

In this fourth embodiment, the shift-data control circuit 2C is considered as a test-pattern control circuit. In addition, for example, when the logic circuit to which the shift data (test patterns) is supplied through the scan chains 2C30 is considered to be a first logic circuit, the stop timing of the test patterns supplied to the first logic circuit is determined by the value stored in the register 2C21 (first register) of the shift-data stop circuit 2C10. Similarly, when the logic circuit to which the shift data (test patterns) is supplied through the scan chains 2C31 is considered to be a second logic circuit, the stop timing of the test patterns supplied to the second logic circuit is determined by the value stored in the register 2C21 (second register) of the shift-data stop circuit 2C11.

In the first to fourth embodiments described above, the circuit which includes the logic circuits 40 to 43 can be considered to be the first circuit. In addition, the PRPG control circuit can be considered to be a pattern-generator control circuit, and the MISR control circuit can be considered to be a pattern-compressor control circuit. For example, in the second embodiment, the example using the plurality of pattern compressors 30 to 33 is shown, and the plurality of pattern compressors 30 to 33 may be considered to be a single pattern compressor. Moreover, the pattern compressor may be considered to be a processing unit which processes signals output from the logic circuit in accordance with test patterns. Furthermore, the LBIST control circuit 10 may be considered to be a self-diagnosis control circuit.

Also, the LBIST control circuit 10 in combination with, for example, the PRPG control circuit 2A shown in FIG. 6 may be considered to be a control circuit. In this case, it can be considered that the control circuit controls such that stop timings of the test patterns supplied to the corresponding logic circuits 40 to 42 differ from one another among the plurality of pattern generators 20 to 22.

A self-diagnosis circuit incorporated in an on-vehicle MCU has been taken as an example to describe the problems. However, the self-diagnosis circuits according to the above-described plurality of embodiments are not limited to self-diagnosis circuits incorporated in an on-vehicle MCU and can be incorporated in various semiconductor devices. Moreover, the self-diagnosis circuits are not limited to be activated in response to turn-on of an electric-power supply. For example, regardless of turn-on of an electric-power supply or the like, the self-diagnosis circuit may be activated at arbitrary timing.

Moreover, in the embodiments, description has been given in which the clock signal 104 is supplied from outside of the semiconductor device via the external terminal of the semiconductor device (for example, 1A). However, it goes without saying that a clock-signal generating circuit which generates the clock signal 104 may be provided in the semiconductor device (for example, 1A).

<Notes>

Although the present specification discloses a plurality of inventions, and some of them are described in claims, inventions other than them are also disclosed, and typical ones thereof are listed below.

(A) A semiconductor device including:
a pattern generator generating a test pattern in a test period;
a first circuit having a first logic circuit connected to a voltage wire;
a test-pattern control circuit connected to the pattern generator and the first circuit;
a control circuit controlling the test-pattern control circuit; and
a processing circuit supplied with a signal output from the first logic circuit in response to the test pattern,
in which the test-pattern control circuit stops supply of the test pattern to the first logic circuit in the first circuit by control of the control circuit in the test period.

(B) The semiconductor device according to (A),
in which the first circuit includes a second logic circuit connected to the voltage wire, the pattern generator, and the test-pattern control circuit, and
the test-pattern control circuit makes a stop timing of the test pattern supplied to the first logic circuit and a stop timing of the test pattern supplied to the second logic circuit different from each other by control of the control circuit.

(C) The semiconductor device according to (B),
in which the stop of the test pattern is to fix a logical value of the test pattern supplied to the first logic circuit or the second logic circuit to a predetermined logical value.

(D) The semiconductor device according to (C),
in which each of the first logic circuit and the second logic circuit includes:
a plurality of flip-flop circuits serially connected so as to constitute a shift register to which the test pattern is supplied from the test-pattern control circuit in the test period; and
a combinational circuit connected to the plurality of flip-flop circuits in the test period.

(E) The semiconductor device according to (D),
in which the semiconductor device includes a first register storing information determining the stop timing of the test pattern supplied to the first logic circuit; and a second register determining the stop timing of the test pattern supplied to the second logic circuit.

(F) A semiconductor device including:
a first circuit including a plurality of logic circuits and a cut-off circuit cutting off between the plurality of logic circuits in a test period;
a plurality of pattern generators corresponding to the plurality of logic circuits, respectively, and each supplying a test pattern to the corresponding logic circuit in the test period;
a processing unit supplied with a signal output from each of the plurality of logic circuits in response to the test pattern; and
a control circuit connected to the plurality of pattern generators and controlling each of the plurality of pattern generators such that stop timings of the test patterns supplied to the corresponding logic circuits differ from one another among the plurality of pattern generators.

(G) The semiconductor device according to (F),
in which the cut-off circuit cuts off between the plurality of logic circuits by supplying a predetermined logical value to each of the plurality of logic circuits.

(H) The semiconductor device according to (G),
in which the cut-off circuit has a flip-flop and supplies the predetermined logical value to each of the plurality of logic circuits by setting the flip-flop to a predetermined state.

(I) A test-pattern generating method including:
a first step of obtaining an initial value of a test pattern generated by a pattern generator;

a second step of obtaining operation start time of the pattern generator;

a third step of obtaining the initial value of the test pattern at time at which a valid test is started based on the initial value of the test pattern obtained in the first step and the operation start time of the pattern generator obtained in the second step;

a fourth step of executing a failure simulation based on the initial value obtained in the third step and obtaining an expected value with respect to the test pattern at the time at which the valid test is started; and forming the test pattern supplied to a logic circuit based on the expected value obtained in the fourth step and the test pattern generated by the pattern generator.

(J) The test-pattern generating method according to (I), in which the failure simulation is carried out by ATPG.

In the foregoing, the invention made by the inventors of the present invention has been concretely described based on the embodiments. However, the present invention is not limited to the foregoing embodiments and various modifications and alterations can be made within the scope of the present invention.

EXPLANATION OF REFERENCE CHARACTERS 1A to 1E Semiconductor device
2A to 2C PRPG control circuit
3A to 3C MISR control circuit
10 LBIST control circuit
20 to 23 Pattern generator
30 to 33 Pattern compressor

The invention claimed is:

1. A semiconductor device, comprising:
a first circuit;
a plurality of pattern generators connected to the first circuit, each said pattern generator supplying a test pattern to a portion of the first circuit;
a pattern-generator control circuit controlling each of the plurality of pattern generators such that a pattern generator starts to operate when a control signal is at a first level and the pattern generator stops operating when the control signal is not at the first level;
a pattern compressor compressing a result output from the first circuit in response to supply of the test patterns from the plurality of pattern generators;
a pattern-compressor control circuit controlling the pattern compressor; and
a self-diagnosis control circuit connected to the pattern-generator control circuit and the pattern-compressor control circuit and controlling the pattern-generator control circuit such that timings of stopping of the test patterns differ from one another among the plurality of pattern generators due to changing the control signals to selectively stop the pattern generators in a predetermined manner.

2. The semiconductor device according to claim 1, wherein the pattern compressor includes a plurality of pattern compressors, and
wherein the self-diagnosis control circuit controls the pattern-compressor control circuit such that a time of starting of the compressing processes is identical to one another for the plurality of pattern compressors.

3. The semiconductor device according to claim 1, wherein the self-diagnosis control circuit controls the pattern-generator control circuit such that timings of starting the test patterns differ for different pattern generators among the plurality of pattern generators.

4. The semiconductor device according to claim 1, wherein the first circuit includes a plurality of logic circuits, each said logic circuit corresponding respectively to one pattern generator of the plurality of pattern generators and respectively to one pattern compressor of the plurality of pattern compressors, and each said logic circuit connected to a same voltage wire, and
wherein each of the plurality of logic circuits is supplied with a test pattern from its corresponding pattern generator and supplies a result corresponding to the supplied test pattern to the pattern compressor corresponding to that logic circuit.

5. A semiconductor device, comprising:
a first circuit including a plurality of logic circuits, each said logic circuit connected to a same voltage wire;
a plurality of pattern generators, each said pattern generator respectively corresponding to one logic circuit of the plurality of logic circuits, and each said pattern generator supplying a test pattern to its corresponding logic circuit;
a processing unit receiving a signal output from each of the plurality of logic circuits in response to the test pattern supplied to that logic circuit; and
a control circuit connected to the plurality of pattern generators, the control circuit controlling such that timings of stopping test patterns supplied to logic circuits differ from one another among the plurality of pattern generators, the timings of stopping being controlled to selectively stop the test patterns in a predetermined manner.

6. The semiconductor device according to claim 5, wherein each of the plurality of logic circuits includes:
a plurality of retaining circuits serially interconnected, each said retaining circuit transferring test sequential test pattern segments to a next stage as the test pattern is being supplied to that logic circuit; and
a combinational circuit receiving a signal retained in each of the plurality of retaining circuits and operating in accordance with a logical value of the received signal.

7. The semiconductor device according to claim 6, wherein the control circuit controls such that timings of starting of test patterns to logic circuits corresponding to different pattern generators differ from one another.

8. The semiconductor device according to claim 6, wherein, among the plurality of pattern generators, a pattern generator whose timing of stopping of the test pattern by the control circuit has not yet occurred continues to output the test pattern, including invalid data not used for diagnosis.

9. The semiconductor device according to claim 5, wherein the control circuit includes a register into which is set information used for determining the timings of stopping the test patterns.

10. A semiconductor device, comprising:
a first circuit including a plurality of logic circuits, each said logic circuit connected to a same voltage wire;
a plurality of pattern generators, such that each pattern generator respectively corresponds to one logic circuit of the plurality of logic circuits, and each said pattern generator supplies a test pattern to its corresponding logic circuit;
a processing circuit supplied with signals output from each logic circuit of the plurality of logic circuits in response to the test pattern supplied to that logic circuit; and a control circuit connected to the plurality of pattern generators and controlling the plurality of pattern generators such that timings of starting a supply of the test patterns to the different logic circuits differ from one another, the start timings being due to the control circuit selectively starting the pattern generators in a predetermined manner.

11. The semiconductor device according to claim 10, wherein the control circuit includes a register into which is set information determining the timings of starting the supply of the test patterns.

12. The semiconductor device according to claim 11, wherein each logic circuit of the plurality of logic circuits is provided with:
- a plurality of retaining circuits serially interconnected, each said retaining circuit transferring sequential test pattern segments to a next stage when the test pattern is supplied to that logic circuit; and
- a combinational circuit receiving a signal retained in each of the plurality of retaining circuits and operating in accordance with a logical value of the received signal.

13. The semiconductor device according to claim 1, wherein the predetermined manner of stopping the pattern generators provides a mechanism to gradually reduce a current consumption of the semiconductor device so that a current change rate is small and rapid current changes are prevented.

14. The semiconductor device according to claim 5, wherein the predetermined manner of stopping the pattern generators provides a mechanism to gradually reduce a current consumption of the semiconductor device so that a current change rate is small and rapid current changes are prevented.

15. The semiconductor device according to claim 10, wherein the predetermined manner of starting the pattern generators provides a mechanism to gradually increase a current consumption of the semiconductor device so that a current change rate is small and rapid current changes are prevented.

* * * * *